United States Patent
Yamanaka et al.

(10) Patent No.: US 6,653,212 B1
(45) Date of Patent: Nov. 25, 2003

(54) METHOD AND APPARATUS FOR THIN-FILM DEPOSITION, AND METHOD OF MANUFACTURING THIN-FILM SEMICONDUCTOR DEVICE

(75) Inventors: Hideo Yamanaka, Kanagawa (JP); Hisayoshi Yamoto, Kanagawa (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/719,994

(22) PCT Filed: Apr. 20, 2000

(86) PCT No.: PCT/JP00/02591
§ 371 (c)(1), (2), (4) Date: Apr. 9, 2001

(87) PCT Pub. No.: WO00/63956
PCT Pub. Date: Oct. 26, 2000

(30) Foreign Application Priority Data

Apr. 20, 1999 (JP) .......................... P11-112950
Apr. 27, 1999 (JP) .......................... P11-120533
Apr. 27, 1999 (JP) .......................... P11-120542

(51) Int. Cl.$^7$ .................. H01L 21/20; C23C 16/00
(52) U.S. Cl. .............. 438/485; 438/788; 438/903; 118/723 VE; 118/724
(58) Field of Search ................. 438/487, 485; 118/669, 693, 715, 723 HC, 723 VE, 724, 725, 729

(56) References Cited

U.S. PATENT DOCUMENTS

| | | | |
|---|---|---|---|
| 4,868,014 A | 9/1989 | Kanai | 427/248 |
| 5,500,256 A | 3/1996 | Watabe | 427/579 |
| 5,686,349 A * | 11/1997 | Nakata | 438/485 |
| 5,942,854 A * | 8/1999 | Ryoji et al. | 315/111.21 |
| 6,069,094 A * | 5/2000 | Matsumura et al. | 438/788 |
| 2003/0013280 A1 * | 1/2003 | Yamanaka | 438/487 |

FOREIGN PATENT DOCUMENTS

| | | |
|---|---|---|
| DE | 19801558 | 12/1998 |
| JP | 62-163314 | 7/1987 |
| JP | 63-40314 | 2/1988 |
| JP | 3-239320 | 10/1991 |
| JP | 5-74713 | 3/1993 |
| JP | 8-55802 | 2/1996 |
| JP | 8-250438 | 9/1996 |
| JP | 10-340857 | 12/1998 |

* cited by examiner

Primary Examiner—W. David Coleman
(74) Attorney, Agent, or Firm—Rader, Fishman & Grauer PLLC; Ronald P. Kananen

(57) ABSTRACT

A thin film forming apparatus S having a vacuum chamber 1, a substrate 10, a thermal catalyst 5, and a heating means 5a for heating this thermal catalyst 5, wherein a gas introduction system 3 for feeding the gas is connected in the vacuum chamber 1, the gas is fed from this gas introduction system 3 to the vacuum chamber 1, and thin films are formed on the surface of the substrate 10 by utilizing a thermal decomposition reaction or catalytic reaction by the thermal catalyst 5, the gas introduction system 3 is for introducing a carrier gas containing hydrogen and a material gas for forming the thin film on the substrate 10, and the carrier gas is constantly fed into the vacuum chamber 1 at least during the formation of the thin film.

129 Claims, 39 Drawing Sheets

(LOADING TO OUTSIDE OF CYLINDER)

(LOADING TO INSIDE OF CYLINDER)

FORM PROTECTIVE FILM, POLYCRYSTALLINE SILICON FILM, GATE INSULATING FILM

N-CHANNEL MOS USE ION IMPLANTAION

P-CHANNEL MOS USE ION IMPLANTAION

FORM GATE ELECTRODE USE MOLYBDENUM/
TANTALUM FILM

FORM GATE ELECTRODE

N-CHANNEL MOS SOURCE/ DRAIN USE ION IMPLANTATION

P-CHANNEL MOS SOURCE/ DRAIN USE ION IMPLANTATION

FORM INSULATING FILM

FORM STEPS IN SUBSTRATE

GRAPHO-EPITAXIAL GROWTH OF SINGLE CRYSTALLINE SILICON FILM

FORM GATE INSULATING FILM

N-CHANNEL MOS USE ION IMPLANTAION

P-CHANNEL MOS USE ION IMPLANTAION

FORM GATE ELECTRODE USE MOLYBDENUM/ TANTALUM ALLOY FILM

FORM GATE ELECTRODE

N-CHANNEL MOS SOURCE/
DRAIN USE ION IMPLANTATION

FORM SAPPHIRE FILM ON SUBSTRATE

HETERO-EPITAXIAL GROWTH OF SINGLE
CRYSTALLINE SILICON FILM

FORM GATE INSULATING FILM

FORM GATE ELECTRODE USE
POLYCRYSTALLINE SILICON FILM

FORM GATE ELECTRODE

N-CHANNEL MOS SOURCE/
DRAIN USE ION IMPLANTATION

P-CHANNEL MOS SOURCE/
DRAIN USE ION IMPLANTATION

FORM INSULATING FILM

METHOD AND APPARATUS FOR THIN-FILM DEPOSITION, AND METHOD OF MANUFACTURING THIN-FILM SEMICONDUCTOR DEVICE

TECHNICAL FIELD

The present invention relates to a thin film forming apparatus and a thin film forming method and to a method for producing a thin film semiconductor device, more particularly relates to a thin film forming apparatus and a thin film forming method and to a method for producing a thin film semiconductor device capable of producing a high quality thin film and capable of producing a thin film semiconductor device able to be applied to a large-sized display device.

Note that, in the present invention, "single crystalline semiconductor" is a concept including not only a single crystalline silicon, but also a single crystalline compound semiconductor, for example single As) and a single crystalline silicon-germanium (Si—Ge). Further, in the present invention, "single crystal" is a concept including this even for a single crystal containing sub grain boundaries and dislocation.

BACKGROUND ART

In a thin film transistor (hereinafter referred to as a TFT) drive type liquid crystal display device, an amorphous silicon TFT has been used, but a polycrystalline silicon TFT has an electron field effect mobility of a high 100 or so in comparison with an amorphous silicon TFT and can be given higher performance, so an integral drive circuit type TFT has mainly been employed.

Conventionally, the technique of forming an amorphous silicon layer by plasma CVD or the like and crystallizing the polycrystalline silicon layer and improving the crystallinity by activation annealing by irradiation by a pulse-like excimer laser beam has been studied and developed.

However, the process of production of the semiconductor as described above has the following problems. Namely, in a method of producing a thin film transistor having a high mobility as a polycrystalline silicon film by melting an amorphous silicon film by irradiation of a laser such as an excimer laser or an argon laser to the amorphous silicon film and recrystallizing the same, since a laser such as an excimer laser or argon laser is used, there is the problem in that it is difficult to form a thin film in a large area and therefore the desired yield and quality can hardly ever be obtained.

Note that the technique of improving the excimer laser device so as to stabilize the excimer laser output and therefore enable formation of a thin film over a large area can be considered, but there was the problem that improvement of an excimer laser device is high in cost. In this way, in the prior art, there was a problem in improvement of the performance and quality and reduction of costs along with enlargement of the size of the substrate.

In order to solve the problems, recently, catalytic CVD enabling fabrication of a polycrystalline silicon film and a silicon nitride film on an insulating substrate such as a glass substrate at a low temperature has been developed and practical application studied.

Even by the technique using catalytic CVD, however, in the same way as with plasma CVD, there was the problem that a transition layer of the initial stage amorphous silicon (5 to 10 nm) was apt to be formed according to the substrate or film forming conditions if forming a polycrystalline silicon film on a glass substrate. In the case of a bottom gate type TFT, there was the problem that the desired electron mobility could hardly ever be obtained. A bottom gate type TFT is generally easily produced in terms of yield and productivity, so development of a technique for producing a high quality bottom gate type TFT has been demanded.

Further, there was the problem that when employing catalytic CVD, if the total film formation rate is small, the temperature of the substrate would rise or unevenness would occurred in the temperature of the substrate due to the radiant heat from a thermal catalyst and that variations would occur in the film thickness and the film quality.

DISCLOSURE OF THE INVENTION

The present invention was made in consideration with such a circumstance and has as its first object to provide a thin film forming apparatus and a thin film forming method for forming a high quality thin film on a substrate.

A second object of the present invention is to provide a thin film forming apparatus and a thin film forming method and a method for producing a thin film semiconductor device for forming a thin film having a high quality and able to be applied to also a large sized display device.

A third object of the present invention is to provide a thin film forming apparatus and a thin film forming method and a method for producing a thin film semiconductor device capable of forming a high quality thin film at a high speed.

A fourth object of the present invention is to provide a thin film forming apparatus and a thin film forming method and a method for producing a thin film semiconductor device making it possible to form a high quality thin film and produce a thin film semiconductor device and capable of preventing deterioration of a thermal catalyst.

The thin film forming apparatus of the present invention is a thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming a thin film on the substrate, and the carrier gas is fed into the vacuum chamber during at least the formation of the thin film.

In this way, when a thin film is formed on the substrate, the carrier gas containing hydrogen is constantly fed, so activated hydrogen H* generated in the carrier gas cleans the substrate surface and a high quality thin film can be formed on the substrate. Further, carrier gas containing hydrogen is constantly introduced during the film formation of the substrate, therefore the thermal catalyst is protected from influence of another gas, so it becomes possible to prevent the deterioration of the thermal catalyst.

Alternatively, the thin film forming apparatus of the present invention is a thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming the thin film on the substrate, and the apparatus comprises a means for raising a concentration of the material gas in the vacuum chamber in the middle of the formation of the thin film on the substrate.

The means for raising the concentration of the material gas is provided with a carrier gas controlling means for reducing or stopping the feed of for example the carrier gas.

In this way, when forming a thin film on the substrate, since a carrier gas containing hydrogen is used, the activated hydrogen H* generated in the carrier gas cleans the substrate surface, and a high quality thin film can be formed on the substrate. Further, since provision is made of a means for reducing or stopping the introduction of for example the carrier gas after an elapse of a predetermined time after the start of the film formation when forming various films, it is possible to form a thin film on the substrate at a high speed by raising a ratio of the material gas in the vacuum chamber and it becomes possible to improve workability.

At least a first material gas for forming a first thin film on the substrate and a second material gas for forming a second thin film on the substrate are fed from the gas introduction system. The first material gas and the second material gas are controlled by a material gas controlling means so that the second material gas is introduced after an elapse of a predetermined time after the first material gas is discharged from the vacuum chamber.

In the thin film forming apparatus of the present invention, since carrier gas containing hydrogen is constantly fed to the vacuum chamber, if the introduction of the material gas is controlled so that the second material gas is introduced after an elapse of a predetermined time after the first material gas is discharged as described above, the vacuum chamber will be filled with only the carrier gas containing hydrogen between the discharge of the first material gas and the introduction of the second material gas. Accordingly, it becomes possible to apply the cleaning to the substrate surface by the activated hydrogen H* after forming the first thin film. According to the present configuration, it becomes possible to clean the substrate surface by the activated hydrogen H* at every film formation, so it becomes possible to obtain a high quality thin film layer.

Further, it is also possible to control the introduction of the material gas by the material gas controlling means so that the second material gas is introduced at substantially the same time as the discharge of the first material gas from the vacuum chamber. In this way, by continuously introducing the material gas, the thin film layer can be obtained in a shorter time and thus it becomes possible to achieve an improvement of the work efficiency.

Further, it is also possible to control the introduction of the material gas by the material gas controlling means so that the second material gas is introduced into the vacuum chamber in a state where the first material gas remains in the vacuum chamber when the first material gas is discharged from the vacuum chamber.

In this way, by gradually reducing the amount of introduction of the first material gas and gradually increasing the amount of introduction of the second material gas, the first material gas and the second material gas will be mixed in the vacuum chamber while changing the occupation rate for a predetermined time. In this way, it becomes possible to form so-called inclined interface films comprised of a first thin film and a second thin film not clearly delineated in border. By stacking thin films by inclined interface, it is possible to reduce stress between films and it becomes possible to produce a semiconductor device having a higher quality semiconductor-insulator interface structure.

The gas introduction system is provided with a gas spraying portion located in the vacuum chamber. If changing the distance of this gas spraying portion from the thermal catalyst by a position adjusting means, it becomes possible to position the gas spraying portion at a position where the best catalytic reaction is obtained in accordance with a broadness of the vacuum chamber or the types of the gas and the thermal catalyst or the shape and the size of the thermal catalyst.

Further, if enabling the distance between the thermal catalyst and the substrate to be adjusted in the vacuum chamber by holding the thermal catalyst by a moveable thermal catalyst holding means, it becomes possible to position the thermal catalyst at a position where the best catalytic reaction is obtained in accordance with the broadness of the vacuum chamber or the types of the gas and the thermal catalyst or the shape and the size of the thermal catalyst and the substrate. Further, it is also possible to dispose a shutter between the thermal catalyst and a substrate holder (substrate) according to need. By this, contamination from the thermal catalyst at the time of a temperature rise or a temperature drop of the thermal catalyst can be prevented and further inadequate film formation by the materials at that time in an insufficient thermal decomposition reaction and thermal catalytic reaction can be prevented.

Further, it is also possible to employ a configuration capable of adjusting the distance between the substrate and the thermal catalyst in the vacuum chamber by placing the substrate on the moveable substrate holder. Further, by rotating the substrate holder or placing it at any angle with respect to the thermal catalyst, it becomes possible to improve the film thickness and film quality uniformity in the substrate. When employing such a configuration, it becomes possible to position the substrate at a position where the best catalytic reaction is obtained in accordance with the broadness of the vacuum chamber or the types of the gas and the thermal catalyst or the shape and the size of the thermal catalyst.

Furthermore, by laying a rail in the vacuum chamber, attaching a means moveable on the rail to the substrate holder, and making the substrate holder moveable on the rail, for example, as described in the embodiment, it becomes possible to move the substrate holder along a long thermal catalyst arranged in the vacuum chamber, it becomes possible to uniformly apply the film formation to the substrate, and it becomes possible to reduce cost by the improvement of the productivity.

A plurality of thermal catalysts can be arranged in the vacuum chamber. It is possible to form these thermal catalysts by the same material or by materials different from each other. By freely selecting and combining the materials of the thermal catalysts in this way, it becomes possible to obtain the best catalytic reaction.

Further, it is also possible to arrange a plurality of thermal catalysts in the vacuum chamber and form these thermal catalysts in the same shape or different shapes. By freely selecting and combining the shapes of the thermal catalysts in this way, it becomes possible to obtain the best catalytic reaction.

Further, it is also possible to arrange a plurality of thermal catalysts in the vacuum chamber and connect these thermal catalysts to power supplies for supplying the same current or power supplies for supplying different currents. By this, for example, even when a plurality of thermal catalysts are formed by materials different from each other, temperature adjustment of the thermal catalysts as resistance heat generators becomes possible by adjustment of the voltage and/or the current of the power supply, so a good catalytic reaction can be obtained. Further, even in a case where thermal catalysts made of the same materials are used, it becomes possible to adjust the heating temperature of the thermal catalysts in accordance with positions of the thermal catalysts in the vacuum chamber or the sizes of the thermal catalysts per se. Note that, as the power supply, use is made of a DC power supply or an AC power supply.

As the thermal catalyst, it is preferred to select one from the group consisting of tungsten, tungsten containing thoria, platinum, molybdenum, palladium, tantalum, metal deposited ceramics, silicon, alumina, silicon carbide, refractory metals (tungsten, tantalum, tungsten containing thoria, molybdenum, titanium, etc.) coated with silicon carbide or ceramics or conductive nitride films, silicon nitride or oxide, conductive metal nitrides (tungsten nitride, titanium nitride, molybdenum nitride, tantalum nitride, etc.), boronitride (BN), and silicide.

As the substrate, it is preferred to select from among semiconductor or insulating materials including silicon, germanium, silicon germanium, silicon carbide, gallium arsenic, gallium aluminum arsenic, gallium phosphorus, indium phosphorus, zinc selenide, cadmium sulfide, quartz glass, borosilicate glass, aluminosilicate glass, and heat resistant resins.

Note that preferably the thin film to be formed on the substrate contains a gate insulating film, and the gate insulating film is selected from among a silicon oxide film, silicon nitride film, silicon oxynitride film, aluminum nitride film, aluminum oxide film, tantalum oxide film, or composite films of the same.

Further, it is also possible to constitute the thin film forming apparatus for forming a thin film by a single chamber or a multi-chamber. By constituting it by a single chamber, it becomes possible to continuously form a plurality of thin films in the same chamber, for example, inclined interface films can be formed by gradually reducing or increasing two types of the material gases in a single chamber, and it becomes possible to form high quality thin films having a reduced stress between films.

Further, when forming a thin film in a multi-chamber, predetermined thin film formation is carried out in each of the chambers, therefore it becomes possible to obtain a high work efficiency.

According to the thin film forming apparatus, it is possible to form a semiconductor thin film such as polycrystalline silicon, single crystalline silicon, amorphous silicon, microcrystalline silicon, silicon germanium, silicon carbide, compound semiconductor (gallium arsenic, gallium phosphorus, gallium nitride, etc.), diamond, and diamond-like carbon (DLC), an insulator thin film such as silicon oxide, silicon oxide containing impurities (phosphosilicate glass (PSG), borosilicate glass (BSG), borophosphosilicate glass (BPSG), etc.), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a metal thin film made by a refractory metal and conductive metal nitride thin film (tungsten, titanium, tantalum, molybdenum, tungsten nitride, titanium nitride, tantalum nitride, molybdenum nitride, etc.), silicide, copper, aluminum, aluminum-silicon or aluminum-silicon-copper, a high dielectric constant thin film such as BST, and a ferroelectric thin film such as PZT, PLZT, SBT, and BIT. The formation of various metal thin films is possible in this way.

Further, according to the thin film forming apparatus, it is possible to use the same as an apparatus for producing a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a silicon carbide semiconductor device, a silicon carbide semiconductor integrated circuit device, a diamond semiconductor device, a diamond semiconductor integrated circuit device, a liquid crystal display device, an electroluminescence display device, a plasma display panel (PDP) device, a light emission polymer display device, a light emission diode display device, a CCD area/linear sensor device, a MOS sensor device, a high dielectric/ferroelectric memory semiconductor device, a high dielectric/ferroelectric memory semiconductor integrated circuit device, a solar battery, and so on.

The thin film forming method of the present invention is a method for forming a thin film on a substrate in a vacuum chamber by catalytic CVD or high density plasma CVD or high density catalytic CVD, characterized in that it comprises a cleaning step of feeding a carrier gas containing hydrogen to the vacuum chamber and cleaning the top of the substrate by activated hydrogen H* generated in the fed carrier gas and a thin film forming step of forming the thin film on the substrate by feeding a material gas to the vacuum chamber, thin films being stacked on the substrate by repeating the cleaning step and the thin film forming step or repeating the thin film forming step after the cleaning step.

In this way, when forming a thin film on the substrate, carrier gas containing hydrogen is constantly fed, so the activated hydrogen H* generated in the carrier gas cleans the substrate surface and a high quality thin film can be formed on the substrate. Further, by feeding hydrogen gas as the carrier gas, heating the thermal catalyst to a state enabling the catalytic action, and continuously forming at least a silicon film and a gate insulating film, a low stress and a low contamination can be achieved in a gate channel portion. Further, since carrier gas containing hydrogen is constantly introduced during the film formation of the substrate, the thermal catalyst will be protected from the influence of the other gas and it becomes possible to prevent the deterioration of the thermal catalyst.

Alternatively, the thin film forming method of the present invention is a method for forming a thin film on a substrate in a vacuum chamber by catalytic CVD or high density plasma CVD or high density catalytic CVD, characterized in that it comprises a cleaning step of feeding a carrier gas containing hydrogen to the vacuum chamber and cleaning the top of the substrate by activated hydrogen H* generated in the fed carrier gas and a thin film forming step of forming a thin film on the substrate by feeding a material gas to the vacuum chamber, a silicon film being formed in at least a thin film semiconductor device forming region of the substrate and at least a gate insulating film being formed continuing from the silicon film by repeating the cleaning step and the thin film forming step or repeating the thin film forming step after the cleaning step.

As described above, when forming a thin film layer for a so-called top gate type TFT having a gate insulating film on a silicon film on a substrate, since carrier gas containing hydrogen is constantly fed, the activated hydrogen H* generated in the carrier gas cleans the substrate surface and a high quality thin film can be formed on the substrate. Further, by feeding hydrogen gas as the carrier gas, heating the thermal catalyst to a state enabling a catalytic action, and continuously forming at least a silicon film and a gate insulating film, a low stress and a low contamination can be achieved in the gate channel portion. Further, since carrier gas containing hydrogen is constantly introduced during the film formation of the substrate, the thermal catalyst will be protected from the influence of another gas and it becomes possible to prevent deterioration of the thermal catalyst.

Alternatively, the thin film forming method of the present invention is a method for forming a thin film on a substrate in a vacuum chamber by catalytic CVD or high density plasma CVD or high density catalytic CVD, characterized in that it comprises a cleaning step of feeding a carrier gas containing hydrogen to the vacuum chamber and cleaning the top of the substrate by activated hydrogen H* generated in the fed carrier gas and a thin film forming step of forming the thin film on the substrate by feeding a material gas to the vacuum chamber, at least a gate insulating film being formed in at least the thin film semiconductor device forming region of the substrate with a gate electrode formed in advance therein, and at least a silicon film being formed continuing from the related gate insulating film by repeating the cleaning step and the thin film forming step or repeating the thin film forming step after the cleaning step.

As described above, when forming a thin film layer for a so-called bottom gate type TFT having a gate insulating film and a silicon film on the substrate with the gate electrode formed in advance therein on the substrate, since carrier gas containing hydrogen is constantly fed, the activated hydrogen H* generated in the carrier gas cleans the substrate surface, and a high quality thin film can be formed on the substrate. Further, by feeding hydrogen gas as the carrier gas, heating the thermal catalyst to a state enabling a catalytic action, and continuously forming at least a silicon film and a gate insulating film, a low stress and a low contamination can be achieved in the gate channel portion. Further, since the carrier gas containing hydrogen is constantly introduced during the film formation of the substrate, the thermal catalyst will be protected from the influence of another gas and it becomes possible to prevent the deterioration of the thermal catalyst.

In this way, according to the present method, it becomes possible to form a thin film layer for a bottom gate type TFT excellent in yield and productivity with a high quality.

Alternatively, the thin film forming method of the present invention is a method for forming a thin film on a substrate in a vacuum chamber by catalytic CVD or high density plasma CVD or high density catalytic CVD, characterized in that it comprises a cleaning step of feeding a carrier gas containing hydrogen to the vacuum chamber and cleaning the top of the substrate by activated hydrogen H* generated in the fed carrier gas and a thin film forming step of forming the thin film on the substrate by feeding a material gas to the vacuum chamber, at least a first gate insulating film being formed in at least the thin film semiconductor device forming region of the substrate with a first gate electrode formed in advance therein, and at least a silicon film being formed continuing from the first gate insulating film, thereby to form a first thin film layer, and at least a second gate insulating film for a second gate electrode being formed continuing from the first thin film layer by repeating the cleaning step and the thin film forming step or repeating the thin film forming step after the cleaning step.

In this way, when forming a thin film for a so-called dual gate type semiconductor device wherein the first gate insulating film and the silicon film are continuously formed on the substrate with the first gate electrode formed in advance therein and the second gate insulating film is formed continuing from this silicon film, since the carrier gas containing hydrogen is constantly fed, the activated hydrogen H* generated in the carrier gas cleans the substrate surface, and a high quality thin film can be formed on the substrate. Further, by feeding hydrogen gas as the carrier gas, heating the thermal catalyst to a state enabling a catalytic action, and continuously forming at least the silicon film and the gate insulating film, a low stress and a low contamination can be achieved in the gate channel portion. Further, since the carrier gas containing hydrogen is constantly introduced during the film formation of the substrate, the thermal catalyst will be protected from the influence of another gas and it becomes possible to prevent the deterioration of the thermal catalyst.

In this way, according to the method of the present invention, it becomes possible to form a thin film layer for a dual gate type TFT excellent in electrical control with a high quality and at a high speed.

Further, in the thin film forming step, by feeding the first material gas to the vacuum chamber and feeding the second material gas to the vacuum chamber in the state where the first material gas remains in the vacuum chamber, the thin film formed by the second material gas is joined by inclined interface onto the thin film formed by the second material gas and stacked on the substrate, whereby the stress between adjoining films can be reduced.

In this way, by feeding the second material gas to the vacuum chamber in the state where the first material gas remains in the vacuum chamber, the first material gas and the second material gas will be mixed in the chamber 1 while changing in occupation rate over a predetermined time. In this way, so-called inclined interface films wherein the first thin film and the second thin film are not clearly delineated in border can be obtained. By stacking the thin films by an inclined interface, it is possible to reduce the stress between films, and it becomes possible to produce a semiconductor device with a higher quality.

Note that it is preferred if a step is formed in at least the semiconductor device forming region of the substrate and a single crystalline semiconductor film is grapho-epitaxially grown on the substrate containing the step. Namely, since a step is provided in the substrate and a single crystalline semiconductor film is grapho-epitaxially grown on the substrate containing the step, a single crystalline semiconductor film having a high electron mobility and excellent in operability can be obtained.

Further, it is preferred if a substance layer having a good lattice alignment with the single crystalline semiconductor is formed in at least the semiconductor device forming region of the substrate and the single crystalline semiconductor film is hetero-epitaxially grown on the substrate containing the substance layer. Namely, since a substance layer having a good lattice alignment with a single crystalline semiconductor is formed on the substrate and the single crystalline semiconductor film is hetero-epitaxially grown on the substrate containing this substance layer, a single crystalline semiconductor film having a high electron mobility and excellent in operability can be obtained.

Note that as the substance layer having a good lattice alignment with a single crystalline semiconductor, preferably use is made of a substance selected from a group consisting of sapphire, a spinel structure, and calcium fluoride.

Further, the thin film may be formed in a single chamber or formed in a multi-chamber. By forming the thin film in a single chamber, it becomes possible to continuously form a plurality of thin films in the same chamber. Further, by gradually reducing or increasing two types of material gases in the single chamber, inclined interface films can be formed, and it becomes possible to form high quality thin films having a reduced stress between films. Further, when forming a thin film in a multi-chamber, since a predetermined thin film formation is carried out in each chamber, it becomes possible to obtain a high work efficiency.

Note that catalytic CVD is a method for activating and ionizing at least one part of a material by a catalytic reaction or a thermal decomposition reaction for the thermal catalyst heated to less than the melting point and depositing these deposition seeds on a heated substrate.

Further, it is also possible to employ a configuration capable of adjusting the distance between the substrate and the thermal catalyst in the vacuum chamber by placing the substrate on a moveable substrate holder. When employing such a configuration, it becomes possible to position the substrate at a position where the best catalytic reaction is obtained in accordance with the broadness of the vacuum chamber or the types of the gas and the thermal catalyst or the shape and the size of the thermal catalyst.

It is preferred if the thermal catalyst is selected from at least one type of material selected from a group consisting of tungsten, tungsten containing thoria, platinum, molybdenum, palladium, tantalum, metal deposited ceramics, silicon, alumina, silicon carbide, refractory metal (tungsten, tantalum, tungsten containing thoria, molybdenum, titanium, etc.) coated with silicon carbide or ceramics or conductive nitride films, silicon nitride or oxide, conductive metal nitride (tungsten nitride, titanium nitride, molybdenum nitride, tantalum nitride, etc.), boronitride (BN), and silicide. Further, if the thermal catalyst is held by a moveable thermal catalyst holding means and thereby it is made possible to adjust the distance from the substrate, it becomes possible to position the thermal catalyst at a position where the best catalytic reaction is obtained in accordance with the broadness of the vacuum chamber or the types of the gas and the thermal catalyst or the shape and the size of the thermal catalyst.

It is possible to arrange a plurality of thermal catalysts in the vacuum chamber. It is possible to form these thermal catalysts by the same material or different materials from each other. By freely selecting and combining the materials of the thermal catalysts in this way, it becomes possible to obtain the best catalytic reaction.

Further, it is possible to arrange a plurality of thermal catalysts in the vacuum chamber and form these thermal catalysts in the same shape or different shapes. By freely selecting and combining the shapes of the thermal catalysts in this way, it becomes possible to obtain the best catalytic reaction.

Alternatively, it is also possible to employ a configuration arranging a plurality of thermal catalysts in the vacuum chamber and connecting these thermal catalysts to the same current-voltage supply or different current-voltage supplies. By this, even if for example a plurality of thermal catalysts are formed by materials different from each other, temperature adjustment of the thermal catalysts as the resistance heat generators becomes possible by voltage-current adjustment of the power supply, and thus a good catalytic reaction can be obtained. Further, even in the case where thermal catalysts made of the same material are used, it becomes possible to adjust the heating temperature of the thermal catalysts in accordance with the positions of the thermal catalysts in the vacuum chamber or the sizes of the thermal catalysts per se. Note that, as the power supply, use is made of a DC power supply or an AC power supply or a power supply wherein the AC is superposed on the DC.

More specifically, one or more thin films of a semiconductor thin film such as polycrystalline silicon, single crystalline silicon, amorphous silicon, microcrystalline silicon, silicon germanium, silicon carbide, compound semiconductor (gallium arsenic, gallium phosphorus, gallium nitride, etc.), diamond, and diamond-like carbon (DLC), an insulator thin film such as silicon oxide, silicon oxide containing impurities (phosphosilicate glass (PSG), borosilicate glass (BSG), borophosphosilicate glass (BPSG), etc.), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a metal thin film made by a refractory metal and conductive metal nitride thin film (tungsten, titanium, tantalum, molybdenum, tungsten nitride, titanium nitride, tantalum nitride, molybdenum nitride, etc.), silicide, copper, aluminum, aluminum-silicon or aluminum-silicon-copper, a high dielectric rate thin film such as BST, and the ferroelectric thin film such as PZT, PLZT, SBT, and BIT is formed.

Then, a silicon nitride film is formed by a gas containing hydrogen as the carrier gas and containing a silane-based gas such as monosilane, disilane, or trisilane as the material gas and ammonia, a silicon oxide film is formed by a gas containing hydrogen as the carrier gas and containing a silane-based gas such as monosilane, disilane, or trisilane as the material gas and an inert gas-diluted oxygen (for example argon- or helium-diluted oxygen) or an inert gas (for example argon- or helium-diluted ozone), and a polycrystalline silicon film is formed by a gas containing hydrogen as the carrier gas and containing at least one of monosilane, disilane, and trisilane as the material gas.

Note that, in the polycrystalline silicon film and the single crystalline silicon film, in order to control the carrier impurity concentration, phosphine, arsine and stibine are mixed into the silane-based gas containing monosilane, disilane, and trisilane in an appropriate amount to achieve an N-type, and diborane is mixed into the silane-based gas containing monosilane, disilane, and trisilane to achieve a P-type.

As the substrate, it is preferred to select it from among semiconductor or insulating materials including silicon, germanium, silicon germanium, silicon carbide, gallium arsenic, gallium aluminum arsenic, gallium phosphorus, indium phosphorus, zinc selenide, cadmium sulfide, quartz glass, borosilicate glass, aluminosilicate glass, and heat resistant resins.

Note that, preferably the thin film to be formed on the substrate includes a gate insulating film, and the gate insulating film is selected from among a silicon oxide film, silicon nitride film, silicon oxynitride film, aluminum nitride film, aluminum oxide film, tantalum oxide film, or composite films of the same.

The method for producing a thin film forming semiconductor device of the present invention is a method for producing a thin film semiconductor device containing a thin film layer by forming a thin film layer on a substrate in a vacuum chamber by catalytic CVD or high density plasma CVD or high density catalytic CVD, characterized in that it comprises a cleaning step of constantly feeding a carrier gas containing hydrogen to the vacuum chamber and cleaning the top of the substrate by activated hydrogen H* generated in the fed carrier gas, a thin film forming step of forming the thin film on the substrate by feeding a material gas to the vacuum chamber, and a step of stacking thin films on the substrate to form a thin film layer by repeating the cleaning step and the thin film forming step or repeating the thin film forming step after the cleaning step and of applying predetermined processing to the thin film layer to fabricate a semiconductor element.

The method for producing a top gate type TFT of the present invention is a method for producing a thin film semiconductor device containing a thin film layer by forming a thin film layer on a substrate in a vacuum chamber by catalytic CVD or high density plasma CVD or high density catalytic CVD, characterized in that it comprises a cleaning step of constantly feeding a carrier gas containing hydrogen to the vacuum chamber and cleaning the top of the substrate by activated hydrogen H* generated in the fed carrier gas, a thin film forming step of forming a thin film on the substrate by feeding a material gas to the vacuum chamber, and a step of forming a silicon film in at least the thin film semiconductor device forming region of the substrate and forming at least a gate insulating film continuing from the silicon film by repeating the cleaning step and the thin film forming step or repeating the thin film forming step after the cleaning step to thereby form the thin film layer and applying predetermined processing to the thin film layer to fabricate a top gate type TFT.

The method for producing a bottom gate type TFT of the present invention is a method for producing a thin film semiconductor device containing a thin film layer by forming a thin film layer on a substrate in a vacuum chamber by catalytic CVD or high density plasma CVD or high density catalytic CVD, characterized in that it comprises a cleaning step of constantly feeding a carrier gas containing hydrogen to the vacuum chamber and cleaning the top of the substrate by activated hydrogen H* generated in the fed carrier gas, a thin film forming step of forming a thin film on the substrate by feeding a material gas to the vacuum chamber, and a step of forming at least a gate insulating film in at least the thin film semiconductor device forming region of the substrate with a gate electrode formed in advance therein and forming at least a silicon film continuing from the gate insulating film by repeating the cleaning step and the thin film forming step or repeating the thin film forming step after the cleaning step to thereby form a thin film layer and applying predetermined processing to the thin film layer to fabricate a bottom gate type TFT.

The method for producing a dual gate type TFT of the present invention is a method for producing a thin film semiconductor device containing a thin film layer by forming a thin film layer on a substrate in a vacuum chamber by catalytic CVD or high density CVD or high density catalytic CVD, characterized in that it comprises a cleaning step of constantly feeding a carrier gas containing hydrogen to the vacuum chamber and cleaning the top of the substrate by activated hydrogen H* generated in the fed carrier gas, a thin film forming step of forming a thin film on the substrate by feeding a material gas to the vacuum chamber, and a step of repeating the cleaning step and the thin film forming step or repeating the thin film forming step after the cleaning step to form at least a first gate insulating film in at least the thin film semiconductor device forming region of the substrate with a first gate electrode formed in advance therein, form a first thin film layer by forming at least a silicon film continuing from the first gate insulating film, and form a second thin film layer by forming a second gate insulating film for at least a second gate electrode continuing from the first thin film layer and applying predetermined processing to the first thin film layer and second thin film layer to thereby fabricate a dual gate type TFT.

In this way, in the methods, since the carrier gas containing hydrogen is constantly fed, the activated hydrogen H* generated in the carrier gas cleans the substrate surface, so a high quality thin film can be formed on the substrate. Further, by feeding hydrogen gas as the carrier gas, heating the thermal catalyst to a state enabling a catalytic action, and continuously forming at least the silicon film and the gate insulating film, a low stress and a low contamination can be achieved in the gate channel portion.

Then, since semiconductor elements are fabricated by applying predetermined processing to the high quality thin film layer obtained by the methods of the inventions, it becomes possible to obtain various high quality thin film semiconductor devices.

Further, according to the methods of the present invention, since carrier gas containing hydrogen is constantly introduced during the formation of the substrate, the thermal catalyst will be protected from the influence of another gas, and it becomes possible to prevent the deterioration of the thermal catalyst.

Further, by employing a configuration wherein a step is formed in at least the semiconductor device forming region of the substrate and a single crystalline semiconductor film is grapho-epitaxially grown on the substrate containing the step or employing a configuration wherein a substance layer having a good lattice alignment with the single crystalline semiconductor is formed in at least the semiconductor device forming region of the substrate and the single crystalline semiconductor film is hetero-epitaxially grown on the substrate containing the substance layer, it is possible to obtain a single crystalline semiconductor film having a high electron mobility and excellent in operability.

Further, it is preferred to apply the thin film layer to a channel region, a source region, or a drain region of an insulating gate type field effect transistor and control the types of the impurities injected into these regions and/or concentrations.

Further, according to the method for producing the thin film semiconductor device, it is possible to produce a silicon semiconductor device, silicon semiconductor integrated circuit device, silicon-germanium semiconductor device, silicon-germanium semiconductor integrated circuit device, compound semiconductor device, compound semiconductor integrated circuit device, silicon carbide semiconductor device, silicon carbide semiconductor integrated circuit device, diamond semiconductor device, diamond semiconductor integrated circuit device, liquid crystal display device, electroluminescence display device, plasma display panel (PDP) device, light emission polymer display device, light emission diode display device, CCD area/linear sensor device, MOS sensor device, high dielectric/ferroelectric memory semiconductor device, high dielectric/ferroelectric memory semiconductor integrated circuit device, solar battery, and so on.

Further, the thin film forming method of the present invention is a method for forming a thin film on a substrate in a vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming a thin film on the substrate by feeding a material gas to the vacuum chamber, and a carrier gas stopping step of reducing or stopping the feed of the carrier gas, thin films being stacked on the substrate by repeating the cleaning step and the thin film forming step and the carrier gas stopping step or repeating the thin film forming step and the carrier gas stopping step after the cleaning step.

In this way, by the carrier gas stopping step of reducing or stopping the feed of the carrier gas, when forming various films, after the elapse of a predetermined time after the start of the film formation, the introduction of the carrier gas is reduced or stopped, therefore the ratio of the material gas becomes high in the vacuum chamber, the formation of the thin film onto the substrate is carried out at a high speed, and it becomes possible to improve the workability. Further, when forming a thin film on a substrate, since a carrier gas containing hydrogen is fed, the activated hydrogen H* generated in the carrier gas cleans the substrate surface, thus a high quality thin film can be formed on the substrate. Further, by feeding hydrogen gas as the carrier gas, heating the thermal catalyst to a state enabling a catalytic action, and continuously forming at least the silicon film and the gate insulating film, a low stress and low contamination can be achieved in the gate channel portion.

Alternatively, the thin film forming method of the present invention is a method for forming a thin film on a substrate in a vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming a thin film on the substrate by feeding a material gas to the vacuum chamber, and a carrier gas stopping step of reducing or stopping the feed of the carrier gas, a silicon film being formed in at least the thin film semiconductor device forming region of the substrate and at least a gate insulating film being formed continuing from the silicon film by repeating the cleaning step and the thin film forming step and the carrier gas stopping step or repeating the thin film forming step and the carrier gas stopping step after the cleaning step.

As described above, when forming a thin film layer for a so-called top gate type TFT having a gate insulating film on a silicon film on a substrate, by the carrier gas stopping step of reducing or stopping the feed of the carrier gas, when forming various films, after the elapse of a predetermined time after the start of the film formation, the introduction of the carrier gas is reduced or stopped, therefore the ratio of the material gas becomes high in the vacuum chamber, the formation of the thin film onto the substrate is carried out at a high speed, and it becomes possible to improve the workability. Further, when forming a thin film on a substrate, since a carrier gas containing hydrogen is fed, the activated hydrogen H* generated in the carrier gas cleans the substrate surface, and thus a high quality thin film can be formed on the substrate. Further, by feeding hydrogen gas as the carrier gas, heating the thermal catalyst to a state enabling a catalytic action, and continuously forming at least the silicon film and the gate insulating film, a low stress and low contamination can be achieved in the gate channel portion.

Alternatively, the thin film forming method of the present invention is a method for forming the thin film on the substrate in the vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming a thin film on the substrate by feeding a material gas to the vacuum chamber, and a carrier gas stopping step of reducing or stopping the feed of the carrier gas, at least a gate insulating film being formed in at least the thin film semiconductor device forming region of the substrate with thegate electrode formed in advance therein and at a least silicon film being formed continuing from the gate insulating film by repeating the cleaning step and the thin film forming step and the carrier gas stopping step or repeating the thin film forming step and the carrier gas stopping step after the cleaning step.

As described above, when forming a thin film layer for a so-called bottom gate type TFT having a gate insulating film and a silicon film on the substrate with the gate electrode formed in advance therein on the substrate, by the carrier gas stopping step of reducing or stopping the feed of the carrier gas, when forming various films, after the elapse of a predetermined time after the start of the film formation, the introduction of the carrier gas is reduced or stopped, therefore the ratio of the material gas becomes high in the vacuum chamber, the formation of the thin film onto the substrate is carried out at a high speed, and it becomes possible to improve the workability. Further, when forming the thin film on the substrate, since the carrier gas containing hydrogen is fed, the activated hydrogen H* generated in the carrier gas cleans the substrate surface, and thus a high quality thin film can be formed on the substrate. Further, by feeding hydrogen gas as the carrier gas, heating the thermal catalyst to a state enabling a catalytic action, and continuously forming at least the silicon film and the gate insulating film, a low stress and low contamination can be achieved in the gate channel portion.

In this way, according to the method of the present invention, it becomes possible to form a thin film layer for a bottom gate type TFT excellent in yield and productivity with a high quality and at a high speed.

Alternatively, the thin film forming method of the present invention is a method for forming a thin film on a substrate in a vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming a thin film on the substrate by feeding a material gas to the vacuum chamber, and a carrier gas stopping step of reducing or stopping the feed of the carrier gas, at least a first gate insulating film being formed in at least the thin film semi-conductor device forming region of the substrate with a first gate electrode formed in advance therein and at a least silicon film being formed continuing from the first gate insulating film to form a first thin film layer and a second gate insulating film for at least a second gate electrode being formed continuing from the first thin film layer by repeating the cleaning step and the thin film forming step and the carrier gas stopping step or repeating the thin film forming step and the carrier gas stopping step after the cleaning step.

In this way, when forming a thin film for a so-called dual gate type semiconductor device wherein a first gate insulating film and a silicon film are continuously formed on a substrate with a first gate electrode formed in advance therein and the second gate insulating film is formed continuing from this silicon film on the substrate, by the carrier gas stopping step of reducing or stopping the feed of the carrier gas, when forming various films, after the elapse of a predetermined time after the start of the film formation, the introduction of the carrier gas is reduced or stopped, therefore the ratio of the material gas becomes high in the vacuum chamber, the formation of the thin film onto the substrate is carried out at a high speed, and it becomes possible to improve the workability. Further, when forming a thin film on a substrate, since a carrier gas containing hydrogen is fed, the activated hydrogen H* generated in the carrier gas cleans the substrate surface, thus a high quality thin film can be formed on the substrate. Further, by feeding hydrogen gas as the carrier gas, heating the thermal catalyst to a state enabling a catalytic action, and continuously forming at least the silicon film and the gate insulating film, a low stress and low contamination can be achieved in the gate channel portion.

In this way, according to the method of the present invention, it becomes possible to form a thin film layer for a dual gate type TFT excellent in electrical control with a high quality and at a high speed.

Further, in the thin film forming step, by feeding the first material gas to the vacuum chamber and feeding the second material gas to the vacuum chamber in the state where the first material gas remains in the vacuum chamber, the thin film formed by the second material gas is joined by inclined interface onto the thin film formed by the first material gas and stacked on the substrate, whereby the stress between adjoining films can be reduced.

In this way, by feeding the second material gas to the vacuum chamber in the state where the first material gas remains in the vacuum chamber, the first material gas and the second material gas will be mixed in the chamber 1 while changing in occupation rate over a predetermined time. In this way, so-called inclined interface films wherein the first thin film and the second thin film are not clearly delineated in border can be obtained. By stacking the thin films by an inclined interface, it is possible to reduce the stress between films, and it becomes possible to produce a semiconductor device with a higher quality.

Note that it is preferred if a step is formed in at least the semiconductor device forming region of the substrate and a single crystalline semiconductor film is grapho-epitaxially grown on the substrate containing the step. Namely, since a step is provided in the substrate and a single crystalline semiconductor film is grapho-epitaxially grown on the substrate containing the step, a single crystalline semiconductor film having a high electron mobility and excellent in operability can be obtained.

Further, it is preferred if a substance layer having a good lattice alignment with the single crystalline semiconductor is formed in at least the semiconductor device forming region of the substrate and the single crystalline semiconductor film is hetero-epitaxially grown on the substrate containing the substance layer. Namely, since a substance layer having a good lattice alignment with a single crystalline semiconductor is formed on the substrate and the single crystalline semiconductor film is hetero-epitaxially grown on the substrate containing this substance layer, a single crystalline semiconductor film having a high electron mobility and excellent in operability can be obtained.

Note that as the substance layer having a good lattice alignment with a single crystalline semiconductor, preferably use is made of a substance selected from a group consisting of sapphire, a spinel structure, and calcium fluoride.

Further, the thin film may be formed in a single chamber or formed in a multi-chamber. By forming the thin film in a single chamber, it becomes possible to continuously form a plurality of thin films in the same chamber. Further, by gradually reducing or increasing two types of material gases in the single chamber, inclined interface films can be formed, and it becomes possible to form high quality thin films having a reduced stress between films. Further, when forming a thin film in a multi-chamber, since a predetermined thin film formation is carried out in each chamber, it becomes possible to obtain a high work efficiency.

Note that catalytic CVD is a method for activating and ionizing at least one part of a material by a catalytic reaction or a thermal decomposition reaction for the thermal catalyst heated to less than the melting point and depositing these deposition seeds on a heated substrate.

Further, it is also possible to employ a configuration capable of adjusting the distance between the substrate and the thermal catalyst in the vacuum chamber by placing the substrate on a moveable substrate holder. When employing such a configuration, it becomes possible to position the substrate at a position where the best catalytic reaction is obtained in accordance with the broadness of the vacuum chamber or the types of the gas and the thermal catalyst or the shape and the size of the thermal catalyst.

It is preferred if the thermal catalyst is selected from at least one type of material selected from a group consisting of tungsten, tungsten containing thoria, platinum, molybdenum, palladium, tantalum, metal deposited ceramics, silicon, alumina, silicon carbide, refractory metal (tungsten, tantalum, tungsten containing thoria, molybdenum, titanium, etc.) coated with silicon carbide or ceramics or conductive nitride films, silicon nitride or oxide, conductive metal nitride (tungsten nitride, titanium nitride, molybdenum nitride, tantalum nitride, etc.), boronitride (BN), and silicide.

Further, if the thermal catalyst is held by a moveable thermal catalyst holding means and thereby it is made possible to adjust the distance from the substrate, it becomes possible to position the thermal catalyst at a position where the best catalytic reaction is obtained in accordance with the broadness of the vacuum chamber or the types of the gas and the thermal catalyst or the shape and the size of the thermal catalyst.

It is possible to arrange a plurality of thermal catalysts in the vacuum chamber. It is possible to form these thermal catalysts by the same material or different materials from each other. By freely selecting and combining the materials of the thermal catalysts in this way, it becomes possible to obtain the best catalytic reaction.

Further, it is possible to arrange a plurality of thermal catalysts in the vacuum chamber and form these thermal catalysts in the same shape or different shapes. By freely selecting and combining the shapes of the thermal catalysts in this way, it becomes possible to obtain the best catalytic reaction.

Alternatively, it is also possible to employ a configuration arranging a plurality of thermal catalysts in the vacuum chamber and connecting these thermal catalysts to the same current-voltage supply or different current-voltage supplies. By this, even if for example a plurality of thermal catalysts are formed by materials different from each other, temperature adjustment of the thermal catalysts as the resistance heat generators becomes possible by voltage-current adjustment of the power supply, and thus a good catalytic reaction can be obtained. Further, even in the case where thermal catalysts made of the same material are used, it becomes possible to adjust the heating temperature of the thermal catalysts in accordance with the positions of the thermal catalysts in the vacuum chamber or the sizes of the thermal catalysts per se. Note that, as the power supply, use is made of a DC power supply or an AC power supply or a power supply wherein the AC is superposed on the DC.

More specifically, one or more thin films of a semiconductor thin film such as polycrystalline silicon, single crystalline silicon, amorphous silicon, microcrystalline silicon, silicon germanium, silicon carbide, compound semiconductor (gallium arsenic, gallium phosphorus, gallium nitride, etc.), diamond, and diamond-like carbon (DLC), an insulator thin film such as silicon oxide, silicon oxide containing impurities (phosphosilicate glass (PSG), borosilicate glass (BSG), borophosphosilicate glass (BPSG), etc.), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a metal thin film made by a refractory metal and conductive metal nitride thin film (tungsten, titanium, tantalum, molybdenum, tungsten nitride, titanium nitride, tantalum nitride, molybdenum nitride, etc.), silicide, copper, aluminum, aluminum-silicon or aluminum-silicon-copper, a high dielectric rate thin film such as BST, and the ferroelectric thin film such as PZT, PLZT, SBT, and BIT is formed.

Then, a silicon nitride film is formed by a gas containing hydrogen as the carrier gas and containing a silane-based gas such as monosilane, disilane, or trisilane as the material gas and ammonia, a silicon oxide film is formed by a gas containing hydrogen as the carrier gas and containing a silane-based gas such as monosilane, disilane, or trisilane as the material gas and an inert gas-diluted oxygen (for example argon- or helium-diluted oxygen) or an inert gas (for example argon- or helium-diluted ozone), and a polycrystalline silicon film is formed by a gas containing hydrogen as the carrier gas and containing at least one of monosilane, disilane, and trisilane as the material gas.

Note that, in the polycrystalline silicon film and the single crystalline silicon film, in order to control the carrier impurity concentration, phosphine, arsine and stibine are mixed into the silane-based gas containing monosilane, disilane, and trisilane in an appropriate amount to achieve an N-type, and diborane is mixed into the silane-based gas containing monosilane, disilane, and trisilane to achieve a P-type.

As the substrate, it is preferred to select it from among semiconductor or insulating materials including silicon, germanium, silicon germanium, silicon carbide, gallium arsenic, gallium aluminum arsenic, gallium phosphorus, indium phosphorus, zinc selenide, cadmium sulfide, quartz glass, borosilicate glass, aluminosilicate glass, and heat resistant resins.

Note that, preferably the thin film to be formed on the substrate includes a gate insulating film, and the gate insulating film is selected from among a silicon oxide film, silicon nitride film, silicon oxynitride film, aluminum nitride film, aluminum oxide film, tantalum oxide film, or composite films of the same.

The process of production of a thin film semiconductor device of the present invention is a method for producing a thin film semiconductor device containing a thin film layer by forming a thin film on a substrate in a vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming a thin film on the substrate by feeding a material gas to the vacuum chamber, and a carrier gas stopping step of reducing or stopping the feed of the carrier gas, thin films being stacked on the substrate to form a thin film layer by repeating the cleaning step and the thin film forming step and the carrier gas stopping step or repeating the thin film forming step and the carrier gas stopping step after the cleaning step, and predetermined processing being applied to the thin film layer to fabricate a semiconductor element.

The process of production of a top gate type TFT of th e present invention is a method for producing a thin film semiconductor device containing a thin film layer by forming a thin film on a substrate in a vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming a thin film on the substrate by feeding a material gas to the vacuum chamber, a carrier gas stopping step of reducing or stopping the feed of the carrier gas, and a step of forming a silicon film in at least the thin film semiconductor device forming region of the substrate and forming a thin film layer by forming at least a gate insulating film continuing from the silicon film by repeating the cleaning step and the thin film forming step and the carrier gas stopping step or repeating the thin film forming step and the carrier gas stopping step after the cleaning step to thereby form a thin film layer and applying predetermined processing to the thin film layer to thereby fabricate a top gate type TFT.

The process of production of a bottom gate type TFT of the present invention is a method for producing a thin film semiconductor device containing a thin film layer by forming a thin film on a substrate in a vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming the thin film on the substrate by feeding a material gas to the vacuum chamber, a carrier gas stopping step of reducing or stopping the feed of the carrier gas, and a step of forming at least a gate insulating film in at least the thin film semiconductor device forming region of the substrate with the gate electrode formed in advance therein and forming a thin film layer by forming at least a silicon film continuing from the gate insulating film by repeating the cleaning step and the thin film forming step and the carrier gas stopping step or repeating the thin film forming step and the carrier gas stopping step after the cleaning step to thereby form a thin film layer and applying predetermined processing to the thin film layer to thereby fabricate a bottom gate type TFT.

The process of production of a dual gate type TFT of the present invention is a method for producing a thin film semiconductor device containing a thin film layer by forming a thin film on a substrate in a vacuum chamber by catalytic CVD or high density CVD or high density catalytic CVD, characterized in that it comprises a cleaning step of feeding a carrier gas containing hydrogen to the vacuum chamber and cleaning the top of the substrate by the activated hydrogen H* generated in the carrier gas, a thin film forming step of forming a thin film on the substrate by feeding a material gas to the vacuum chamber, a carrier gas stopping step of reducing or stopping the feed of the carrier gas, and a step of forming at least a first gate insulating film in at least the thin film semiconductor device forming region of the substrate with the first gate electrode formed in advance therein and forming a first thin film layer by forming at least a silicon film continuing from the first gate insulating film and forming a second thin film layer by forming at least a second gate insulating film for a second gate electrode continuing from the first thin film layer by repeating the cleaning step and the thin film forming step and the carrier gas stopping step or repeating the thin film forming step and the carrier gas stopping step after the cleaning step and applying predetermined processing to the first thin film layer and second thin film layer to thereby fabricate a dual gate type TFT.

In this way, in the methods, by the carrier gas stopping step of reducing or stopping the feed of the carrier gas, when forming various films, after the elapse of a predetermined time after the start of the film formation, the introduction of the carrier gas is reduced or stopped, therefore the ratio of the material gas becomes high in the vacuum chamber, the formation of the thin film onto the substrate is carried out at a high speed, and it becomes possible to improve the workability. Further, when forming a thin film on a substrate, since carrier gas containing hydrogen is fed, the activated hydrogen H* generated in the carrier gas cleans the substrate surface, thus a high quality thin film can be formed on the substrate. Further, by feeding hydrogen gas as the carrier gas, heating the thermal catalyst to a state enabling a catalytic action, and continuously forming at least the silicon film and the gate insulating film, a low stress and low contamination can be achieved in the gate channel portion.

Further, by applying predetermined processing to the high quality thin film layer obtained by these methods to fabricate a semiconductor element, so it becomes possible to obtain various thin film semiconductor devices of high quality.

Further, by employing a configuration wherein a step is formed in at least the semiconductor device forming region of the substrate and a single crystalline semiconductor film is grapho-epitaxially grown on the substrate containing the step or employing a configuration wherein the substance layer having a good lattice alignment with the single crystalline semiconductor is formed in at least the semiconductor device forming region of the substrate and the single crystalline semiconductor film is hetero-epitaxially grown on the substrate containing the substance layer, it is possible to obtain a single crystalline semiconductor film having a high electron mobility and excellent in operability.

Further, it is preferred to apply the thin film layer to the channel region, source region, or drain region of an insulating gate type electrolytic effect transistor and control the types of the impurities injected into these regions and/or concentrations thereof.

Further, according to the methods for producing a thin film semiconductor device, it is possible to produce a silicon semiconductor device, silicon semiconductor integrated circuit device, silicon-germanium semiconductor device, silicon-germanium semiconductor integrated circuit device, compound semiconductor device, compound semiconductor integrated circuit device, silicon carbide semiconductor device, silicon carbide semiconductor integrated circuit device, diamond semiconductor device, diamond semiconductor integrated circuit device, liquid crystal display device, electroluminescence display device, plasma display panel (PDP) device, light emission polymer display device, light emission diode display device, CCD area/linear sensor device, MOS sensor device, high dielectric/ferroelectric memory semiconductor device, high dielectric/ferroelectric memory semiconductor integrated circuit device, solar battery, and so on.

BEST MODE FOR WORKING THE INVENTION

Below, embodiments of the present invention will be explained by referring to the attached drawings.

First, an explanation will be made of preferred embodiments of a thin film forming method and a process of production of a thin film semiconductor device according to the present invention in relation to a thin film forming apparatus shown in FIG. 1 employing the method of the present invention. Thereafter, an explanation will be made of a thin film forming apparatus S according to the present invention.

The method for forming a thin film in the present invention is a method for forming a thin film on a substrate in a vacuum chamber by catalytic CVD or high density plasma CVD or high density catalytic CVD. A carrier gas containing hydrogen is constantly fed to the vacuum chamber, and activated hydrogen H* generated from the carrier gas cleans the top of a substrate 10. On the cleaned substrate 10, a thin film is formed by introducing a material gas into the vacuum chamber.

Further, according to the method for forming a thin film according to the present invention, by reducing or stopping the feed of the carrier gas in the middle of the formation of the thin film, the ratio of the material gas in the vacuum chamber becomes high, so it becomes possible to form a thin film at a high speed.

In this way, when forming a thin film on the substrate 10, since carrier gas containing hydrogen is constantly fed, part of the fed carrier gas becomes activated hydrogen H*. This activated hydrogen H* cleans the substrate surface and thus a high quality thin film can be formed on the substrate 10. Further, by feeding hydrogen gas as a carrier gas, heating the thermal catalyst to a state enabling a catalytic action, and continuously forming at least a silicon film and a gate insulating film, it becomes possible to achieve a low stress and low contamination in the gate channel portion.

Further, when constantly introducing carrier gas containing hydrogen during the film formation of the substrate, the thermal catalyst will be protected from the influence of the other gas, thus it becomes possible to prevent the deterioration of the thermal catalyst.

Figure 42:
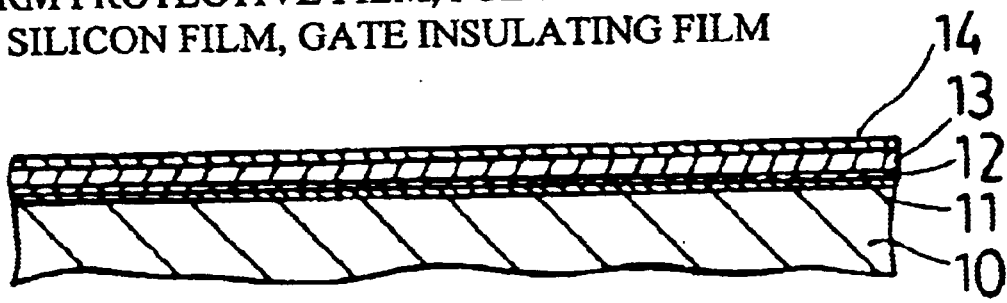
FIG. 42 is an explanatory view of a process of a thin film forming method and a process of production of a thin film semiconductor in the embodiment of the present invention.

Note that as the method of formation of a thin film layer when forming a top gate type TFT, in addition to the above description, as a concrete example, as shown in FIG. 42, a silicon film is formed in at least a thin film semiconductor device forming region of the substrate 10 and at least a gate insulating film is formed continuing from this silicon film.

Further, as the method of formation of a thin film layer when forming the bottom gate type TFT, at least a gate insulating film is formed in at least the thin film semiconductor device forming region of the substrate 10 with a gate electrode formed in advance therein, and at least a silicon film is formed continuing from this gate insulating film.

Further, as the method of formation of a thin film layer when forming the dual gate type TFT, at least a first gate insulating film is formed in at least the thin film semiconductor device forming region of the substrate 10 with the first gate electrode formed in advance therein, and at least a silicon film is formed continuing from this first gate insulating film, thereby to form a first thin film layer, and a second gate insulating film for at least a second gate electrode is formed continuing from the first thin film layer.

Figure 51:
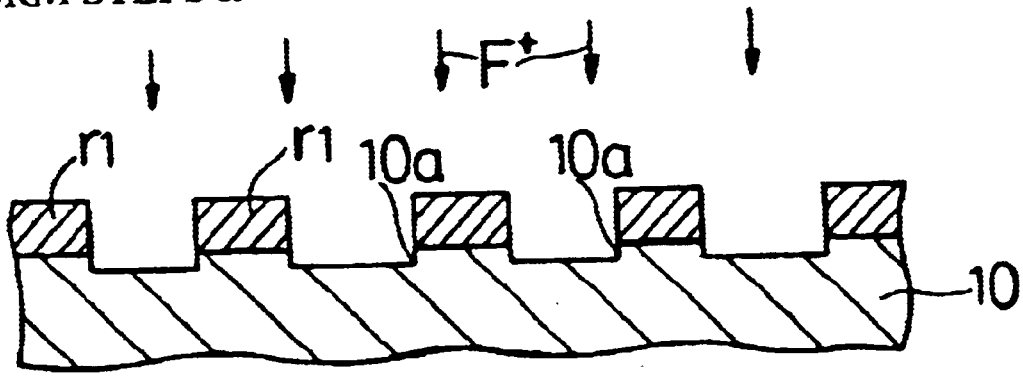
FIG. 51 is an explanatory view of a process of a thin film forming method and a process of production of a thin film semiconductor in the embodiment of the present invention.
Figure 62:
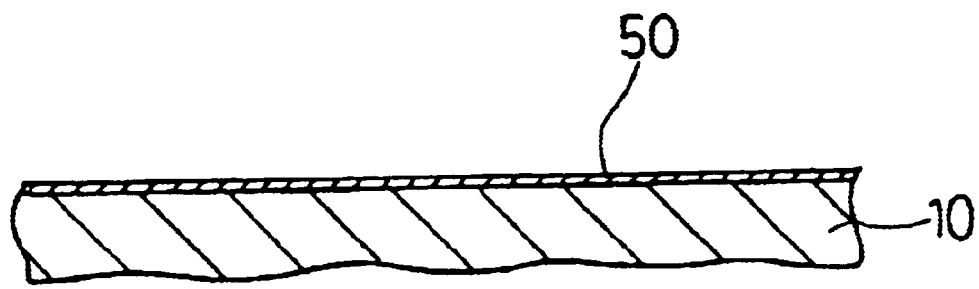
FIG. 62 is an explanatory view of a process of a thin film forming method and a process of production of a thin film semiconductor in the embodiment of the present invention.
Figure 63:
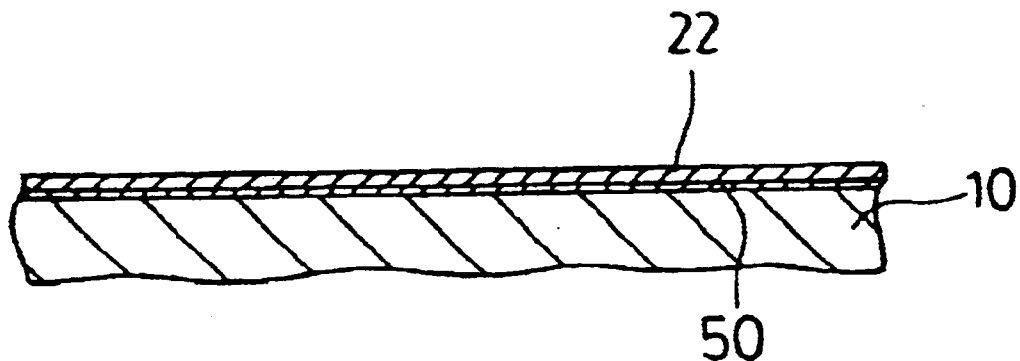
FIG. 63 is an explanatory view of a process of a thin film forming method and a process of production of a thin film semiconductor in the embodiment of the present invention.

Note that it is also possible to employ a configuration wherein, as shown in FIG. 51 as a concrete example, a step is formed in at least the semiconductor device forming region of the substrate 10 and a single crystalline semiconductor film is grapho-epitaxially grown on the substrate containing the step, or as shown in FIGS. 62 and 63 as a concrete example, a substance layer having a good lattice alignment with a single crystalline semiconductor is formed in at least the semiconductor device forming region of the substrate and the single crystalline semiconductor film is hetero-epitaxially grown on the substrate containing the substance layer. At this time, the substance layer having a good lattice alignment with the single crystalline semiconductor is selected from a group consisting of sapphire, a spinel structure, and calcium fluoride.

The formation of the thin film onto the substrate 10 is carried out in either a single chamber or a multi-chamber. In these chambers, catalytic CVD or high density plasma CVD or high density catalytic CVD is carried out. Among the CVD processes, catalytic CVD is a method for activating and ionizing at least part of the material gas by a catalytic reaction or thermal decomposition reaction for a thermal catalyst heated to less than the melting point and depositing these deposition seeds on the heated substrate.

Note that it is preferred if the thermal catalyst 5 is selected from at least one type of material selected from a group consisting of tungsten, tungsten containing thoria, platinum, molybdenum, palladium, tantalum, metal deposited ceramics, silicon, alumina, silicon carbide, refractory metals (tungsten, tantalum, tungsten containing thoria, molybdenum, titanium, etc.) coated with silicon carbide or ceramics or conductive nitride films, silicon nitride or oxide, conductive metal nitrides (tungsten nitride, titanium nitride, molybdenum nitride, tantalum nitride, etc.), boronitride (BN), and silicide or materials obtained combining some elements selected from among them.

On the substrate 10, according to the thin film forming apparatus mentioned above, one or more thin films of a semiconductor thin film such as polycrystalline silicon, single crystalline silicon, amorphous silicon, microcrystalline silicon, silicon germanium, silicon carbide, compound semiconductor (gallium arsenic, gallium phosphorus, gallium nitride, etc.), diamond, and diamond-like carbon (DLC), an insulator thin film such as silicon oxide, silicon oxide containing impurities (phosphosilicate glass (PSG), borosilicate glass (BSG), borophosphosilicate glass (BPSG), etc.), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a metal thin film made by the refractory metal and conductive metal nitride thin film (tungsten, titanium, tantalum, molybdenum, tungsten nitride, titanium nitride, tantalum nitride, molybdenum nitride, etc.), silicide, copper, aluminum, aluminum-silicon or aluminum-silicon-copper, a high dielectric rate thin film such as BST, and a ferroelectric thin film such as PZT, PLZT, SBT, and BIT are formed.

Further, a silicon nitride film is formed by a gas containing hydrogen as a carrier gas and containing a silane-based gas such as monosilane, disilane, or trisilane as the material gas and ammonia, a silicon oxide film is formed by a gas containing hydrogen as a carrier gas and containing a silane-based gas such as monosilane, disilane, or trisilane as the material gas and inert gas-diluted oxygen (for example, argon- or helium-diluted oxygen) or an inert gas (for example, argon- or helium-diluted ozone), and a polycrystalline silicon film is formed by a gas containing hydrogen as a carrier gas and containing at least one of monosilane, disilane, and trisilane as the material gas.

Note that, in the polycrystalline silicon film and the single crystalline silicon film, in order to control the carrier impurity concentration, it is possible to mix phosphine, arsine, and stibine into a silane-based gas including monosilane, disilane, and trisilane in an appropriate amount to achieve an N-type and mix diborane into a silane-based gas including monosilane, disilane, and trisilane to achieve a P-type.

The substrate is selected from among semiconductor or insulative materials including silicon, germanium, silicon germanium, silicon carbide, gallium arsenic, gallium aluminum arsenic, gallium phosphorus, indium phosphorus, zinc selenide, cadmium sulfide, quartz glass, borosilicate glass, aluminosilicate glass, and heat resistant resins.

The thin film includes a gate insulating film. The gate insulating film is selected from among a silicon oxide film, silicon nitride film, silicon oxynitride film, aluminum nitride film, aluminum oxide film, tantalum oxide film, or composite films of the same.

Note that a thin film semiconductor device is fabricated by applying predetermined processing to a thin film layer formed by depositing thin films formed as described above. At this time, it is assumed that a thin film layer is applied to the channel region, source region, and drain region of an insulating gate type field effect transistor, and the impurity types of these regions and the concentrations thereof are controlled.

Thin film semiconductor devices produced according to the process of production of the thin film semiconductor device of the present invention include a silicon semiconductor device, silicon semiconductor integrated circuit device, silicon-germanium semiconductor device, silicon-germanium semiconductor integrated circuit device, compound semiconductor device, compound semiconductor integrated circuit device, silicon carbide semiconductor device, silicon carbide semiconductor integrated circuit device, diamond semiconductor device, diamond semiconductor integrated circuit device, liquid crystal display device, electroluminescence display device, plasma display panel (PDP) device, light emission polymer display device, light emission diode display device, CCD area/linear sensor device, MOS sensor device, high dielectric/ferroelectric memory semiconductor device, high dielectric/ferroelectric memory semiconductor integrated circuit device, or solar battery, and so on.

Next, an explanation will be made of a preferred embodiment of a thin film forming apparatus S according to the present invention based on FIG. 1. The thin film forming apparatus S in the present embodiment is provided with a chamber 1 serving as a vacuum chamber, a substrate 10, a thermal catalyst 5, and a heating means 5a for heating the thermal catalyst 5. Further, in the vacuum chamber, a gas introduction system 3 for supplying a gas is connected.

From the gas introduction system 3, a carrier gas containing hydrogen and a material gas for forming a thin film on the substrate 10 are introduced. The thin film is formed on the surface of the substrate 10 by utilizing a thermal decomposition reaction and/or catalytic reaction by the thermal catalyst 5.

First, an explanation will be made of the mode of introduction of a carrier gas containing hydrogen.

It is also possible to constantly feed a carrier gas into the vacuum chamber at least during the formation of the thin film under the control by a mass flow controller M or reduce or stop it in the middle of the formation of the thin film on the substrate.

The carrier gas introduced into the chamber 1 is partially activated by the thermal decomposition reaction and/or catalyst decomposition reaction by the thermal catalyst 5 to form the activated hydrogen H* and reaches the surface of the substrate 10 to clean the surface of the substrate 10. For example, when introducing the carrier gas into the chamber 1 before feeding the material gas, the cleaning is applied to the surface of the substrate 10 before the formation of the thin film.

Figure 18:
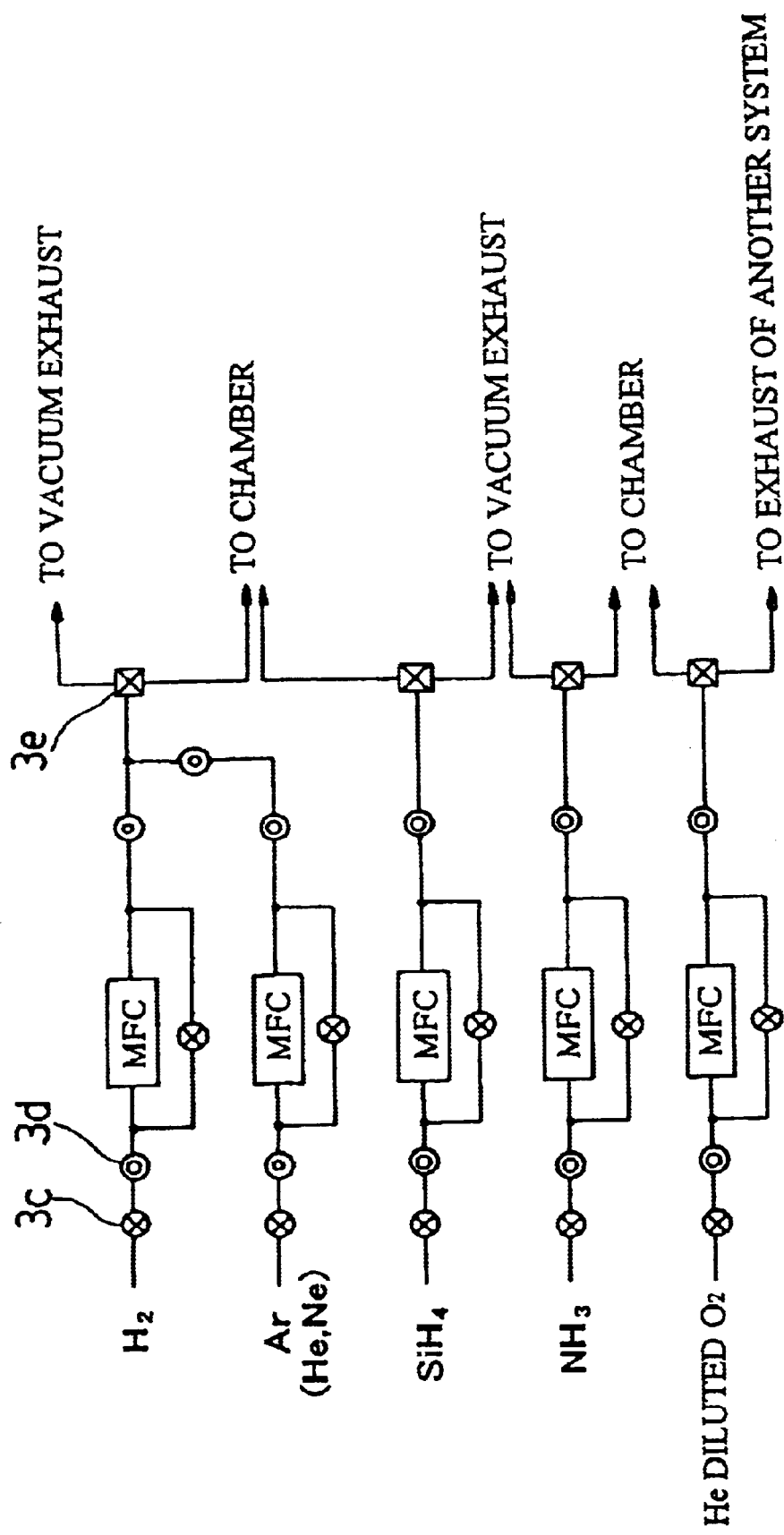
FIG. 18 is an explanatory view of an example of a method of feeding a gas.

Further, as in FIG. 18, the material gas for forming the thin film on the substrate 10 is introduced into the chamber 1. In the present embodiment, even when the material gas is introduced, the carrier gas containing hydrogen is constantly fed into the chamber 1. On the other hand, the timing of introduction of the material gas into the chamber 1 is controlled by the mass flow controller M serving as the material gas controlling means.

For example, the introduction of the material gas is controlled so that after an elapse of a predetermined time after the first material gas is introduced from the gas introduction system 3 and the first thin film is formed on the substrate 10, the second material gas is introduced. In the present embodiment, the carrier gas containing hydrogen is constantly fed into the chamber 1, therefore after the first thin film is formed and the first material gas is discharged, the chamber 1 is filled with only the carrier gas for a predetermined time. Accordingly, in the chamber 1, part of the carrier gas becomes activated hydrogen H* by the contact decomposition reaction by the thermal catalyst 5 and reaches the surface of the substrate 10 to clean the surface of the substrate 10.

Alternatively, the mass flow controller M serving as the material gas controlling means controls the system to introduce the first material gas from the gas introduction system 3 and, after the first thin film is formed on the substrate 10, introduce the second material gas simultaneously with the discharge of the first material gas from the chamber 1. By continuously introducing the material gases, the thin film layer can be obtained in a shorter time, and it becomes possible to achieve an improvement of the work efficiency.

Furthermore, the material gas controlling means controls the system to introduce the first material gas from the gas introduction system 3 and, after the first thin film is formed on the substrate 10, when the first material gas is discharged, introduce the second material gas in the state where the first material gas remains in the chamber 1.

By gradually. reducing the amount of introduction of the first material gas and gradually increasing the amount of introduction of the second material gas in this way, the first material gas and the second material gas will be mixed in the chamber 1 for a predetermined time while changing in occupation rate. In this way, it becomes possible to form so-called inclined interface films wherein the first thin film and the second thin film are not clearly delineated in border. By stacking the thin films by an inclined interface, the stress between films can be reduced, and it becomes possible to produce a semiconductor device having a semiconductor-insulator interface structure with a higher quality.

Note that the gas introduction system 3 for introducing the carrier gas and the material gas into the chamber 1 is provided with a gas shower head 3a as the gas spraying portion. The gas shower head 3a is held at a shower head holder 3b serving as a position adjusting means and is constituted so that the distance from the thermal catalyst 5 can be adjusted by this shower head holder 3b.

The thermal catalyst 5 is held at a thermal catalyst holder 5b serving as a thermal catalyst holding means. This thermal catalyst holder 5b enables the distance from the substrate 10 to be adjusted. Further, the substrate 10 is placed on a suscepter 2 serving as a substrate holder. This suscepter 2 enables the distance from the thermal catalyst 5 to be adjusted.

Figure 19:
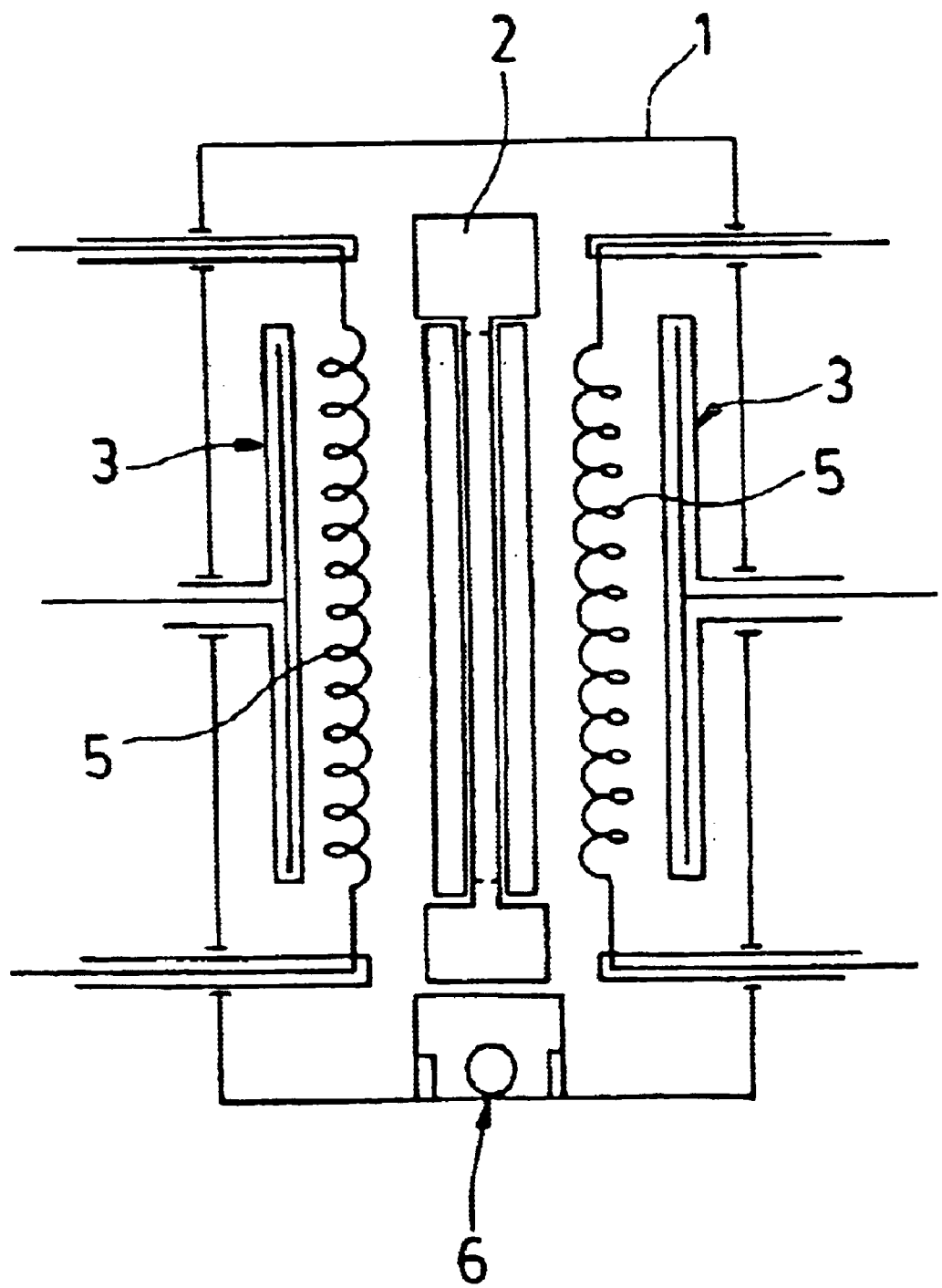
FIG. 19 is an explanatory view of another embodiment of the thin film forming apparatus according to the present invention.

Further, as shown in FIG. 19, a rail 6 is laid in the chamber 1. At this time, for example a wheel or a roller is attached to the suscepter 2 as a means for enabling movement on the rail 6. In this way, it becomes possible to enable the movement of the suscepter 2 on the rail 6. Accordingly, by placing the substrate 10 on the suscepter 2, it becomes possible to move the substrate 10 on the rail 6.

By employing such a configuration, even in a case where for example a thermal catalyst 5 having a long length is arranged in the chamber 1 and there is a difference in the thermal decomposition reaction and/or catalytic reaction on the thermal catalyst 5, if the rail 6 is laid along the thermal catalyst 5, the substrate 10 can be moved along the thermal catalyst 5, it becomes possible to uniformly form the thin film on the substrate 10, and the cost can be reduced by the improvement of the productivity.

It is also possible to arrange a plurality of thermal catalysts 5 in the chamber 1. At this time, it is also possible to form the thermal catalysts 5 by the same material or different materials or, as shown in FIG. 6 to FIG. 10, form the thermal catalysts 5 in the same shape or different shapes. In this way, by freely selecting and combining the materials or shapes of the thermal catalysts 5, it becomes possible to obtain a good catalytic reaction.

Figure 11:
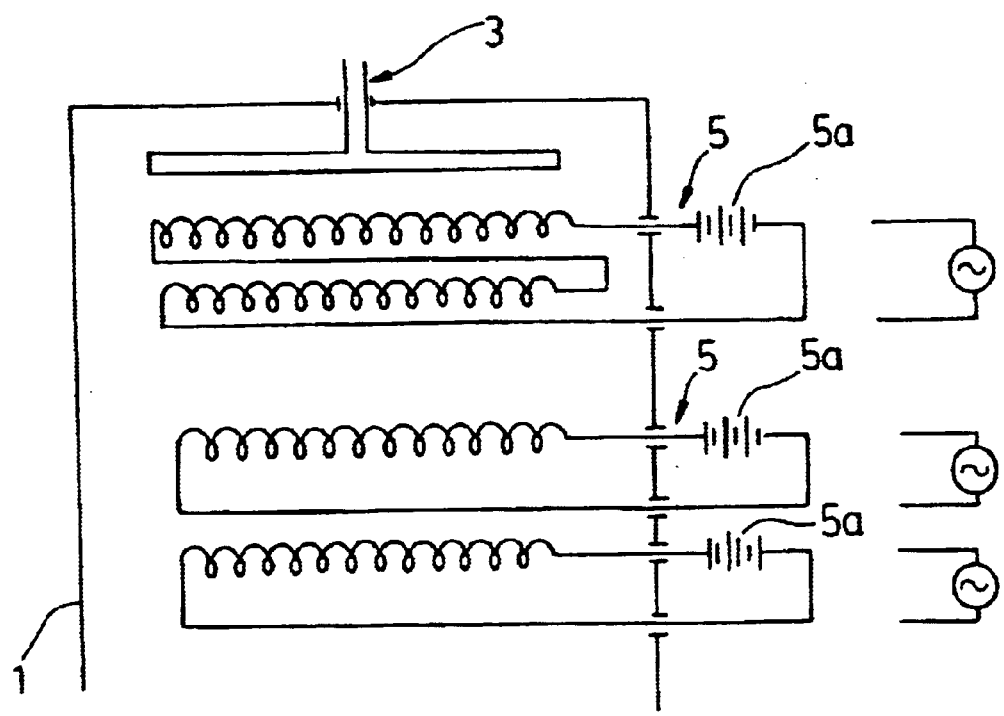
FIG. 11 is an explanatory view of another example of a thermal catalyst according to the present invention.

As shown in FIG. 11, when arranging a plurality of thermal catalysts 5 in the chamber 1, it is also possible to connect the thermal catalysts 5 to a power supply for supplying the same current or the same voltage or a power supply for supplying different currents and the same voltage. By adjusting the voltage and/or current of the power supply, temperature adjustment of the thermal catalyst 5 becomes possible, so it becomes possible to obtain a good catalytic reaction. Note that, as the power supply, use is made of a DC power supply or a AC power supply or a power supply wherein the AC is superposed on the DC.

As mentioned above, it is preferred if the thermal catalyst 5 is selected from at least one type of material selected from the group consisting of tungsten, tungsten containing thoria, platinum, molybdenum, palladium, tantalum, metal deposited ceramics, silicon, alumina, silicon carbide, refractory metals (tungsten, tantalum, tungsten containing thoria, molybdenum, titanium, etc.) coated with silicon carbide or ceramics or conductive nitride films, silicon nitride or oxide, conductive metal nitrides (tungsten nitride, titanium nitride, molybdenum nitride, tantalum nitride, etc.), boronitride (BN), and silicide or combinations of the same.

Also, the substrate 10 is selected from among semiconductor or insulative materials, but it is preferred if use is made of a material selected from among for example silicon, germanium, silicon germanium, silicon carbide, gallium arsenic, gallium aluminum arsenic, gallium phosphorus, indium phosphorus, zinc selenide, and cadmium sulfide as semiconductors and quartz glass, borosilicate glass, alumino silicate glass, and heat resistant resins as insulators.

Further, the thin film formed by the gas introduced by the gas introduction system 3 includes a gate insulating film. This gate insulating film is formed by introducing a material gas for forming either of silicon oxide film, silicon nitride film, silicon oxynitride film, aluminum nitride film, aluminum oxide film, tantalum oxide film, or composite films of the same from the gas introduction system 3.

Further, it is also possible to constitute the thin film forming apparatus S by a multi-chamber. In a thin film forming apparatus S constituted by a multi-chamber, the carrier gas containing hydrogen and a predetermined material gas are introduced into each chamber. In each chamber, a predetermined thin film is formed on the substrate 10. Namely, a thin film is formed on the surface of the substrate 10 whenever the substrate 10 enters into each chamber. The substrate 10 moves each chamber until the required thin film layer is obtained. The example of this multi-chamber will become clearer in the embodiments.

Next, an explanation will be made of a thin film forming apparatus S constituted so as to introduce a carrier gas containing hydrogen by another manner.

The thin film forming apparatus S in the present embodiment is also provided with, in the same way as the above embodiment, the chamber 1, substrate 10, thermal catalyst 5, and the heating means 5a for heating the thermal catalyst 5. The gas introduction system 3 for feeding the gas is connected in the chamber 1.

Note that, the thin film forming apparatus S of the present embodiment is configured provided with, other than the above constituent elements, a carrier gas controlling means for reducing or stopping the feed of the carrier gas in the middle of the formation of the thin film on the substrate 10.

In the present embodiment, as the carrier gas controlling means for reducing or stopping the feed of the carrier gas, there is for example a mass flow controller M. The mass flow controller M is arranged in the middle of a gas introduction path for guiding a carrier gas from a carrier gas feed source to the chamber 1 and controls the feed of the carrier gas. When the feed of the carrier gas is reduced or stopped by the mass flow controller M in the middle of the formation of the thin film on the substrate 10, the ratio of the material gas occupied in the chamber 1 becomes high, and thus the thin film is formed on the substrate 10 at a high speed.

The embodiment for reducing or stopping the feed of the carrier gas will be explained in further detail. First, when the carrier gas is introduced into the chamber 1 before for example the feed of the material gas, in the same way as the above embodiment, the surface of the substrate 10 is cleaned before the formation of the thin film.

The material gas for forming the thin film on the substrate 10 is introduced into the chamber 1. In the present embodiment, the carrier gas is reduced or discharged in the middle of the formation of the thin film on the substrate 10 by this material gas. On the other hand, the material gas is controlled in the timing of its introduction into the chamber 1 by the mass flow controller M serving as the material gas controlling means.

For example, the introduction of the material gas is controlled so that the second material gas is introduced after the elapse of a predetermined time after the first material gas is introduced from the gas introduction system 3 and the first thin film is formed on the substrate 10. In the present embodiment, the carrier gas containing hydrogen is constantly fed into the chamber 1. For example, the carrier gas containing hydrogen is reduced or stopped during the formation of the first thin film, but introduced into the chamber 1 again after the first material gas is discharged. Accordingly, in the chamber 1, part of the carrier gas becomes activated hydrogen H* due to the contact decomposition reaction by the thermal catalyst 5, reaches the surface of the substrate 10, and cleans the surface of the substrate 10.

Further, the mass flow controller M controls the system to introduce the first material gas from the gas introduction system 3 and, after the first thin film is formed on the substrate 10, to introduce the second material gas simultaneously with the discharge of the first material gas from the chamber 1. By continuously introducing the material gases in this way, the thin film layer can be obtained in a short time and it becomes possible to achieve an improvement of the work efficiency.

Furthermore, the mass flow controller M controls the system to introduce the first material gas from the gas introduction system 3 and, after the first thin film is formed on the substrate 10, when the first material gas is discharged, introduce the second material gas in the state where the first material gas remains in the chamber 1.

By gradually reducing the amount of introduction of the first material gas and gradually increasing the amount of introduction of the second material gas in this way, the first material gas and the second material gas will be mixed in the chamber 1 for a predetermined time while changing in occupation rate. In this way, it becomes possible to form so-called inclined interface films wherein the first thin film and the second thin film are not clearly delineated in border. By stacking the thin films by an inclined interface, the stress between films can be reduced, and it becomes possible to produce a semiconductor device having a semiconductor-insulator interface structure with a higher quality.

Note that, of course, it is also possible to configure the thin film forming apparatus S of the present embodiment so that the gas spraying portion of the gas introduction system 3, thermal catalyst 5, and substrate 10 are held in the chamber 1 by a moveable means and the distance among them can be adjusted in the same way as the above embodiment.

Further, it is also possible to arrange a plurality of thermal catalysts in the chamber 1, form the thermal catalysts 5 by the same material or different materials, or form the thermal catalysts 5 in the same shape or in different shapes. Alternatively, when a plurality of thermal catalysts 5 are arranged in the chamber 1, it is also possible to connect the thermal catalysts 5 to a power supply for supplying the same current or a power supply for supplying different currents.

Further, in the present embodiment as well, it is preferred if the thermal catalyst 5 is selected from at least one type of material selected from the group consisting of tungsten, tungsten containing thoria, platinum, molybdenum, palladium, tantalum, metal deposited ceramics, silicon, alumina, silicon carbide, refractory metals (tungsten, tantalum, tungsten containing thoria, molybdenum, titanium, etc.) coated with silicon carbide or ceramics or conductive nitride films, silicon nitride or oxide, conductive metal nitrides (tungsten nitride, titanium nitride, molybdenum nitride, tantalum nitride, etc.), boronitride (BN), and silicide.

Also, the substrate 10 is selected from among semiconductor or insulative materials, but it is preferred if use is made of a material selected from among for example silicon, germanium, silicon germanium, silicon carbide, gallium arsenic, gallium aluminum arsenic, gallium phosphorus, indium phosphorus, zinc selenide, and cadmium sulfide as semiconductors and quartz glass, borosilicate glass, alumino silicate glass, and heat resistant resins as insulators.

Further, the thin film formed by the gas introduced by the gas introduction system 3 includes a gate insulating film. This gate insulating film is formed by introducing a material gas for forming either of the silicon oxide film, silicon nitride film, silicon oxynitride film, aluminum nitride film, aluminum oxide film, tantalum oxide film, or composite films of the same from the gas introduction system 3.

According to the thin film forming apparatus mentioned above, a semiconductor thin film made of polycrystalline silicon, single crystalline silicon, amorphous silicon, microcrystalline silicon, silicon germanium, silicon carbide, compound semiconductor (gallium arsenic, gallium phosphorus, gallium nitride, etc.), diamond, or diamond-like carbon (DLC), an insulator thin film made of silicon oxide, silicon oxide containing impurities (phosphosilicate glass (PSG), borosilicate glass (BSG), borophosphosilicate glass (BPSG), etc.), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a metal thin film made of a refractory metal and conductive metal nitride thin film (tungsten, titanium, tantalum, molybdenum, tungsten nitride, titanium nitride, tantalum nitride, molybdenum nitride, etc.), silicide, copper, aluminum, aluminum-silicon, or aluminum-silicon-copper, a high dielectric rate thin film made of BST, or a ferroelectric thin film such as PZT, PLZT, SBT, and BIT is formed.

According to the thin film forming apparatus of the present invention, by appropriately using various material gases mentioned above, it is possible to produce a silicon semiconductor device, silicon semiconductor integrated circuit device, silicon-germanium semiconductor device, silicon-germanium semiconductor integrated circuit device, compound semiconductor device, compound semiconductor integrated circuit device, silicon carbide semiconductor device, silicon carbide semiconductor integrated circuit device, diamond semiconductor device, diamond semiconductor integrated circuit device, liquid crystal display device, electroluminescence display device, plasma display panel (PDP) device, light emission polymer display device, light emission diode display device, CCD area/linear sensor device, MOS sensor device, high dielectric/ferroelectric memory semiconductor device, high dielectric/ferroelectric memory semiconductor integrated circuit device, or solar battery. Below, embodiments of the present invention will be explained based on drawings. Note that the members, arrangement, etc. explained below do not limit the present invention and can be modified in various ways within the scope of the gist of the present invention.

Figure 1:
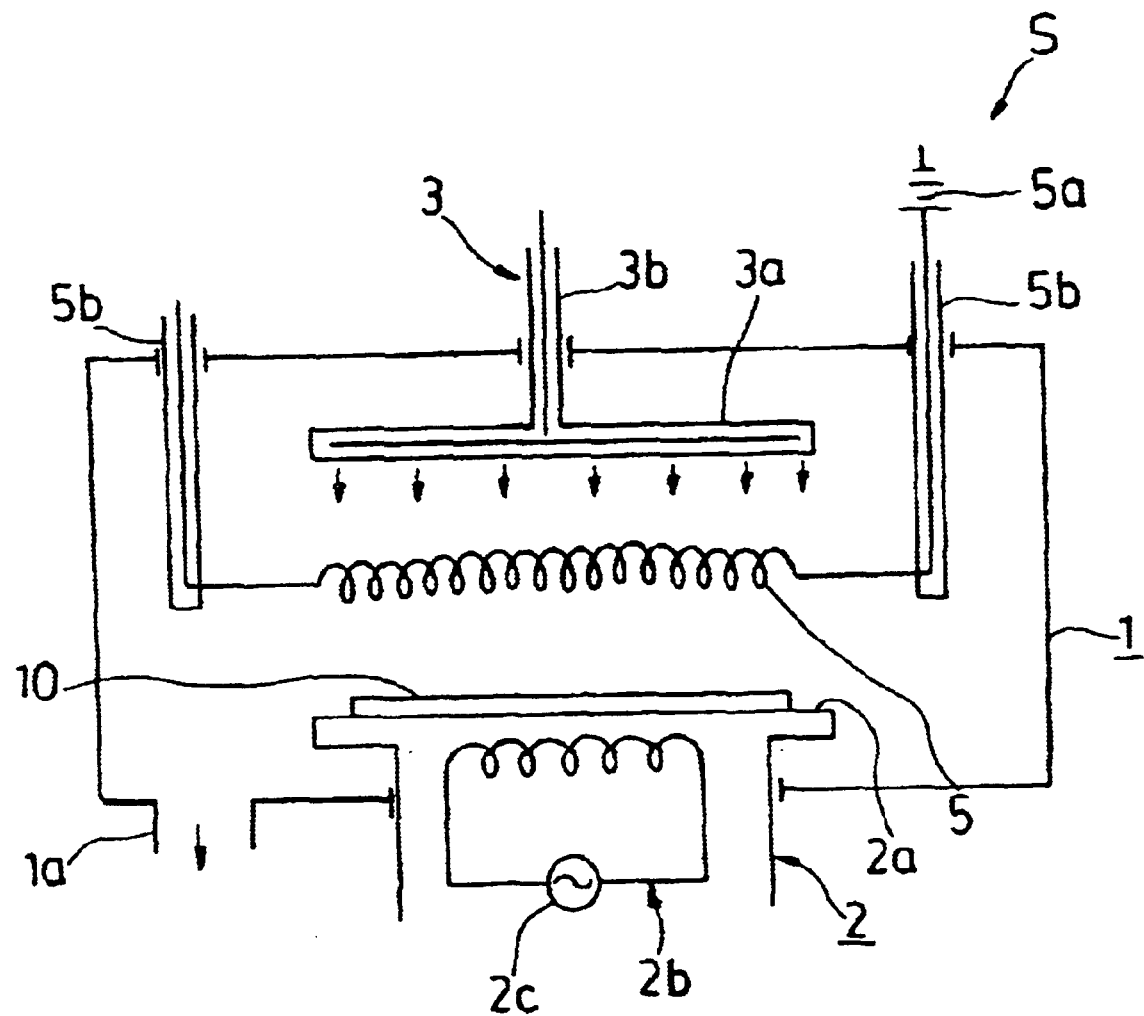
FIG. 1 is an explanatory view of an embodiment of a thin film forming apparatus according to the present invention.

FIG. 1 is a schematic view of an embodiment of the thin film forming apparatus S of the present invention.

The thin film forming apparatus S shown in FIG. 1 is a single-chamber catalytic CVD system and is provided with a chamber 1 as vacuum chamber, in which is arranged a substrate 10 for formation of a thin film on its surface, a suscepter 2 serving as the substrate holder for arranging the substrate 10 at a predetermined position in the chamber 1, a film formation use gas introduction system 3 for introducing a predetermined film formation use gas as the reactive gas into the chamber 1, a thermal catalyst 5 provided at a position in the chamber 1 facing the surface of the substrate 10 arranged at a predetermined position, and a heating means 5a for heating the thermal catalyst 5 to a predetermined temperature.

The chamber 1 of the present example is constituted by a sealed hollow vessel provided with an exhaust system 1a. The shape thereof is not in question. The exhaust system 1a of the present example is connected to a vacuum pump or the like such as a not illustrated turbo molecular pump by an exhaust use conduit of the chamber 1. By this exhaust system 1a, the interior of the chamber 1 can be lowered to a pressure of about $10^{-8}$ Pa.

As the material of the chamber, generally use is made of aluminum, but it is also possible to change the material of the chamber material to quartz glass in order to reduce oxygen, carbon, or heavy metal (Fe, Cr, Ni, etc.) contamination in the for example polycrystalline silicon or single crystalline silicon film formed.

Figure 2:
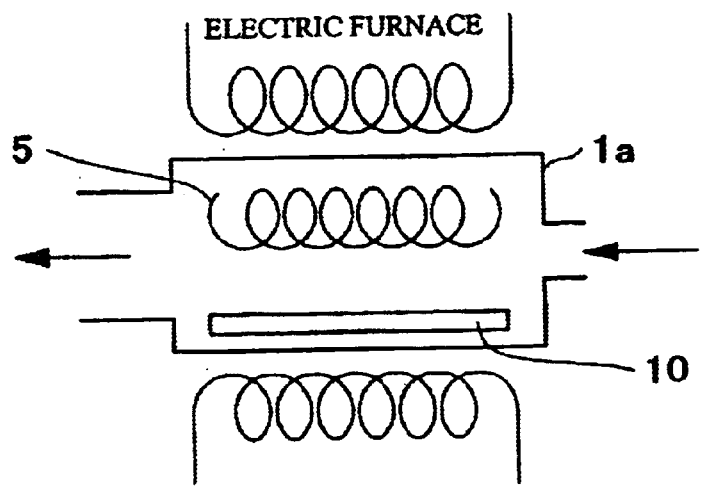
FIG. 2 is an explanatory view of another embodiment of the thin film forming apparatus according to the present invention.

At this time, it is also possible to form the entire chamber by quartz glass 1a as shown in FIG. 2 other than a hot wall type silicon epitaxy system.

Figure 3:
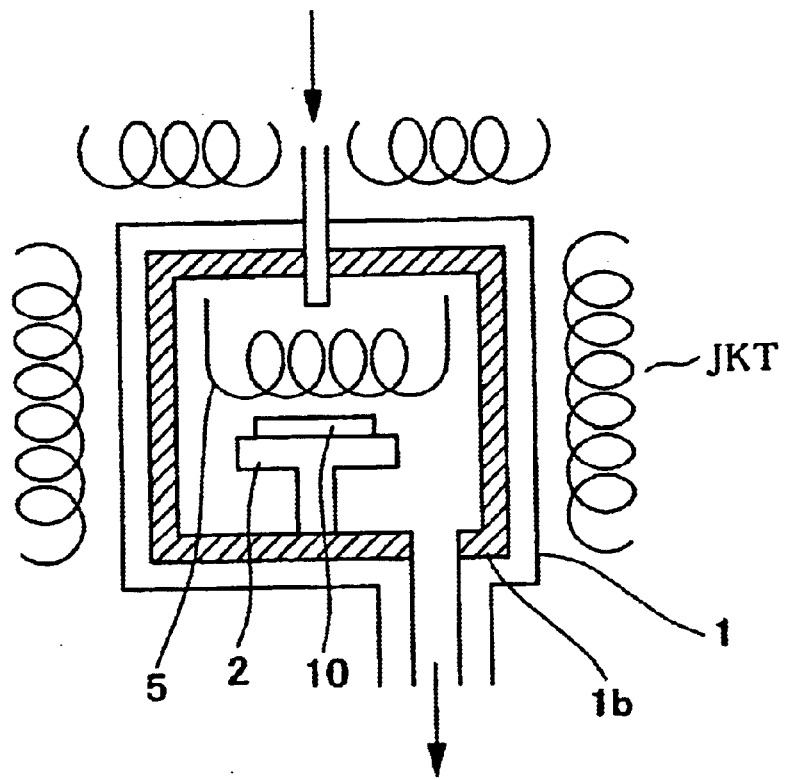
FIG. 3 is an explanatory view of still another embodiment of the thin film forming apparatus according to the present invention.

Further, as shown in FIG. 3, it is also possible to insert a quartz glass cylinder 1b to the inside of a chamber made of a metal such as aluminum or stainless steel. At this time, it is better if the chamber 1 made of metal is cooled by a water coolant jacket JKT.

The suscepter 2 of the present example is arranged at a lower position in the chamber 1 and is constituted so that an upper surface 2a is formed flat and the substrate 10 is placed on this upper surface 2a. Note that, in order to reliably hold the substrate 10 on the upper surface 2a of the suscepter 2, a configuration employing an elecrostatic attraction method for holding the substrate by inducing static electricity on the upper surface 2a of the suscepter 2 or employing a method of mechanically holding the edge of the substrate 10 by an L-shaped member may be employed.

The suscepter 2 contains a heater 2b for heating the substrate 10 to a predetermined temperature. As the heater 2b of the present example, for example, one using a resistance heat generation method is employed. A heater power supply 2c provided outside of the chamber 1 is connected to it. Further, a not illustrated measuring means for measuring the temperature of the substrate 10 and the suscepter 2 is provided in the chamber 1. The heater power supply 2c is provided with a not illustrated controller for controlling the heater supply power by a signal from a measuring means for monitoring the temperature of the substrate 10 or the suscepter 2.

Note that, in order to prevent mainly heavy metal (Fe, Cr, Ni, etc.) contamination from the suscepter 2, it is possible to make the suscepter portion by a material such as silicon carbide or graphite coated by silicon carbide, quartz glass containing the heater, etc.

Next, an explanation will be made of the gas introduction system 3 of the thin film forming apparatus.

The gas introduction system 3 is provided with a not illustrated conduit for guiding a predetermined gas required for the film formation into the chamber 1 and a valve and a flow rate controller provided in the conduit.

As shown in FIG. 1, the disk-like gas shower head 3a is arranged at a position in the chamber 1 facing the suscepter 2. The gas shower head 3a has a hollow internal portion and has a large number of gas spraying holes in a front surface. The front end of the conduit for introducing the gas is connected to the gas shower head 3a. It is constituted so as to spray the gas from the gas spraying holes toward the substrate 10.

The material gas for forming the film onto the substrate 10 is introduced by the gas introduction system 3, passes the vicinity of the thermal catalyst 5, and reaches the substrate 10. At this time, due to the thermal decomposition reaction and/or catalytic function of the thermal catalyst 5 heated to a predetermined temperature, a reaction such as decomposition occurs in the material gas, and thus a film is formed.

Note that the gas shower head 3a of the present example is fixed to the shower head holder 3b. This shower head holder 3b is formed to be moveable. Namely, in order to obtain the most effective catalytic reaction, it is constituted so as to be able to adjust the distance between the shower head 3a and the substrate 10.

Figure 4:
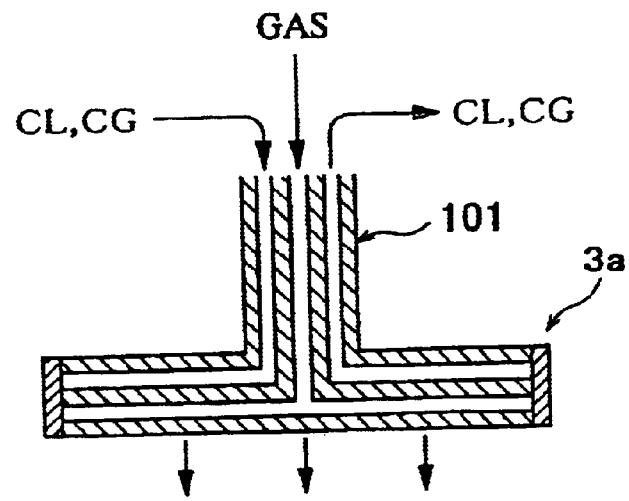
FIG. 4 is an explanatory view of another example of a shower head of the thin film forming apparatus according to the present invention.

Further, in order to prevent an insufficient decomposition reaction of the material gas from occurring in the shower head due to the radiant heat from the thermal catalyst, as shown in FIG. 4, it is also possible to provide a cooling means, for example, a cooling mechanism 101 using a cooling liquid (chlorofluorocarbon, oil, water, etc.) CL or a cooling gas (air, $N_2$, etc.)

Figure 5:
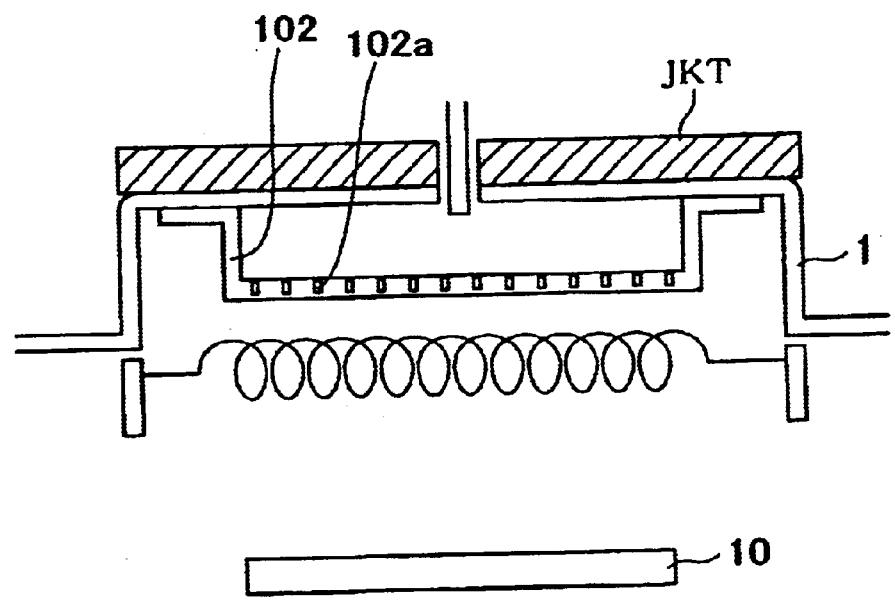
FIG. 5 is an explanatory view of another embodiment of the thin film forming apparatus according to the present invention.

Further, as shown in FIG. 5, it is also possible to provide a gas shower plate 102 between the thermal catalyst 5 and the gas spraying port. Several hundred or more fine holes 102a are formed in this gas shower plate 102. This plate uniformly sprays a gas mixture promoting the mixing of the carrier gas and the material gas therein to the thermal catalyst 5.

Further, by attaching this gas shower plate 102 via the chamber 1 to the water coolant jacket JKT, the radiant heat from the thermal catalyst 5 is dispersed and inadequate generation of depositions seeds due to the insufficient thermal decomposition reaction of the material gas inside the gas shower plate is prevented.

Due to this, high quality film formation becomes possible by the thermal decomposition and/or thermal catalytic action of the homogenous gas mixture to the thermal catalyst.

Further, it is also possible to arrange a shutter between the thermal catalyst 5 and the suscepter 2 (substrate 10) according to need.

Due to this, the contact from the thermal catalyst 5 at the time of temperature rise or the temperature drop of the thermal catalyst 5 is prevented, and, further, inadequate film formation due to the insufficient thermal distribution and/or thermal catalytic reaction of the material gas at that time can be prevented.

The thin film forming apparatus S of the present example is a single-chamber catalytic CVD system. A thermal catalyst 5 is arranged in the chamber 1. This thermal catalyst 5 is used for film formation by causing thermal decomposition and/or thermal catalytic reaction in the film formation gas. The thermal catalyst 5 of the present example is constituted by for example shaping a wire having a diameter of about 0.5 mm in the form of a coil as shown in FIG. 1. As the material of the wire of the present example, use is made of tungsten, palladium, tantalum, or molybdenum.

Further, the thermal catalyst 5 of the present example is fixed to a thermal catalyst holder 5b serving as the thermal catalyst holding means. The thermal catalyst holder 5b is formed by for example molybdenum. Further, the thermal catalyst 5 of the present example is connected to a heating means 5a outside of the chamber 1. The heating means 5a in the present example is the power supply for supplying power and heating for heating the thermal catalyst 5 by supplying power. This power supply for supplying power and heating is constituted by a direct current (DC) or alternate current (AC) or a power supply wherein the AC is superposed on the DC. It is also possible to supply electric power (not more than a plasma power supply starting voltage) obtained by superposing a low frequency AC (less than 1 MHz) or high frequency AC (1 to 100 MHz) on the DC to the thermal catalyst 5 for bias catalytic CVD. By such a heating means 5a, the thermal catalyst 5 is heated to 800° C. to 1700° C. (melting point or less).

The thermal catalyst holder 5b is constituted so as to be able to adjust the distance between the thermal catalyst 5 and the substrate 10 so that it can move in the chamber 1 and the most effective catalytic reaction can be obtained. The catalyst holder 5b is adjusted by a not illustrated drive mechanism. As the drive mechanism, it is possible to use various configurations, for example, using the motor as a drive source, attaching a pinion gear to an output shaft of the motor, arranging a rack gear at the catalyst holder 5b, meshing these gears, and thereby enabling adjustment by the output of the motor (servo motor or stepping motor) or adjusting the distance by a hydraulic device (also an air pressure device possible) connected to the thermal catalyst holder 5b. Note that, the further the distance of the thermal catalyst 5 from the substrate 10, the less the effect of the catalytic reaction, so preferably the thermal catalyst 5 is arranged in the vicinity of the substrate 10 at a position apart from the substrate 10 by for example 5 cm.

Figure 6:
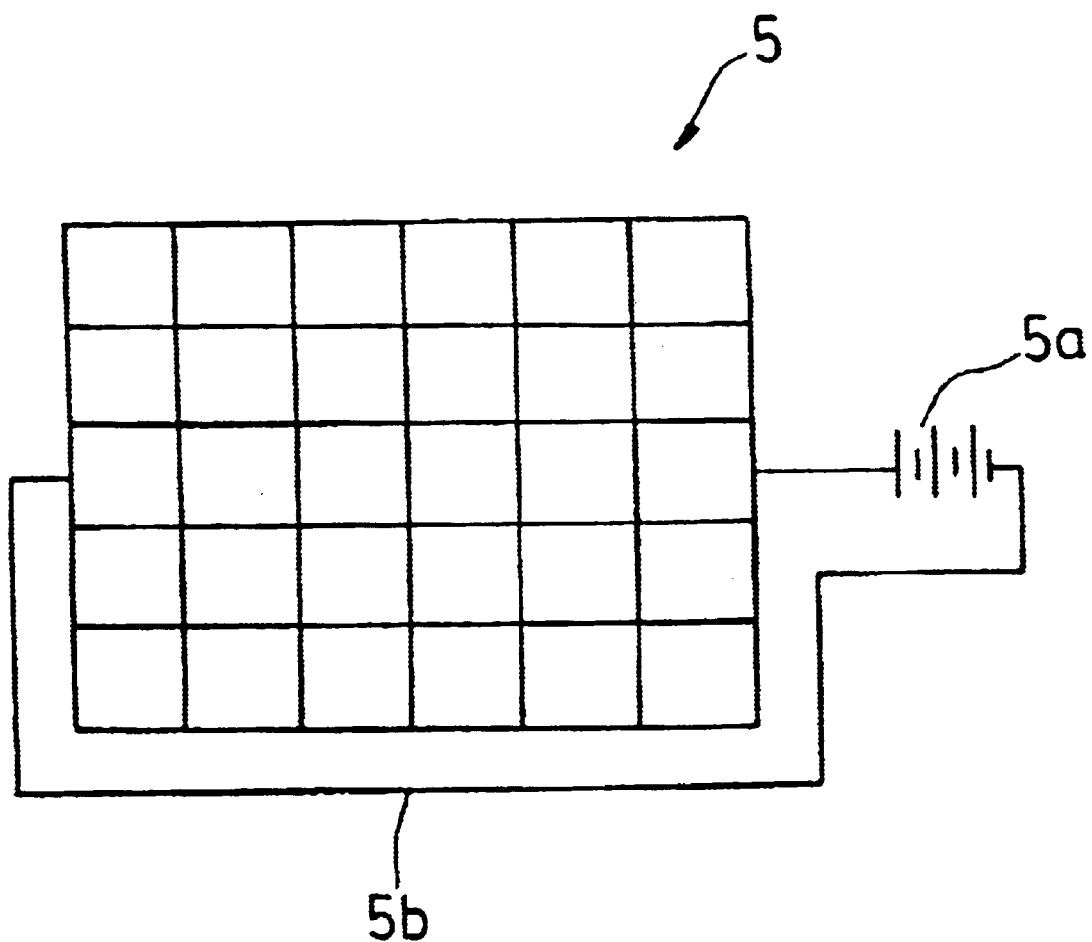
FIG. 6 is an explanatory view of another example of a thermal catalyst according to the present invention.

Note that the thermal catalyst 5 is not limited to one formed into a coil as described above. It is also possible to form it into a grid as shown in FIG. 6. The grid-like thermal catalyst is formed by for example assembling a plurality of wires having predetermined lengths in a grid and joining assembly portions of the wires by welding or the like. Further, it is also possible to form the thermal catalyst by winding a wire, coil, or the like of the thermal catalyst one or more times around a high heat resistant insulator such as ceramics, and quartz glass. Alternatively, it is also possible to press it to a flat metal plate to form the grid.

Further, the connection wire 5b to be connected to the power supply 5a is extended from substantially intermediate portions of opposing sides (sides located on left and right in the figure) to the thermal catalyst 5 shown in FIG. 6. Current is supplied from the power supply 5a via this connection wire 5b to heat the thermal catalyst 5 to a predetermined temperature.

The shape of the thermal catalyst 5 may be a shape as shown in for example FIG. 7 to FIG. 11 other than the coil-like or grid shape as described above.

Figure 7:
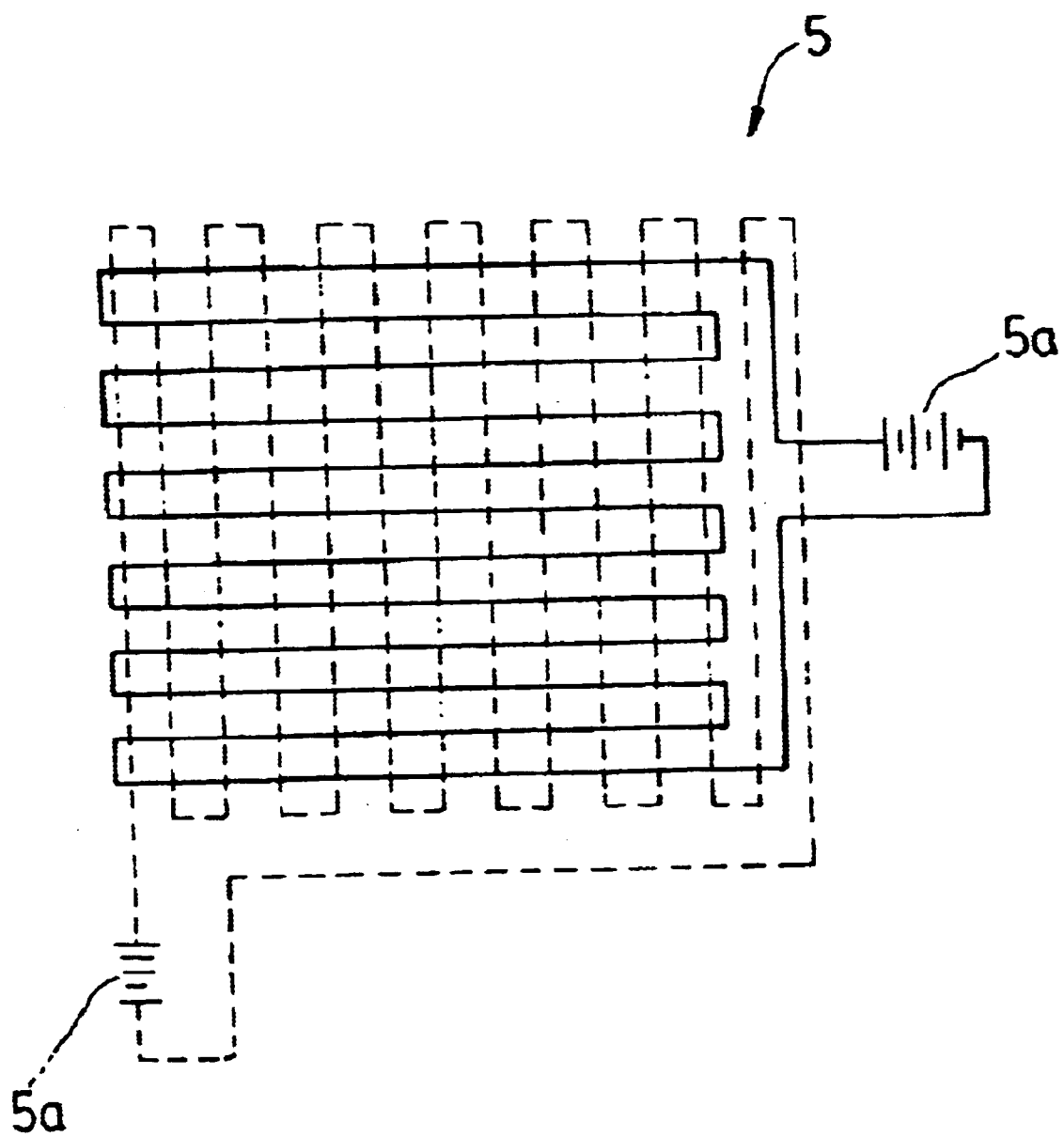
FIG. 7 is an explanatory view of another example of a thermal catalyst according to the present invention.

The thermal catalyst 5 shown in FIG. 7 is formed by a relatively long wire. Namely, a plurality of parallel rows are formed by bending the wire back and forth angularly. The thermal catalyst 5 formed in a plurality of rows in this way may be used alone or, as indicated by the broken lines in FIG. 7, two may be superposed so that the parallel rows perpendicularly intersect. Alternatively, it is possible to superpose them while changing the angle and further superpose a plurality of thermal catalysts, not limited to two.

Figure 8:
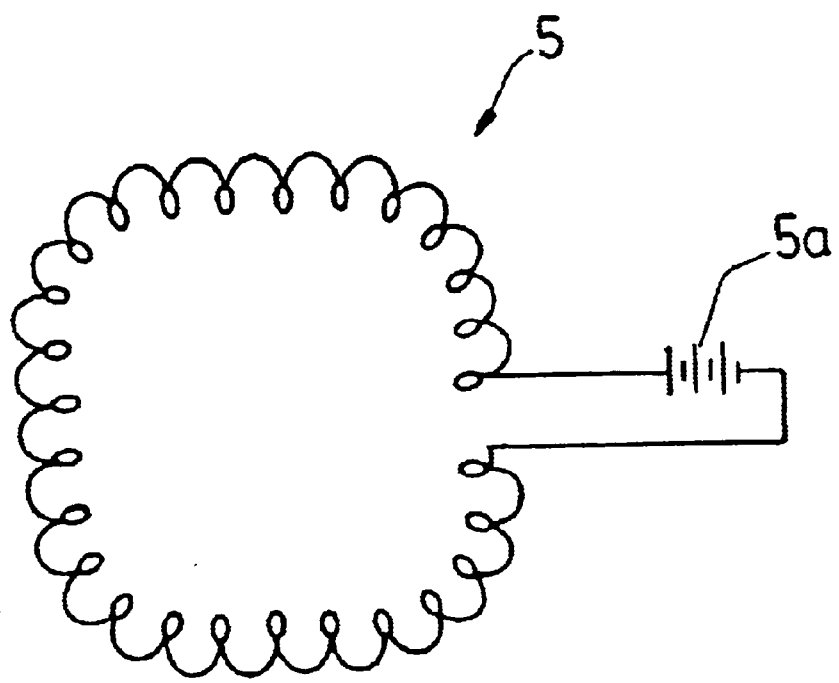
FIG. 8 is an explanatory view of another example of a thermal catalyst according to the present invention.
Figure 9:
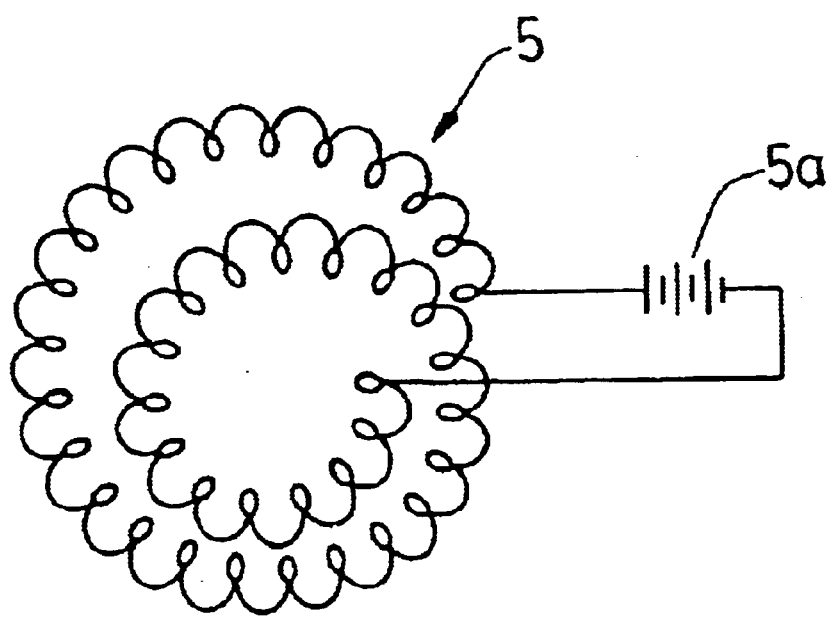
FIG. 9 is an explanatory view of another example of a thermal catalyst according to the present invention.

Further, the thermal catalyst 5 shown in FIG. 8 is formed by coiling a wire and winding this wire coil circularly by one turn. By coiling the thermal catalyst 5 in this way, a larger number of thermal catalysts can be arranged in a limited space. Further, as shown in FIG. 9, it is also possible to employ a configuration wherein the coil of the thermal catalyst 5 is wound doubly or more.

Figure 10:
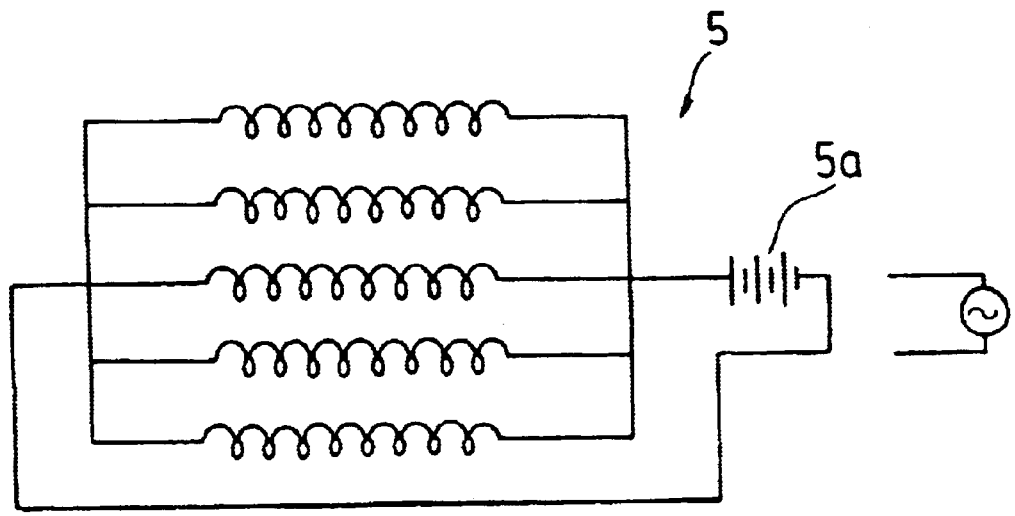
FIG. 10 is an explanatory view of another example of a thermal catalyst according to the present invention.

Alternatively, as shown in FIG. 10, the configuration wherein the wire is coiled and this wire coil is arranged in a plurality of rows in parallel may be employed. Alternatively, it is also possible to arrange them differently so as to perpendicularly intersect.

Furthermore, as shown in FIG. 7 and FIG. 11, it is also possible to arrange a plurality of thermal catalysts in the chamber 1. At this time, as shown in FIG. 7, it is possible to arrange the thermal catalysts 5 in an overlapping manner. Alternatively, as shown in FIG. 11, it is possible to arrange the thermal catalysts 5 in a plurality of stages in parallel. Further, it is also possible to arrange them differently so as to perpendicularly intersect other than the arrangement in a plurality of stages in parallel.

Note that, when arranging a plurality of thermal catalysts 5, it is possible to form the thermal catalysts 5 from the same material. For example, in FIG. 11, both of the thermal catalyst 5 located on the upper side and the thermal catalyst 5 located on the lower side are made by tungsten.

Alternatively, when arranging a plurality of thermal catalysts 5, it is possible to form the thermal catalysts 5 from different materials. For example, in FIG. 11, the configuration wherein the thermal catalyst 5 located on the upper side is made by tungsten and the thermal catalyst 5 located on the lower side is made by palladium is employed.

Further, when arranging a plurality of thermal catalysts 5, as shown in FIG. 11, a configuration wherein thermal catalysts 5 having different shapes are arranged can be employed other than the arrangement of the thermal catalysts 5 having the same shape. Namely, for example, the thermal catalyst 5 shown in FIG. 6 and the thermal catalyst 5 shown in FIG. 7 are arranged in combination.

Furthermore, as shown in FIG. 11, when arranging a plurality of thermal catalysts 5, it is also possible to employ a configuration wherein the thermal catalysts are connected to power supplies different from each other. The power supply in the present example is a DC power supply or an AC power supply or a power supply wherein the AC is superposed on the DC and is selected in accordance with the situation. By adjusting the voltage and/or current of the power supply, it becomes possible to adjust the temperature of the thermal catalysts.

By arranging a plurality of thermal catalysts 5 in the chamber 1 and freely selecting and combining the materials and the shapes of the thermal catalysts or the power supplies to be connected in this way, it becomes possible to obtain the best catalytic reaction.

Further, the thermal catalyst 5 is held at the thermal catalyst holder 5b as described above so that the distance from the substrate 10 can be adjusted by this thermal catalyst holder 5b. Accordingly, for example, it is also possible to employ a configuration wherein the catalyst is moved in a horizontal direction of FIG. 11, and thus a change can be imparted to the catalytic reaction.

In this way, it is possible to employ various configurations for the thermal catalysts 5, for example enable movement, use a plurality of thermal catalysts made of different materials together, and make the temperatures of the thermal catalysts different by using the same power supply or different power supplies.

The CVD for forming the thin film formation by the thin film forming apparatus S of the present example is referred to as catalytic CVD (CAT-CVD) and is disclosed in for example Japanese Unexamined Patent Publication No. 63-40314.

In catalytic CVD, a group of silicon atoms or atoms having a high energy is formed by the catalytic reaction or the thermal decomposition reaction by the thermal catalyst and deposited on the insulative substrate, therefore a silicon film can be deposited in a region having a considerably lower temperature than the depositable temperature in ordinary thermal CVD.

One of characteristic features of the present invention resides in the point of performing the surface treatment for reducing interfacial defects by introducing a carrier gas into a chamber in addition to performing the film formation utilizing the thermal catalyst 5 for catalytic CVD as described above.

This point will be explained in detail below. In catalytic CVD, when the type of the gas introduced is changed, a surface treatment for reforming or cleaning the surface of the substrate can be carried out. When the film is formed after treating the substrate surface in this way, it becomes possible to form a good quality film with extremely small interfacial defects.

In the present example, in order to reform and clean the surface of the substrate 10, a hydrogen-based gas serving as the carrier gas is introduced from the gas introduction system 3. As the hydrogen-based gas, there are hydrogen gas or a gas comprised of hydrogen gas plus argon, helium, or neodium as an inert gas, but in the present embodiment, the explanation will be made by taking the example using only hydrogen gas. Hydrogen gas is activated by a contact decomposition reaction with the thermal catalyst 5. The cleaning for eliminating a natural oxide film or moisture and contamination of the substrate surface can be carried out by this activated hydrogen H*. Further, by the activated hydrogen H*, it is possible to prevent oxidation of the thermal catalyst 5 and prevent deterioration of the thermal catalyst 5.

The largest characteristic point resides in fact that the film can be formed with a desired quality and speed according to the time and timing of introduction of the carrier gas and the material gas. Below, an explanation will be made of the method of introduction of the carrier gas and the material gas in the apparatus of FIG. 1 by referring to FIG. 12 to FIG. 17. Note that, in FIG. 12 to FIG. 17, an explanation will be made of the case where a silicon nitride film and a silicon oxide film for a protective film, a polycrystalline silicon film, and a silicon oxide film for a gate insulating film are formed on the substrate as an example.

Figure 12:
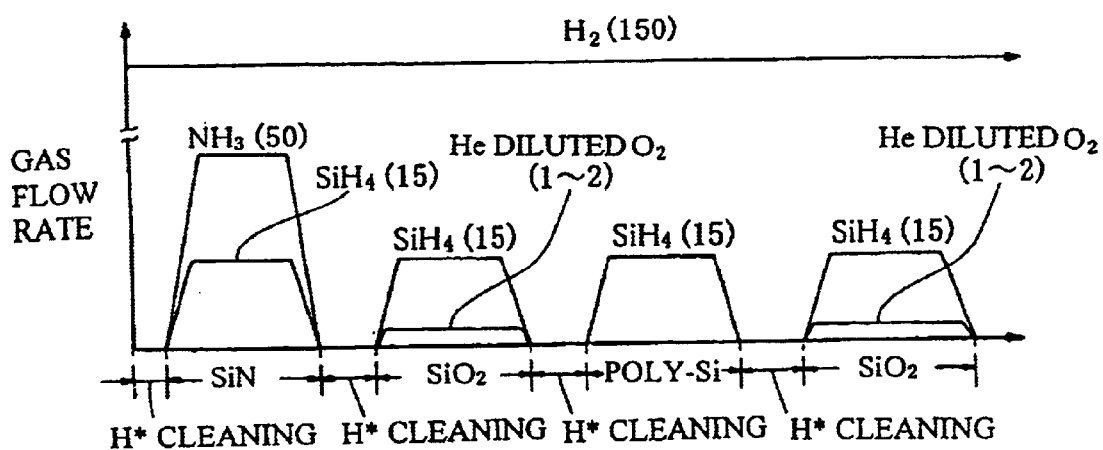
FIG. 12 is a graph showing a mode of introduction of gas to a chamber.
Figure 13:
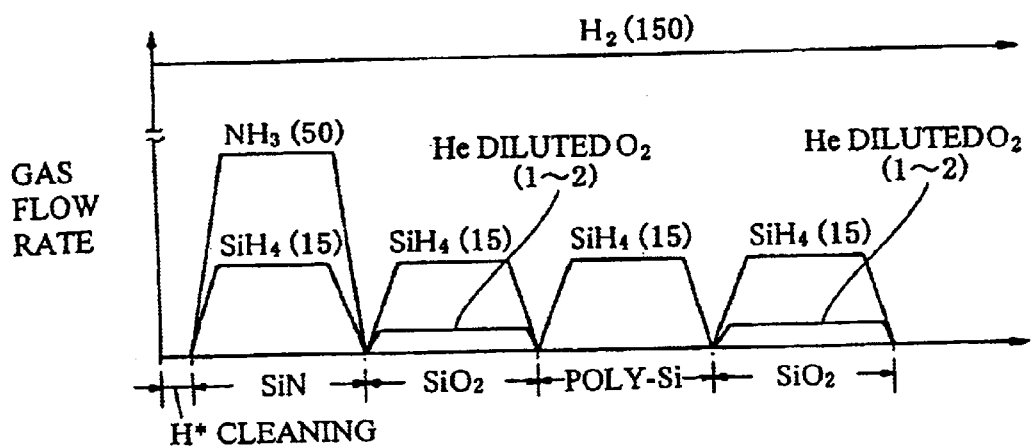
FIG. 13 is a graph showing another mode of introduction of gas to the chamber.
Figure 14:
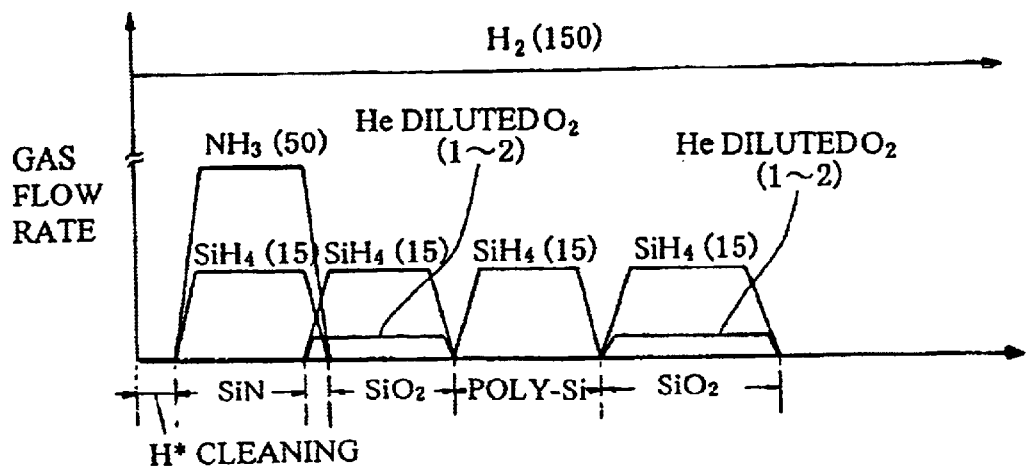
FIG. 14 is a graph showing another mode of introduction of gas to the chamber.

The modes of introduction of gas shown in FIG. 12 to FIG. 14 are predicated on continuously introducing a constant amount of hydrogen gas as the carrier gas into the chamber.

First, an explanation will be made of the mode of introduction of gas shown in FIG. 12. In FIG. 12, the case where the surface of the substrate 10 is cleaned every time before forming various films is shown. The mode of introduction of hydrogen gas as the carrier gas and the material gas in this case is shown.

First, the substrate 10 is transported into the chamber 1 through a not illustrated gate valve and placed on the suscepter 2. Then, the exhaust system 1a is operated to evacuate the interior of the chamber 1 to a predetermined pressure and, at the same time, the heater 2a built into the suscepter 2 is operated to heat the substrate 10 up to a predetermined temperature.

Then, the gas introduction system 3 is operated to first introduce 150 SCCM of hydrogen gas into the chamber 1.

Part of the introduced hydrogen gas becomes the activated hydrogen H* by the contact decomposition reaction by the thermal catalyst 5, reaches the substrate surface, and cleans the surface of the substrate 10.

As described above, in the state where hydrogen gas is fed into the chamber 1, the gas introduction system 3 is operated to introduce the first material gas (50 SCCM of ammonia and 15 SCCM of monosilane) into the chamber 1. The introduced first material gas reaches the substrate 10 while passing through the vicinity of the thermal catalyst 5, whereby a silicon nitride film is fabricated on the substrate surface as the first thin film.

Thereafter, the introduction of the first material gas is stopped, and the first material gas is discharged from the interior of the chamber 1. In the present example, after the discharge of the first material gas, the second material gas is introduced after the elapse of a predetermined time.

At this time, hydrogen gas is being introduced into the chamber 1. Accordingly, the activated hydrogen H* eliminates molecular deposition of water and oxygen of the surface of the substrate with the first thin film formed thereon so the interface level can be reduced.

As described above, after the substrate surface with the first thin film formed thereon is cleaned by the activated hydrogen H*, the second material gas (15 SCCM of monosilane and 1 to 2 SCCM of helium diluted oxygen (He diluted $O_2$)) is introduced. The introduced second material gas reaches the substrate 10 while passing through the vicinity of the thermal catalyst 5, whereby a silicon oxide film is fabricated on the substrate surface as the second thin film by catalytic CVD.

Thereafter, the introduction of the second material gas is stopped, and the second material gas is exhausted from the interior of the treatment vessel 1. After the exhaust of the second material gas, the substrate surface with the second thin film formed thereon is cleaned by the activated hydrogen H* by the constantly introduced hydrogen gas, then a third material gas (15 SCCM of monosilane) is introduced. The introduced third material gas reaches the substrate 10 while passing through the vicinity of the thermal catalyst 5, whereby a polycrystalline silicon film is fabricated on the substrate surface as a third thin film by catalytic CVD.

In the same way as the above step, the introduction of the third material gas is stopped thereafter and the third material gas is discharged from the interior of the chamber 1. After the exhaust of the third material gas, the substrate surface with the third thin film formed thereon is cleaned by the activated hydrogen H* by the subsequently introduced hydrogen gas, then a fourth material gas (15 SCCM of monosilane and 1 to 2 SCCM of helium diluted oxygen (He diluted $O_2$)) is introduced. The introduced fourth material gas reaches the substrate 10 while passing through the vicinity of the thermal catalyst 5, whereby a silicon oxide film is fabricated on the substrate surface as a fourth thin film by catalytic CVD.

In this way, according to the method of introduction of the gas shown in FIG. 12, after various films are formed, the surface of the substrate 10 is cleaned by the activated hydrogen H* for a predetermined time, therefore it becomes possible to form a high quality thin film on the substrate. Further, hydrogen gas is constantly introduced into the chamber 1, so deterioration of the thermal catalyst 5 by oxidation can be prevented.

Next, as shown in FIG. 13, an explanation will be made of a case where the substrate surface is cleaned for a predetermined time at first and then various material gases are continuously introduced to form films.

First, the substrate 10 is transported into the chamber 1 through a not illustrated gate valve and placed on the suscepter 2. Then, the exhaust system 1a is operated to evacuate the interior of the chamber 1 to a predetermined pressure and, at the same time, the heater 2a built in the suscepter 2 is operated to heat the substrate 10 up to a predetermined temperature.

Then, the gas introduction system 3 is operated to first introduce 150 SCCM of hydrogen gas into the chamber 1. Part in the introduced hydrogen gas becomes activated hydrogen H* by the contact decomposition reaction by the thermal catalyst 5, reaches the substrate surface, and cleans the surface of the substrate 10.

As described above, in the state where hydrogen gas is fed into the chamber 1, the gas introduction system 3 is operated to introduce the first material gas (50 SCCM of ammonia and 15 SCCM of monosilane) into the chamber 1. The introduced film formation gas reaches the substrate 10 while passing through the vicinity of the thermal catalyst 5, whereby a first silicon nitride film is fabricated on the surface of the substrate 10 by catalytic CVD.

Thereafter, the introduction of the first material gas is stopped, and the first material gas is discharged from the interior of the chamber 1. In the present example, after the discharge of the first material gas, the second material gas (15 SCCM of monosilane and 1 to 2 SCCM of helium diluted oxygen (He diluted $O_2$)) is introduced without a break. After the formation of the second thin film and the exhaust of the second material gas, similarly, the third material gas is introduced without a break, then the fourth material gas is introduced. By continuously forming the films in this way, it is possible to shift to the film formation steps more quickly and form the films.

Note that, also at this time, hydrogen gas is being introduced into the chamber 1. For this reason, deterioration of the thermal catalyst due to oxidation can be prevented.

Note that, in the method of introduction of gas, it becomes possible to reliably obtain the high quality polycrystalline silicon film by cleaning the surface by the activated hydrogen H* before at least the formation of the polycrystalline silicon film.

Further, an explanation will be made of the mode of introduction of hydrogen gas and the material gas in the case when inclined interface films are formed as shown in FIG. 14.

First, the substrate 10 is transported into the chamber 1 through the not illustrated gate valve and placed on the suscepter 2. Then, the exhaust system 1a is operated to evacuate the interior of the chamber 1 to a predetermined pressure and, at the same time, the heater 2a built in the suscepter 2 is operated to heat the substrate 10 up to a predetermined temperature.

Then, the gas introduction system 3 is operated to first introduce hydrogen gas into the chamber 1. The introduced hydrogen gas becomes the activated hydrogen H* by the contact decomposition reaction by the thermal catalyst 5, reaches the substrate surface, and cleans the surface of the substrate 10.

As described above, in the state where hydrogen gas is fed into the chamber 1, the gas introduction system 3 is operated to introduce the first material gas (50 SCCM of ammonia and 15 SCCM of monosilane) into the chamber 1. The introduced film formation use gas reaches the substrate 10 while passing through the vicinity of the thermal catalyst 5, whereby a first silicon nitride film is fabricated on the substrate surface by catalytic CVD.

Thereafter, the introduction of the first material gas is stopped, and the first material gas is discharged from the interior of the chamber 1. In the present example, before the first material gas is completely discharged, the second material gas (15 SCCM of monosilane and 1 to 2 SCCM of helium diluted oxygen (He diluted $O_2$)) is introduced. In this way, by gradually reducing the amount of introduction of the first material gas and, at the same time, gradually increasing the amount of introduction of the second material gas, the first material gas and the second material gas will be mixed in the chamber 1 for a predetermined time while changing in occupation rate. In this way, so-called inclined interface films wherein the first thin film and the second thin film are not clearly delineated in border can be obtained. Similarly, the third material gas and the fourth material gas are introduced, and the film of the inclined interface is formed. By stacking the thin films by the inclined interface, the stress between films can be reduced, and it becomes possible to produce a semiconductor device having a high quality insulatorsemi-conductor interface structure. Note, the MOSTFT characteristic becomes poor, so the silicon oxide film and the silicon film (polycrystalline silicon, semi-crystalline silicon, amorphous silicon, microcrystalline silicon, etc.) of the gate insulating film are not joined by an inclined interface.

Note that, also at this time, hydrogen gas is being introduced into the chamber 1. For this reason, deterioration of the thermal catalyst due to oxidation can be prevented.

As described above, since activated hydrogen H* is constantly generated and the surface of the substrate 10 is constantly cleaned, a transformation layer of the amorphous silicon is not formed at the interface of the silicon oxide film and the polycrystalline silicon film, so it becomes possible to form a high quality thin film layer.

Further, since the surface of the substrate 10 is constantly cleaned by the activated hydrogen H* before the film formation according to need and the surface is reformed, molecular deposition of water and oxygen at the surface of the substrate 10 is eliminated, the interface level is reduced, the stress between adjoining films is low, and thus it becomes possible to achieve high quality film formation (silicon nitride film, silicon oxide film, polycrystalline silicon film, etc.). Particularly, when performing treatment exposing the film to activated hydrogen H* before continuously forming the gate insulating film and the silicon film, it becomes possible to produce a high quality semiconductor device having a semiconductor-insulator interface structure with a low interface level density by a hydrogen annealing effect.

Figure 15:
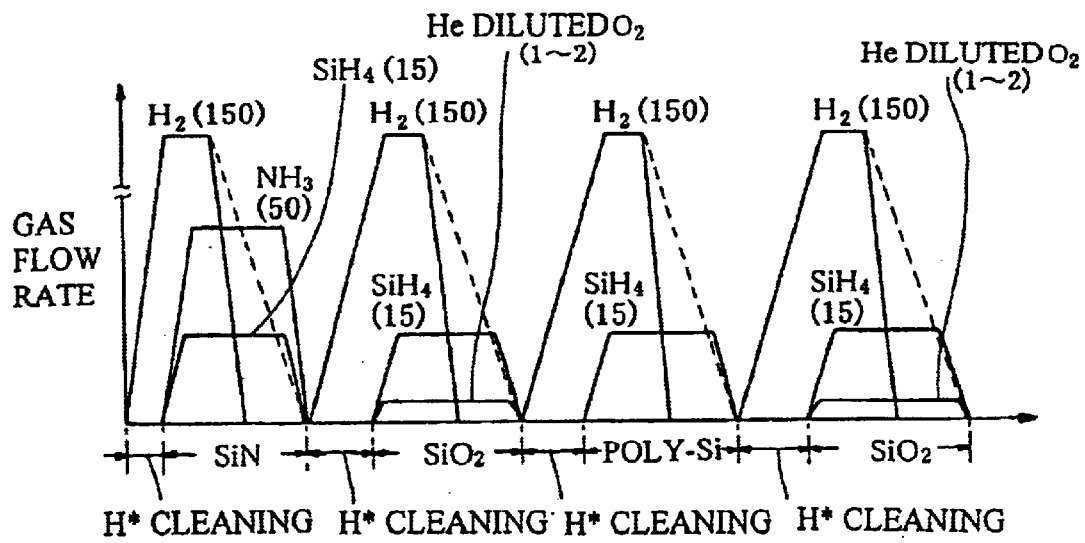
FIG. 15 is a graph showing another mode of introduction of gas to the chamber.
Figure 16:
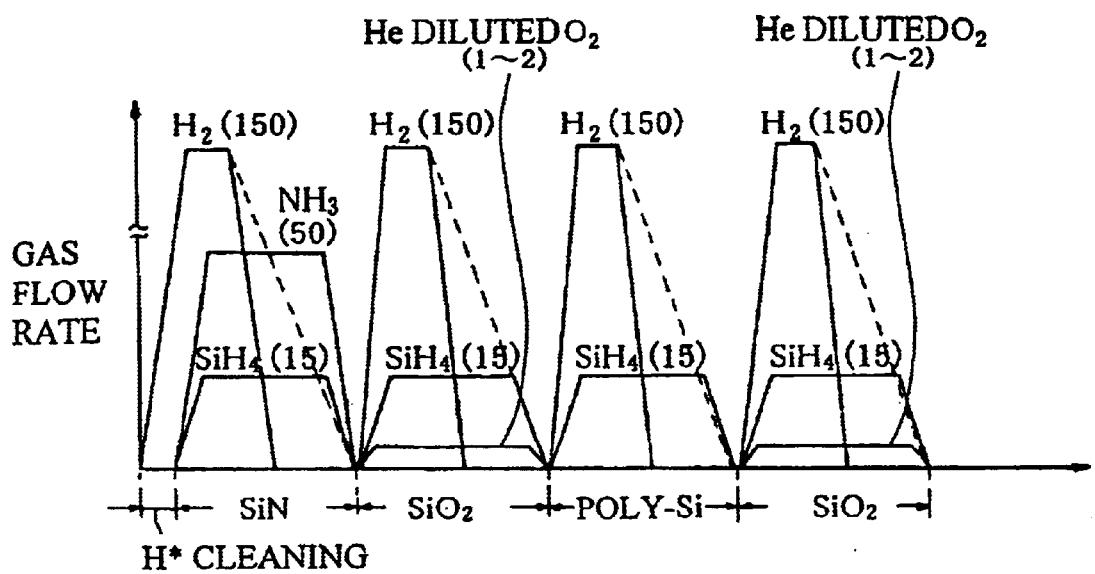
FIG. 16 is a graph showing another mode of introduction of gas to the chamber.
Figure 17:
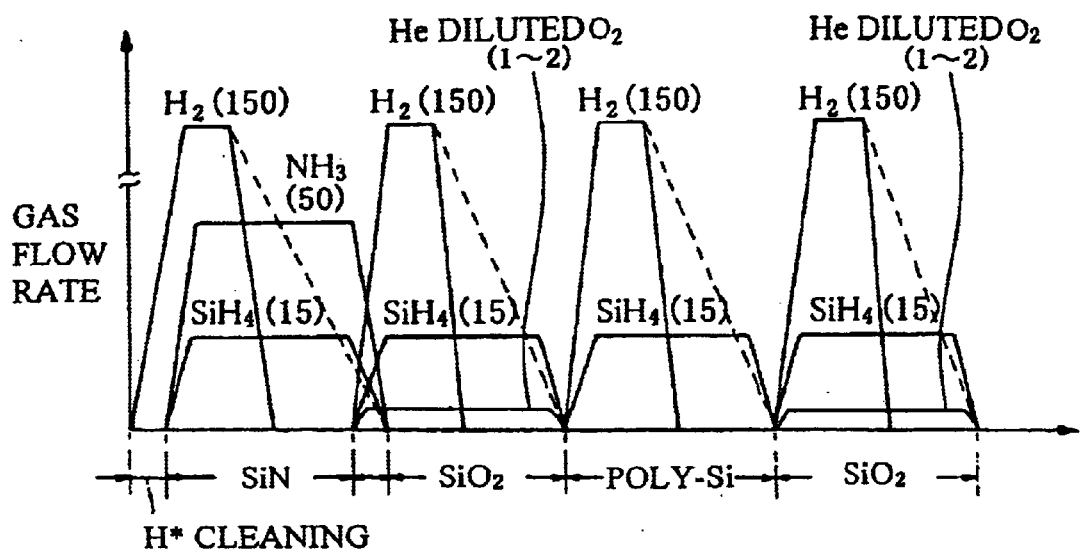
FIG. 17 is a graph showing another mode of introduction of gas to the chamber.

Next, an explanation will be made of the modes of introduction of gas shown in FIG. 15 to FIG. 17. The modes of introduction of gas shown in FIG. 15 to FIG. 17 are for forming the coating film at a high speed by stopping or reducing hydrogen gas serving as the carrier gas in the middle.

First, an explanation will be made of the mode of introduction of gas shown in FIG. 15. In FIG. 15, a case where the surface of the substrate 10 is cleaned every time before forming the various films is shown. The mode of introduction of hydrogen gas serving as the carrier gas and the material gas in this case is shown.

First, the substrate 10 is transported into the chamber 1 through the not illustrated gate valve and placed on the suscepter 2. Then, the exhaust system 1a is operated to evacuate the interior of the chamber 1 to a predetermined pressure and, at the same time, the heater 2a built in the suscepter 2 is operated to heat the substrate 10 up to a predetermined temperature.

Then, the gas introduction system 3 is operated to first introduce 150 SCCM of hydrogen gas into the chamber 1. Part of the introduced hydrogen gas becomes the activated hydrogen H* by the contact decomposition reaction by the thermal catalyst 5, reaches the substrate surface, and cleans the surface of the substrate 10.

As described above, in the state where hydrogen gas is fed into the chamber 1, the gas introduction system 3 is operated to introduce the first material gas (50 SCCM of ammonia and 15 SCCM of monosilane) into the chamber 1. The introduced first material gas reaches the substrate 10 while passing through the vicinity of the thermal catalyst 5, whereby the formation of the silicon nitride film is started on the substrate surface as the first thin film.

Thereafter, the mass flow controller M is controlled to reduce or stop the feed of hydrogen gas. By this, in the chamber 1, the ratio of the first material gas becomes high, so the rate of formation of the thin film on the substrate 10 becomes high. After the formation of the first thin film, the introduction of the first material gas is stopped, and the first material gas is discharged from the interior of the chamber 1.

When the first material gas is discharged from the chamber 1, 150 SCCM of hydrogen gas serving as the carrier gas is introduced again, molecular deposition of water and oxygen on the surface of the substrate 10 with the first thin film formed thereon is eliminated by the activated hydrogen H*, and the interface level is reduced only hydrogen gas is introduced for a predetermined time, then the second material gas (15 SCCM of monosilane and 1 to 2 SCCM of helium diluted oxygen (He diluted $O_2$)) is introduced.

The second material gas reaches the substrate 10 while passing through the vicinity of the thermal catalyst 5, whereby the formation of the silicon oxide film is started on the substrate surface as the second thin film.

Thereafter, the mass flow controller M is controlled to reduce or stop the feed of hydrogen gas. Due to this, the ratio of the second material gas becomes high in the chamber 1, therefore the rate of formation of the thin film on the substrate 10 becomes high. When the formation of the second thin film is terminated, the introduction of the second material gas is stopped, and the second material gas is discharged from the interior of the chamber 1.

When the second material gas is discharged from the chamber 1, 150 SCCM of hydrogen gas serving as the carrier gas is introduced again, molecular deposition of water and oxygen at the surface of the substrate 10 with the second thin film formed thereon is eliminated, and the interface level is reduced. Only hydrogen gas is introduced for a predetermined time, then the third material gas (15 SCCM of monosilane) is introduced.

The third material gas reaches the substrate 10 while passing through the vicinity of the thermal catalyst 5, whereby the formation of the polycrystalline silicon film is started at the surface of the substrate as the third thin film.

Thereafter, the mass flow controller M is controlled to reduce or stop the feed of hydrogen gas. By this, the ratio of the third material gas becomes high in the chamber 1, therefore the rate of formation of the thin film on the substrate 10 becomes high. When the formation of the third thin film is terminated, the introduction of the third material gas is stopped, and the third material gas is discharged from the interior of the chamber 1.

When the third material gas is discharged from the chamber 1, 150 SCCM of hydrogen gas serving as the carrier gas is introduced again, molecular deposition of water and oxygen at the substrate surface with the third thin film formed thereon is eliminated, and the interface level is reduced. Only hydrogen gas is introduced for a predetermined time, then the fourth material gas (15 SCCM of monosilane and 1 to 2 SCCM of helium diluted oxygen (He diluted $O_2$)) is introduced.

The fourth material gas reaches the substrate 10 while passing through the vicinity of the thermal catalyst 5, whereby the formation of the silicon oxide film is started at the surface of the substrate as the fourth thin film.

Thereafter, the mass flow controller M is controlled to reduce or stop the feed of hydrogen gas. By this, the ratio of the fourth material gas becomes high in the chamber 1, therefore the rate of formation of the thin film on the substrate 10 becomes high. When the formation of the fourth thin film is terminated, the introduction of the fourth material gas is stopped, and the fourth material gas is discharged from the interior of the chamber 1.

In this way, according to the method of introduction of gas shown in FIG. 15, after various films are formed, the surface of the substrate 10 is cleaned by the activated hydrogen H* for a predetermined time, therefore it becomes possible to form a high quality thin film on the substrate 10. Further, in each of the thin film forming steps, the introduction of hydrogen gas is reduced or stopped and the material gas concentration is made high, therefore the thin film can be formed on the substrate 10 at a high speed, so it becomes possible to improve the workability.

Next, as shown in FIG. 16, an explanation will be made of a case where the surface of the substrate 10 is cleaned for a predetermined time at first and then various material gases are continuously introduced and the films are formed.

First, the substrate 10 is transported into the chamber 1 through the not illustrated gate valve and placed on the suscepter 2. Then, the exhaust system 1a is operated to evacuate the interior of the chamber 1 to a predetermined pressure and, at the same time, the heater 2a built in the suscepter 2 is operated to heat the substrate 10 up to a predetermined temperature.

Then, the gas introduction system 3 is operated to first introduce 150 SCCM of hydrogen gas into the chamber 1. The introduced hydrogen gas becomes the activated hydrogen H* by the contact decomposition reaction by the thermal catalyst 5, reaches the surface of the substrate 10, and cleans the surface of the substrate 10.

As described above, in the state where hydrogen gas is fed into the chamber 1, the gas introduction system 3 is operated to first introduce the first material gas (50 SCCM of ammonia and 15 SCCM of monosilane) into the chamber 1. The introduced first material gas reaches the substrate 10 while passing through the vicinity of the thermal catalyst 5, whereby the formation of the silicon nitride film is started on the substrate surface as the first thin film.

Thereafter, the mass flow controller M is controlled to reduce or stop the feed of hydrogen gas. By this, in the chamber 1, the ratio of the first material gas becomes high, so the rate of formation of the thin film on the substrate 10 becomes high. After the formation of the first thin film, the introduction of the first material gas is stopped, and the first material gas is discharged from the interior of the chamber 1.

In the present example, after the discharge of the first material gas, without a break, hydrogen gas and the second material gas (15 SCCM of monosilane and 1 to 2 SCCM of helium diluted oxygen (He diluted $O_2$)) are introduced.

Similarly, after the discharge of the second material gas, without a break, the third material gas is introduced and then the fourth material gas is introduced. By continuously forming films in this way, it is possible to shift to each film formation step more quickly to form the films.

Note that, by cleaning the surface by the activated hydrogen H* before at least the formation of the polycrystalline silicon film in the gas introduction method, it becomes possible to reliably obtain a high quality polycrystalline silicon film.

Further, as shown in FIG. 17, an explanation will be made of the mode of introduction of hydrogen gas and the material gas when forming inclined interface films.

First, the substrate 10 is transported into the chamber 1 through the not illustrated gate valve and placed on the suscepter 2. Then, the exhaust system 1a is operated to evacuate the interior of the chamber 1 to a predetermined pressure and, at the same time, the heater 2a built in the suscepter 2 is operated to heat the substrate 10 up to a predetermined temperature.

Then, the gas introduction system 3 is operated to first introduce 150 SCCM of hydrogen gas into the chamber 1. The introduced hydrogen gas becomes activated hydrogen H* by the contact decomposition reaction by the thermal catalyst 5, reaches the surface of the substrate 10, and cleans the surface of the substrate 10.

As described above, in the state where hydrogen gas is fed into the chamber 1, the gas introduction system 3 is operated to first introduce the first material gas (50 SCCM of ammonia and 15 SCCM of monosilane) into the chamber 1. The introduced first material gas reaches the substrate 10 while passing through the vicinity of the thermal catalyst 5, whereby the formation of the silicon nitride film is started on the surface of the substrate 10 as the first thin film.

Thereafter, the mass flow controller M is controlled to reduce or stop the feed of hydrogen gas. By this, the ratio of the first material gas in the chamber 1 becomes high, so the rate of formation of the thin film on the substrate 10 becomes high. After the formation of the first thin film, the introduction of the first material gas is stopped, and the first material gas is discharged from the interior of the chamber 1.

In the present example, before the first material gas is completely discharged, the second material gas (15 SCCM of monosilane and 1 to 2 SCCM of helium diluted oxygen (He diluted $O_2$)) is introduced. In this way, by gradually reducing the amount of introduction of the first material gas and, at the same time, gradually increasing the amount of introduction of the second material gas, the first material gas and the second material gas will be mixed in the chamber 1 for a predetermined time while changing in occupation rate. In this way, so-called inclined interface films wherein the first thin film and the second thin film are not clearly delineated in border can be obtained. Similarly, the third material gas and the fourth material gas are introduced to form the film of the inclined interface. By stacking the thin films by the inclined interface, the stress between films can be reduced, and it becomes possible to produce a semiconductor device having a high quality semiconductor-insulator interface structure.

Note that, in the above gas introduction methods, by cleaning the surface by the activated hydrogen H* at least before the formation of the polycrystalline silicon film, it becomes possible to reliably obtain a high quality polycrystalline silicon film.

As described above, when forming a thin film on the substrate 10, the cleaning is carried out by the activated hydrogen H* at least before the film formation, the material gas is fed to start the film formation, hydrogen carrier gas is reduced or cut after achieving a predetermined film thickness, and the insulating film or the semiconductor film is formed at a high speed, therefore the productivity is high and it becomes possible to realize a reduction of cost.

Further, the surface is reformed by constantly cleaning the surface of the substrate 10 by the activated hydrogen H* before the film formation, therefore molecular deposition of water and oxygen at the substrate surface is eliminated, the interface level is reduced, and it becomes possible to obtain film formation wherein the stress between each adjoining films is low and the quality is high (silicon nitride film, silicon oxide film, polycrystalline silicon film, etc.). Particularly, when continuously forming the gate insulating film and the silicon film, when the treatment for exposing the film to activated hydrogen H* is carried out, due to the hydrogen annealing effect, it becomes possible to produce a high quality semiconductor device having a semiconductor-insulator interface structure with a low interface level density.

Note that, even when the hydrogen carrier gas is cut off, the activated hydrogen H* is generated simultaneously with the silicon atoms having a high energy due to the catalytic decomposition reaction of monosilane, therefore the thermal catalyst will not be deteriorated by oxidation.

The configuration of the gas feed system 3 for enabling the gas introduction is shown in detail in FIG. 17. The gas feed system 3 is constituted so that a predetermined gas is guided into the chamber 1 from feed sources of hydrogen gas serving as the carrier gas and the various material gases by opening or closing manual valves 3c and automatic valves 3d in accordance with the situation.

The gas feed system 3 shown in FIG. 17 has a plurality of types of carrier gas feed sources and is constituted so that the desired gas can be selected from among various types of hydrogen-based gases serving as the carrier gas. Namely, the manual valve 3c or the automatic valve 3d of the selected carrier gas is opened, and the gas is guided into the chamber 1 via the mass flow controller (MFC) M. Note that, in the present example, a three-way valve 3e is arranged, whereby it is finally determined whether the selected gas is introduced into the chamber 1 or evacuated. It is assumed that gas of helium-diluted oxygen (He diluted $O_2$) is exhausted from an exhausting means of another system.

Note that, as a means for raising the speed of the film formation, the example of utilizing the technique of raising the concentration of the material gas in the middle of the film formation or the like was shown, but it is also possible to form the film at a high speed by the technique of raising the overall gas pressure.

That is, in the above embodiment, about 10 Pa gas pressure is selected particularly within a range of from 1 to 20 Pa (Pascal). Therefore, by setting a low gas pressure (for example approximately 1 Pa) for dense film formation (prevention of the transition layer of α-Si particularly at the time of polycrystalline silicon) in the initial stage of film formation and changing the gas pressure to high pressure (10 to 20 Pa) from the middle, it becomes possible to form the film at a high speed.

At this time, the mixing ratio of the material gases may be set constant too or can be freely changed. For example, when taking the case of the polycrystalline silicon as an example, it becomes possible to form the film at a high speed by employing a configuration wherein the gas pressure is set at approximately 1 Pa in the initial stage, use is made of monosilane (1 to 2 SCCM) and hydrogen gas (15 to 20 SCCM), the gas pressure is changed to 10 Pa or more from the middle, and use is made of monosilane (15 to 20 SCCM) and hydrogen gas (150 SCCM).

In this way, various thin films are formed on the substrate 10. Note that, not limited to the thin film forming apparatus S shown in FIG. 1, the thin film is formed by apparatuses having various configurations mentioned next. In FIG. 19 to FIG. 41, an explanation will be made of other embodiments of the thin film forming apparatus S. In the present example, the same reference numerals are assigned to similar members to those in the embodiment described above, and the explanations thereof will be omitted.

In the thin film forming apparatus S shown in FIG. 19, a pair of gas introduction systems 3 and thermal catalysts 5 are arranged while sandwiching the suscepter 2 there between. A rail 6 is laid in the chamber 1. The thermal catalysts 5 are arranged along this rail 6. As the means enabling movement on the rail 6, for example a wheel or the roller is attached to the suscepter 2 to make it able to move in the chamber 1. By employing such a configuration, even in the case where for example thermal catalysts 5 having a long shape are arranged in the chamber 1 and there is a difference in the catalytic reaction on the thermal catalysts 5, if the rail 6 is laid along the thermal catalysts 5, the substrate 10 can be moved along the thermal catalysts 5, so it becomes possible to uniformly form the thin film on the substrate 10. A large sized glass substrate can be used, the throughput can be increased and the productivity improved, and therefore the cost can be reduced. Note that in the thin film forming apparatus S shown in FIG. 19 as well, of course, the thermal catalyst 5 explained by referring to FIG. 6 to FIG. 11 can be used.

Namely, the thermal catalyst 5 is fixed to the thermal catalyst holder 5b as the thermal catalyst holding means. The thermal catalyst holder 5b is formed by for example molybdenum. Further, the thermal catalyst 5 of the present example is connected to the heating means 5a outside of the chamber 1. The heating means 5a in the present example is a power supply for supplying power and heating for heating the thermal catalyst 5 by supplying the power. This power supply for supplying the power and heating is constituted by a direct current (DC) or alternate current (AC) or a power supply wherein the AC is superposed on the DC. By such a heating means 5a, the thermal catalyst 5 is heated to 800° C. to 1700° C. (melting point or less).

The thermal catalyst holder 5b is constituted so as to be able to adjust the distance between the thermal catalyst 5 and the substrate 10 so that it can move in the chamber 1 and the most effective catalytic reaction is obtained. The catalyst holder 5b is adjusted by a not illustrated drive mechanism. As the drive mechanism, it is possible to use various configurations, for example, using a motor as a drive source, attaching a pinion gear to an output shaft of the motor, arranging a rack gear at the catalyst holder 5b, meshing these gears, and thereby enabling adjustment by the output of the motor (servo motor or stepping motor) or adjusting the distance by a hydraulic device (also an air pressure device possible) connected to the thermal catalyst holder 5b. Note that, the further the distance of the thermal catalyst 5 from the substrate 10, the less the effect of the catalytic reaction, so preferably the thermal catalyst 5 is arranged in the vicinity of the substrate 10 at a position apart from the substrate 10 by for example 5 cm.

Note that the thermal catalyst 5 is not limited to one formed into a coil as described above. It is also possible to form it into a grid as shown in FIG. 6. The grid-like thermal catalyst is formed by for example assembling a plurality of wires having predetermined lengths in a grid and joining assembly portions of the wires by welding or the like. Further, it is also possible to form the thermal catalyst by winding a wire, coil, or the like of the thermal catalyst one or more times around a high heat resistant insulator such as quartz glass. Alternatively, it is also possible to press it to a flat metal plate to form the grid.

Further, the connection wire 5b to be connected to the power supply 5a is extended from substantially intermediate portions of opposing sides (sides located on left and right in the figure) to the thermal catalyst 5 shown in FIG. 6. Current is supplied from the power supply 5a via this connection wire 5b to heat the thermal catalyst 5 to a predetermined temperature.

The shape of the thermal catalyst 5 may be a shape as shown in for example FIG. 7 to FIG. 11 other than the coil-like or grid shape as described above.

The thermal catalyst 5 shown in FIG. 7 is formed by a relatively long wire. Namely, a plurality of parallel rows are formed by bending the wire back and forth angularly. The thermal catalyst 5 formed in a plurality of rows in this way may be used alone or, as indicated by the broken lines in FIG. 7, two may be superposed so that the parallel rows perpendicularly intersect. Alternatively, it is possible to superpose them while changing the angle and further superpose a plurality of thermal catalysts, not limited to two.

Further, the thermal catalyst 5 shown in FIG. 8 is formed by coiling a wire and winding this wire coil circularly by one turn. By coiling the thermal catalyst 5 in this way, a larger number of thermal catalysts can be arranged in a limited space. Further, as shown in FIG. 9, it is also possible to employ a configuration wherein the coil of the thermal catalyst 5 is wound doubly or more.

Alternatively, as shown in FIG. 10, the configuration wherein the wire is coiled and this wire coil is arranged in a plurality of rows in parallel may be employed. Alternatively, it is also possible to arrange them differently so as to perpendicularly intersect.

Furthermore, as shown in FIG. 7 and FIG. 11, it is also possible to arrange a plurality of thermal catalysts 5 in the chamber 1. At this time, as shown in FIG. 7, it is possible to arrange the thermal catalysts 5 in an overlapping manner. Alternatively, as shown in FIG. 11, it is possible to arrange the thermal catalysts 5 in a plurality of stages in parallel. Further, it is also possible to arrange them differently so as to perpendicularly intersect other than the arrangement in a plurality of stages in parallel.

Note that, when arranging a plurality of thermal catalysts 5, it is possible to form the thermal catalysts 5 from the same material. For example, in FIG. 11, both of the thermal catalyst 5 located on the upper side and the thermal catalyst 5 located on the lower side are made by tungsten.

Alternatively, when arranging a plurality of thermal catalysts 5, it is possible to form the thermal catalysts 5 from different materials. For example, in FIG. 11, the configuration wherein the thermal catalyst 5 located on the upper side is made by tungsten and the thermal catalyst 5 located on the lower side is made by palladium is employed.

Further, when arranging a plurality of thermal catalysts 5, as shown in FIG. 11, a configuration wherein thermal catalysts 5 having different shapes are arranged can be employed other than the arrangement of the thermal catalysts 5 having the same shape. Namely, for example, the thermal catalyst 5 shown in FIG. 6 and the thermal catalyst 5 shown in FIG. 7 are arranged in combination.

Furthermore, as shown in FIG. 11, when arranging a plurality of thermal catalysts 5, it is also possible to employ a configuration wherein the thermal catalysts are connected to power supplies different from each other. The power supply in the present example is a DC power supply or an AC power supply or a power supply wherein the AC is superposed on the DC and is selected in accordance with the situation. By adjusting the voltage and/or current of the power supply, it becomes possible to adjust the temperature of the thermal catalysts.

By arranging a plurality of thermal catalysts 5 in the chamber 1 and freely selecting and combining the materials and the shapes of the thermal catalysts or the power supplies to be connected in this way, it becomes possible to obtain the best catalytic reaction.

Further, the thermal catalyst 5 is held at the thermal catalyst holder 5b as described above so that the distance from the substrate 10 can be adjusted by this thermal catalyst holder 5b. Accordingly, for example, it is also possible to employ a configuration wherein the catalyst is moved in a horizontal direction of FIG. 11, and thus a change can be imparted to the catalytic reaction.

In this way, it is possible to employ various configurations for the thermal catalysts 5, for example enable movement, use a plurality of thermal catalysts made of different materials together, and make the temperatures of the thermal catalysts different by using the same power supply or different power supplies.

Figure 20:
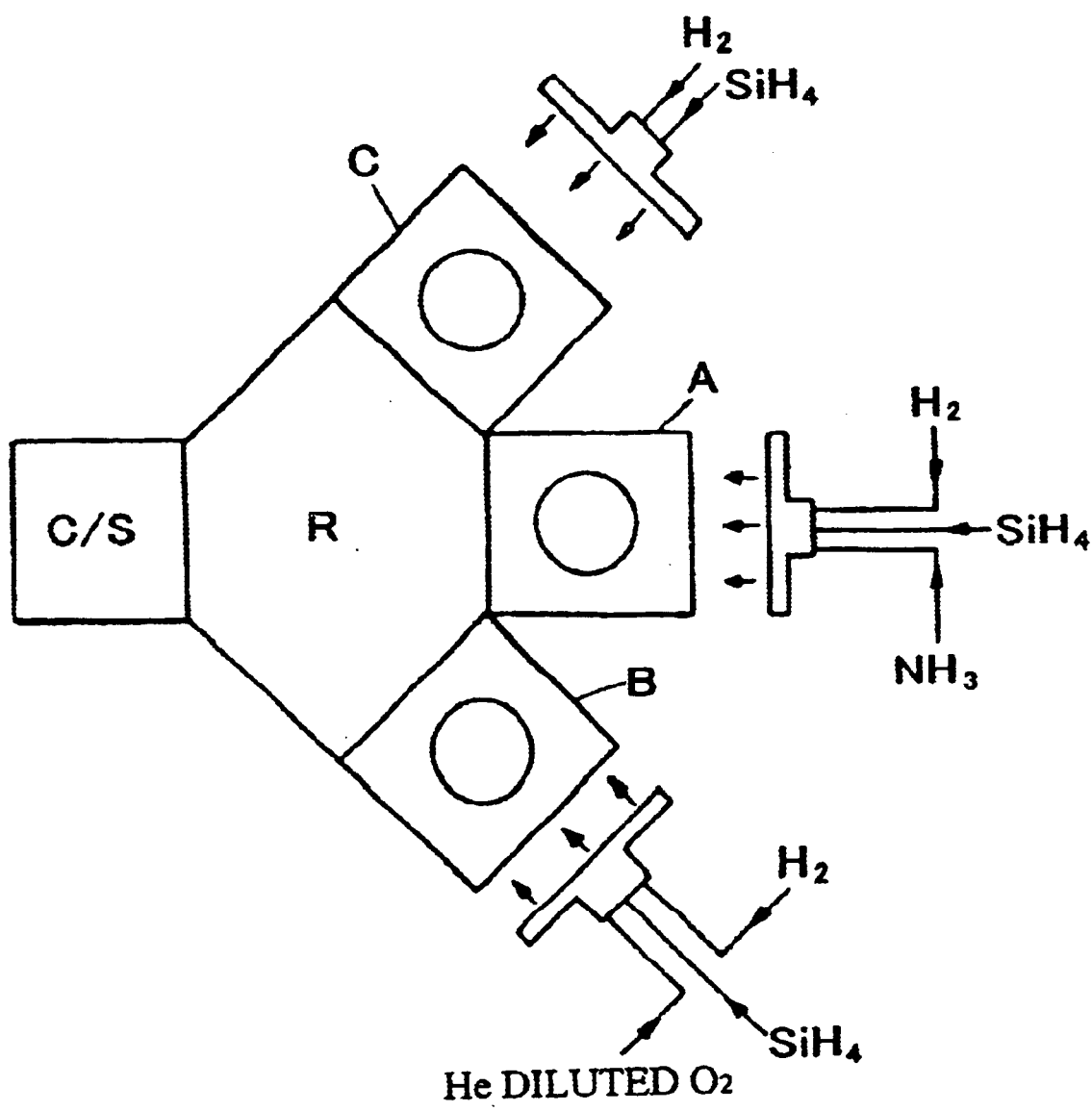
FIG. 20 is an explanatory view of another embodiment of the thin film forming apparatus according to the present invention.

FIG. 20 is a schematic view of a thin film forming apparatus S provided with a multi-chamber. The thin film forming apparatus S provided with a multi-chamber of the resent example comprises for example three chambers 1 (A, B, C), a cassette station CS, and a robot R and is constituted so as to form thin films in the different chambers A, B and C. In the chambers 1 (A, B, C), the thermal catalysts 5 are arranged between the suscepters 2 and the gas feed side. As the thermal catalyst 5, of course one explained by referring to FIG. 6 to FIG. 11 can be applied.

In the multi-chamber shown in FIG. 20, the thin film is formed in the following way. Here, as an example, an explanation will be made of the example of forming a silicon nitride film, and a silicon oxide film for protective films, a polycrystalline silicon film, and a silicon oxide film and silicon nitride film for gate insulating films.

First, in the chambers 1 (A, B, C), hydrogen serving as the carrier gas is fed to heat the thermal catalysts to a predetermined temperature (for example 1700 to 1800° C.) to stand by. For example, in the first channel A, a gas obtained by mixing ammonia into monosilane is introduced as the material gas, a silicon nitride film of a predetermined thickness is formed on the substrate 10, then the substrate 10 is moved to the B chamber, a gas obtained by mixing helium-diluted oxygen (He diluted $O_2$) with monosilane is introduced as the material gas, a silicon oxide film having a predetermined thickness is formed on the substrate 10, then the substrate 10 is shifted to the C chamber, monosilane is introduced as the material gas, and a polycrystalline silicon film having a predetermined thickness is formed on the substrate 10. Further, the substrate 10 is shifted to the B chamber, a silicon oxide film having a predetermined thickness is formed on the substrate 10, the substrate 10 is shifted to the A chamber according to need, and a silicon nitride film having a predetermined thickness is formed.

Note that, in the case where the mode of introduction of gas shown in FIG. 12 to FIG. 14 is employed and a constant amount of hydrogen gas serving as the carrier gas is continuously introduced into the chamber 1, when a multi-chamber is used, it is also possible to employ a configuration wherein a chamber is separately provided for temporarily arranging the substrate 10 during the period where the substrate 10 is moved from one chamber to another chamber in order to constantly expose the substrate 10 to the activated hydrogen H*.

Figure 30:
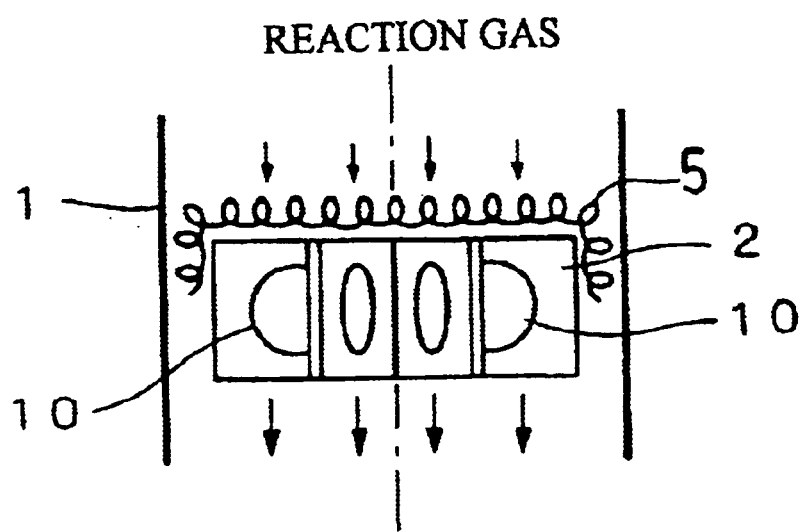
FIG. 30 is an explanatory view of another embodiment of the thin film forming apparatus according to the present invention.
Figure 31:
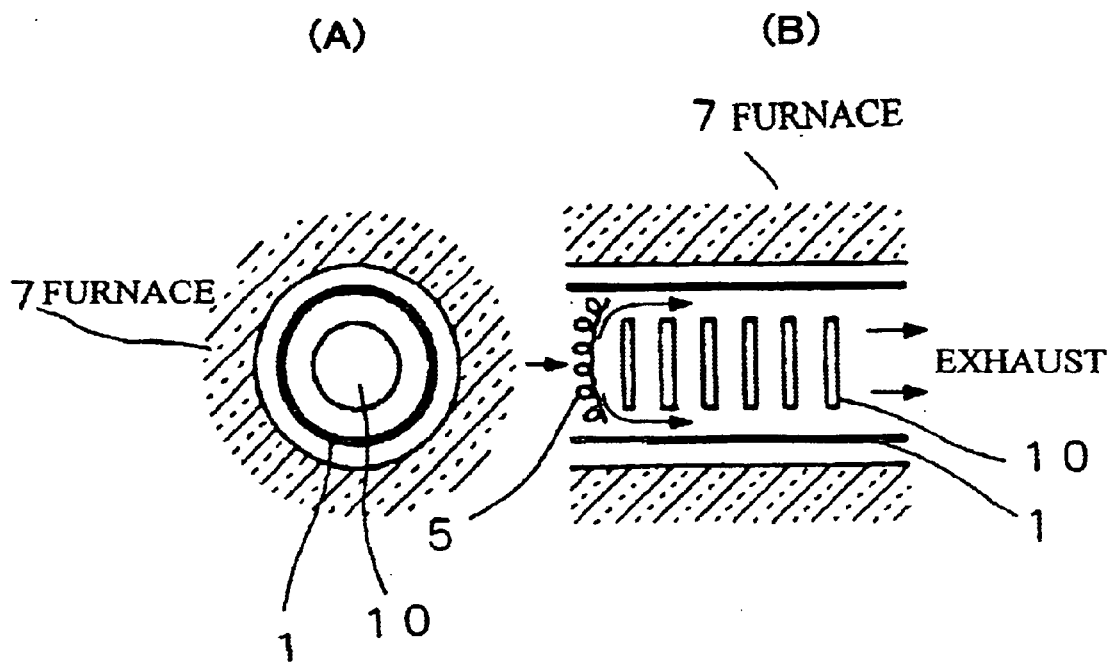
FIG. 31 is an explanatory view of another embodiment of the thin film forming apparatus according to the present invention.
Figure 32:
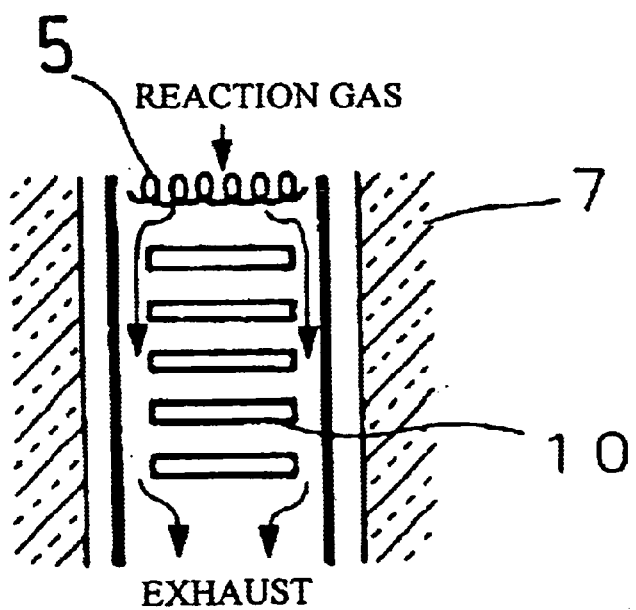
FIG. 32 is an explanatory view of another embodiment of the thin film forming apparatus according to the present invention.

The CVD systems shown in FIG. 21 to FIG. 41 are basically constituted so that the substrates are horizontally placed on the suscepters or hot plates except a hot wall LPCVD method shown in FIG. 31 and FIG. 32, and the reaction gases uniformly contact the surfaces.

Figure 21:
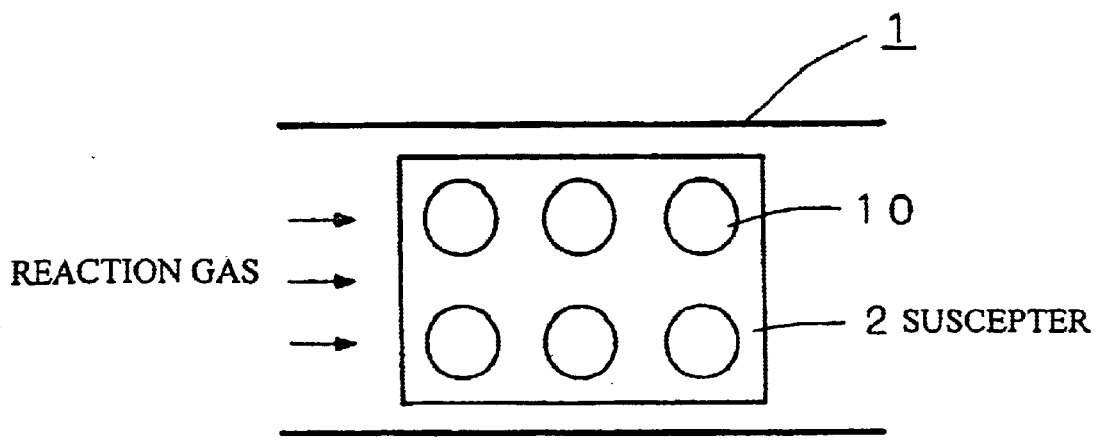
FIG. 21 is an explanatory view of another embodiment of the thin film forming apparatus according to the present invention.
Figure 22:
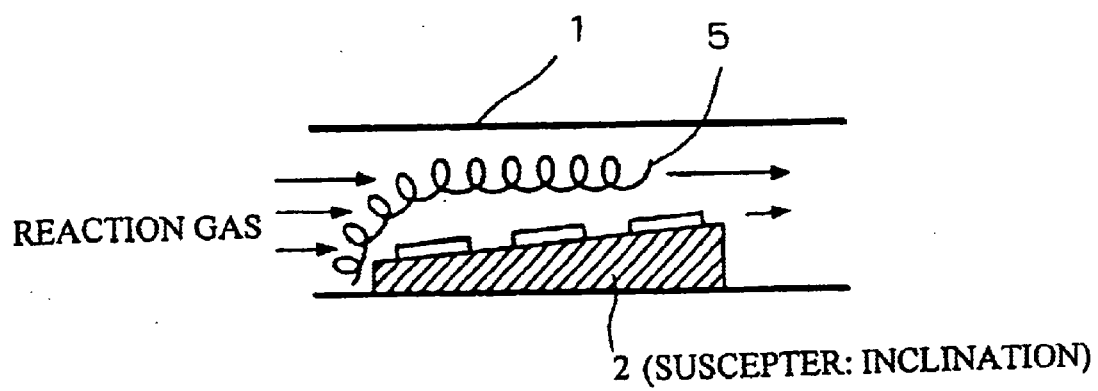
FIG. 22 is an explanatory view of another embodiment of the thin film forming apparatus according to the present invention.

The system shown in FIG. 21 and FIG. 22 is a horizontal type catalytic CVD system. In this horizontal type CVD system, circular substrates (wafers in the present example) 10 can be mounted on the surface of the suscepter 2 close together. However, on the other hand, since the gas is fed from the lateral direction, the reaction gas may be depleted as it moves from the inlet side toward the outlet side and the uniformity may be lowered. This problem is dealt with by forming an inclination as shown in FIG. 22 and in addition feeding a large amount of the carrier gas to form a turbulent flow-pressurization state in the internal portion so as to increase the opportunity for each substrate 10 to contact the gas flow. In this case, as shown in FIG. 22, the thermal catalyst 5 is arranged on the suscepter in an L-shape so as to cover the top face of the substrate 10 when the reaction gas is introduced.

Figure 23:
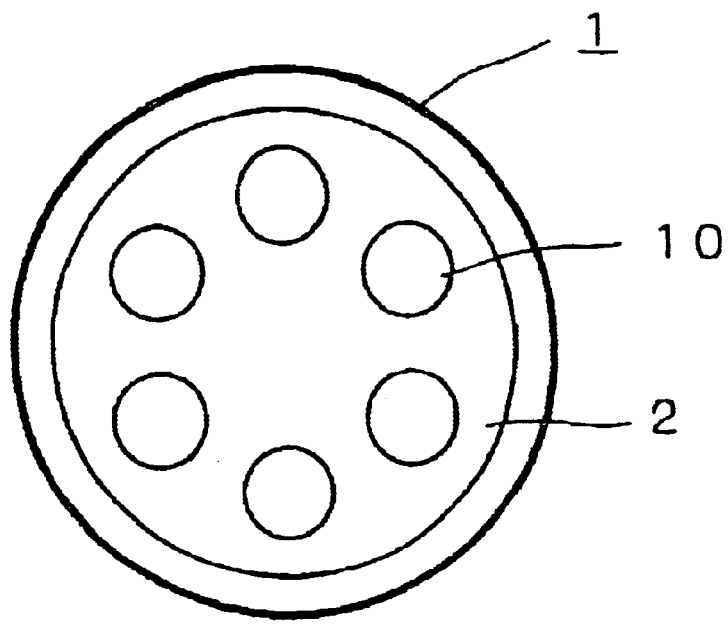
FIG. 23 is an explanatory view of another embodiment of the thin film forming apparatus according to the present invention.
Figure 24:
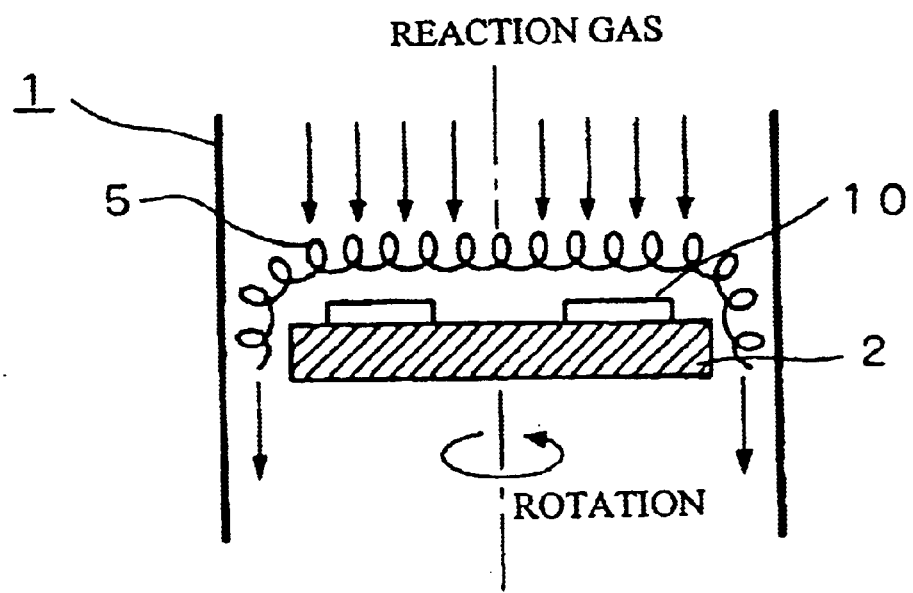
FIG. 24 is an explanatory view of another embodiment of the thin film forming apparatus according to the present invention.

The catalytic CVD system shown in FIG. 23 and FIG. 24 is a vertical type (pancake type) and basically employs a method of rotating about the disk-like suscepter 2. In the vertical type CVD system, when checking the uniformity in the radial direction, the state of distribution of the substrates as a whole (wafers in the present example) 10 can be determined, therefore so long as adjustment in the radial direction is possible, a remarkably good distribution is obtained. Further, in the present example, as shown in FIG. 24, the thermal catalyst 5 is arranged at the top faces of the substrates 10 when the reaction gas is introduced.

Figure 25:
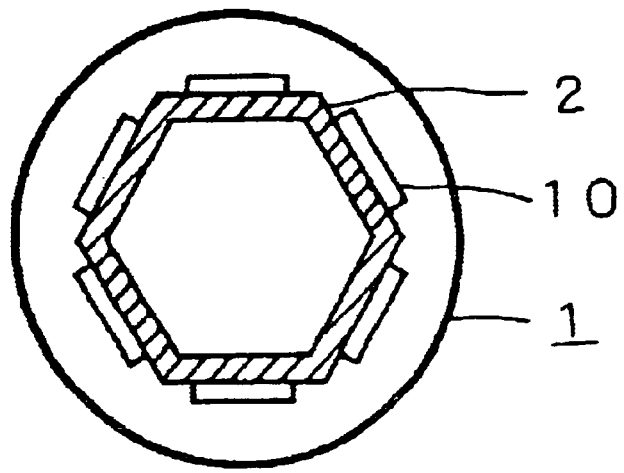
FIG. 25 is an explanatory view of another embodiment of the thin film forming apparatus according to the present invention.
Figure 26:
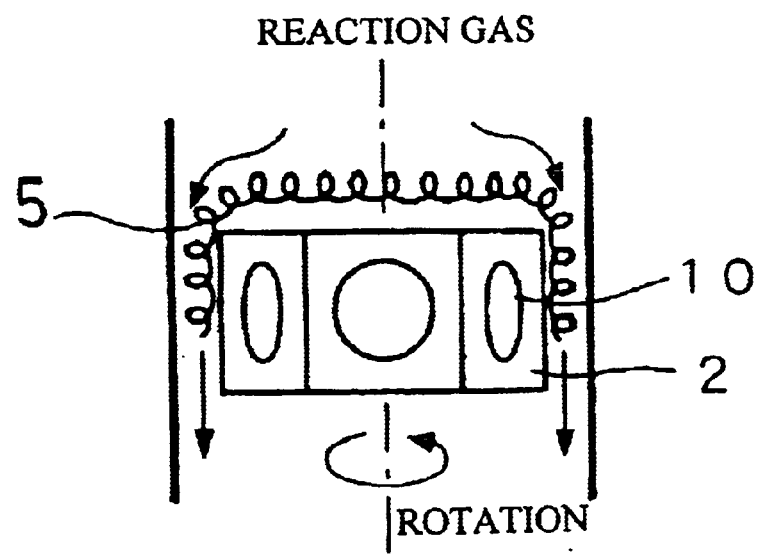
FIG. 26 is an explanatory view of another embodiment of the thin film forming apparatus according to the present invention.
Figure 27:
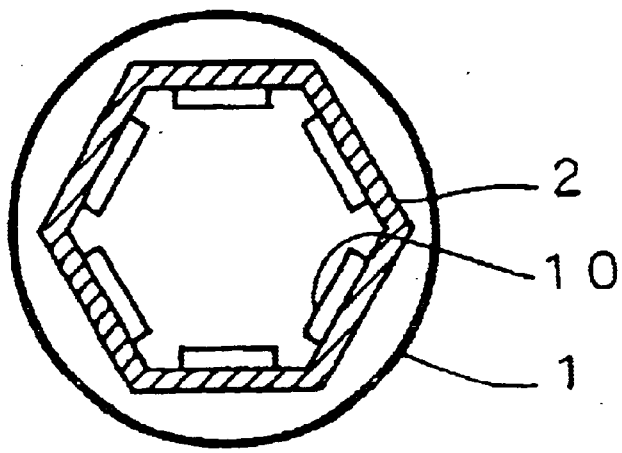
FIG. 27 is an explanatory view of another embodiment of the thin film forming apparatus according to the present invention.
Figure 28:
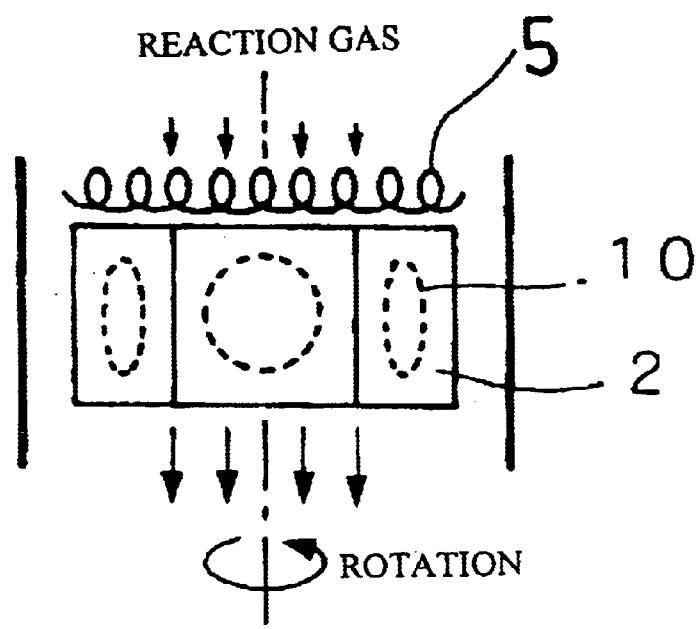
FIG. 28 is an explanatory view of another embodiment of the thin film forming apparatus according to the present invention.

The catalytic CVD systems shown in FIG. 25 to FIG. 28 are cylinder types (barrel types, drum types). FIG. 25 and FIG. 26 show a configuration of loading substrates 10 (wafers in the present example) on the outside of the suscepter (cylinder in the present example), while FIG. 27 and FIG. 28 show a configuration of loading the substrates 10 inside the suscepter (cylinder in the present example). The cylinder type is a configuration actively using the characteristics of the horizontal type and the vertical type and can raise the productivity by combining many suscepters 2. The reaction gas is fed from above, but it becomes possible to keep the uniformity since the side surfaces mounting the substrates 10 thereon are inclined relative to the direction of gas flow. The inside and the outside of the suscepter 2 can be used. Preferably the substrates 10 are simultaneously mounted at the inside and outside of the suscepter 2 from the viewpoint of effective utilization of the energy. Then, in the present example, the thermal catalyst 5 is arranged at a position above the suscepter 2, that is, a predetermined position on the side where the reaction gas is introduced.

Figure 29:
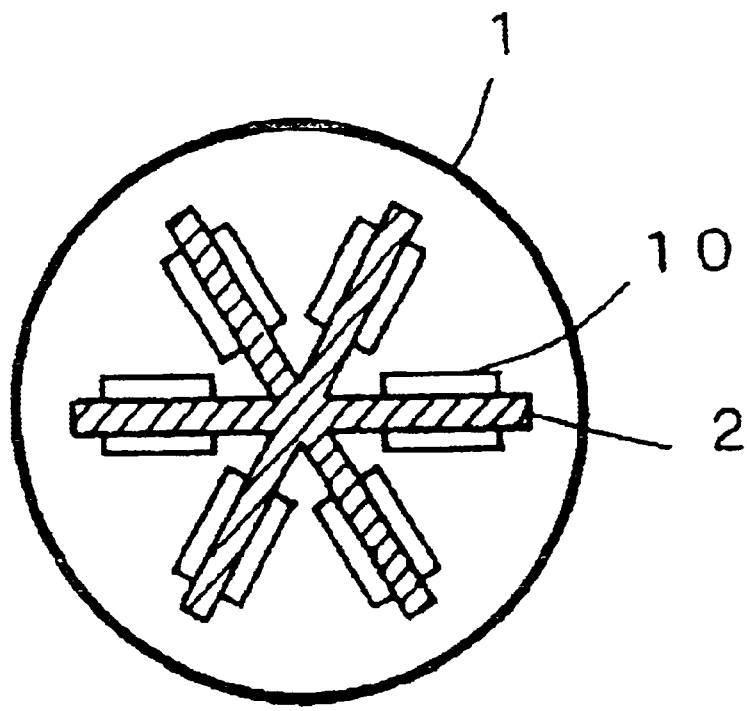
FIG. 29 is an explanatory view of another embodiment of the thin film forming apparatus according to the present invention.

The catalytic CVD system shown in FIG. 29 and FIG. 30 is a radial type, uses a suscepter 2 (substrate holder in the present example) having a radial cross section as shown in FIG. 29, and attaches substrates 10 to the two side surfaces of this suscepter 2. In the case of the present example as well, the thermal catalyst 5 is arranged at a position above the suscepter 2, that is, a predetermined position on the side where the reaction gas is introduced. The radial type system as in the present example is most excellent in the point of the star shape energy and the effective utilization of the chamber projection area. Note that, in the system shown in FIG. 25 to FIG. 28 and the system shown in FIG. 29 and FIG. 30, so far as there is no problem in their configurations, it becomes possible to apply the configurations of the thermal catalysts 5 explained by referring to FIG. 1 and FIG. 6 to FIG. 11.

Figure 33:
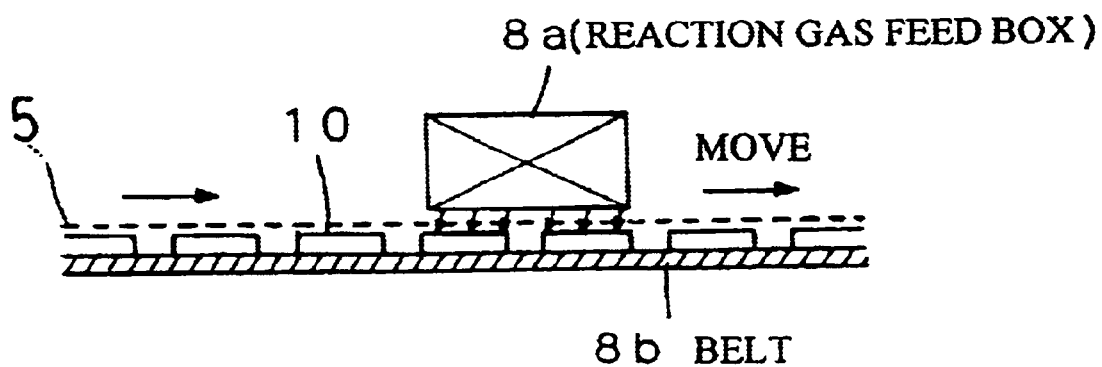
FIG. 33 is an explanatory view of another embodiment of the thin film forming apparatus according to the present invention.
Figure 34:
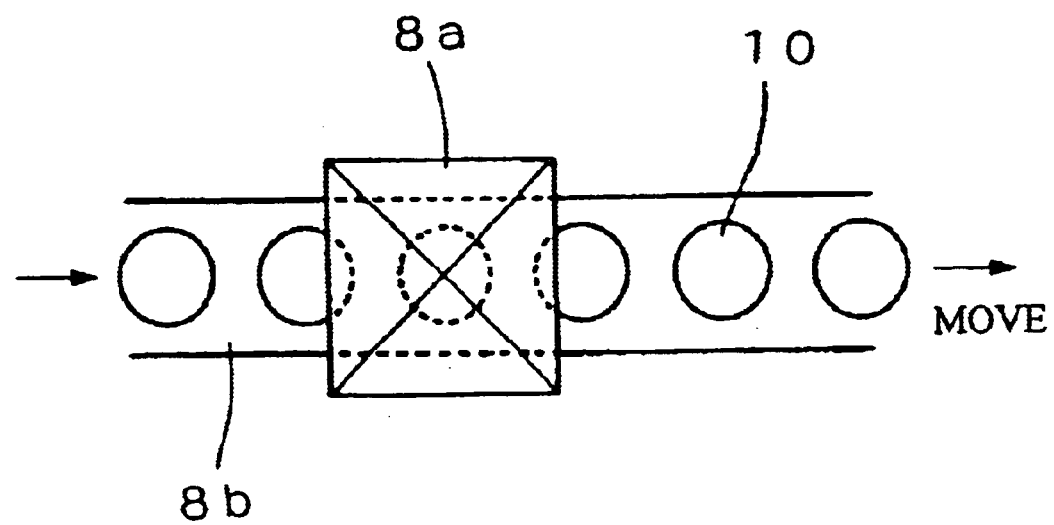
FIG. 34 is an explanatory view of another embodiment of the thin film forming apparatus according to the present invention.

FIG. 31 and FIG. 32 show the hot wall type catalytic CVD system, while FIG. 33 and FIG. 34 show a continuous type CVD system. In the example shown in FIG. 31, the chamber 1 is arranged in a horizontally placed furnace 7 with a predetermined space. A large number of substrates 10 are arranged in the chamber 1. The substrates 10 are held by various well known means, for example, they are suspended by a not illustrated fixture or use is made of a susceptor 2 such as a multi-stage cassette for holding the substrates 10 in alignment. Then, the thermal catalyst 5 is arranged at a predetermined position on the side where the reaction gas is introduced.

Further, in the example shown in FIG. 32, a case according to a vertically placed furnace is shown in contrast to FIG. 31 showing the horizontally placed furnace 7.

The continuous type catalytic CVD system shown in FIG. 33 and FIG. 34 is constituted by a reaction gas feed box 8a, a belt 8b serving as the moving means, a not illustrated drive device, etc. added thereto. Namely, in the case of the present example, the belt 8b serving as the moving means moves in the chamber (not illustrated) at a predetermined speed. The substrates (wafers in the present example) are placed on this belt 8b at predetermined intervals. Further, the thermal catalyst 5 is arranged at a position between the reaction gas feed box 8a and the top faces of the substrates 10 as indicated by the broken line of FIG. 33.

In the present example, the example of arranging the thermal catalyst 5 in a predetermined range on the two sides of the reaction gas feed box 8a is shown, but it is also possible to form the same at the bottom position of the reaction gas feed box 8a while being attached to the reaction gas feed box 8a. Then, the substrate 10 is constituted so that the thin film is formed on the surface of the substrate 10 when moving on the bottom surface of the reaction gas feed box 8a at a predetermined speed.

In these systems shown in FIG. 31 to FIG. 34, the CVD reaction is limited. The hot wall LPCVD system can be used for other than epitaxial growth. On the other hand, the continuous type is limited to the case of forming a low temperature CVD silicon oxide film under atmospheric pressure. Namely, this is because it is not necessary to seal the chamber in the case of the formation of the silicon oxide film under atmospheric pressure. Note that, of course, in FIG. 31 to FIG. 34 described above as well, it is possible to apply the configurations of the thermal catalysts 5 explained by referring to FIG. 1 and FIG. 6 to FIG. 11 so far as their natures permit.

Figure 35:
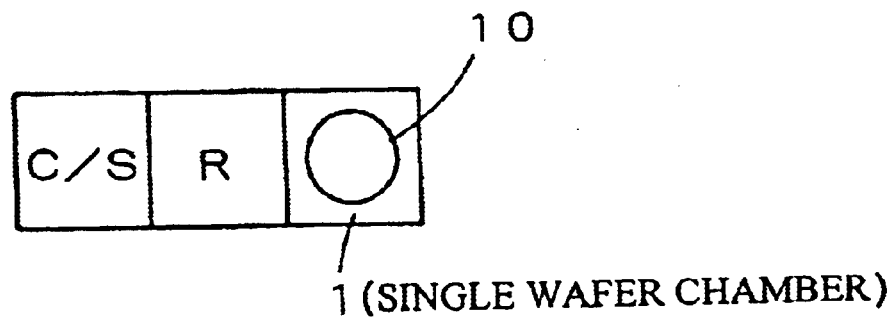
FIG. 35 is an explanatory view of another embodiment of the thin film forming apparatus according to the present invention.

Next, an explanation will be made of the catalytic CVD chamber systems referring to FIG. 35 to FIG. 41. The chambers used in the catalytic CVD systems are roughly classified into the types of the single wafer method wherein one substrate is arranged in the channel as shown in FIG. 35 and FIG. 36, the batch method shown in FIG. 37 and FIG. 38, a combination method of the single wafer method and the batch method shown in FIG. 39, and the continuous method shown in FIG. 40 and FIG. 41.

In any system, it is possible to apply the configurations of the thermal catalysts 5 explained by referring to FIG. 1 and FIG. 6 to FIG. 11 so far as their natures permit. Namely, it is possible to configure the system so as to arrange the thermal catalyst between the susceptor and the gas feed side in the chamber and configure the thermal catalysts 5 by appropriately selecting the configurations of the thermal catalysts 5 described above.

Figure 36:
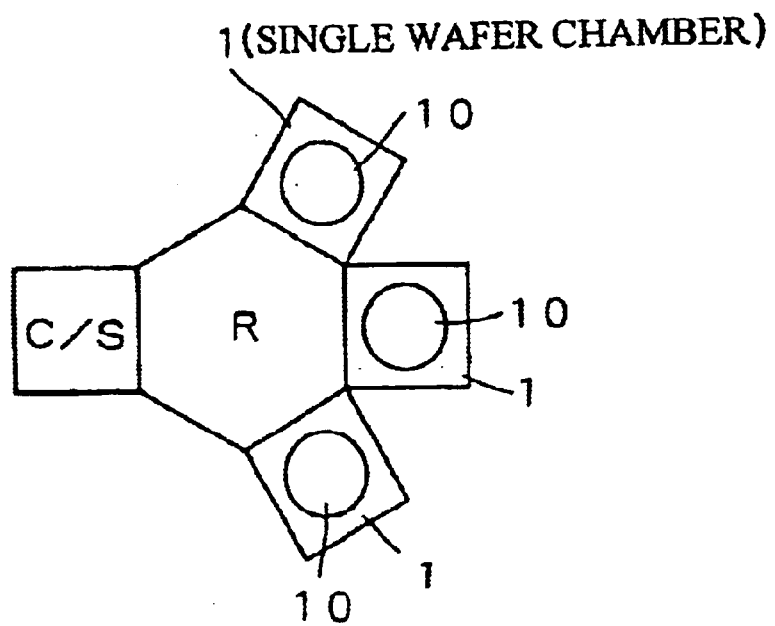
FIG. 36 is an explanatory view of another embodiment of the thin film forming apparatus according to the present invention.
Figure 37:
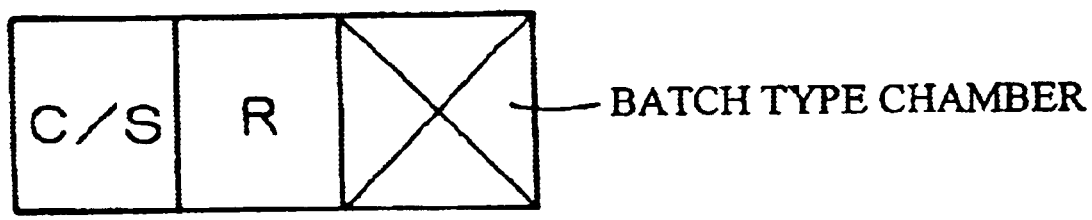
FIG. 37 is an explanatory view of another embodiment of the thin film forming apparatus according to the present invention.
Figure 38:
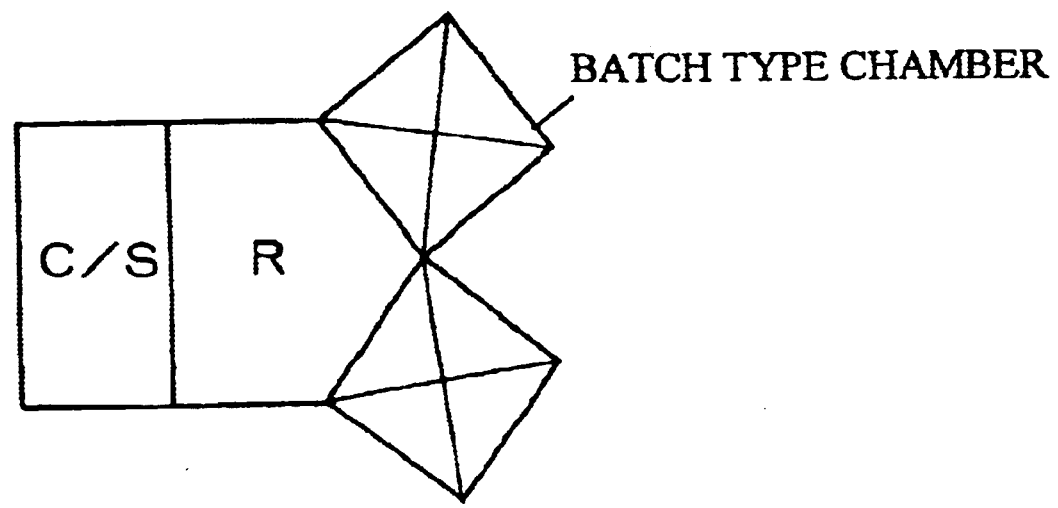
FIG. 38 is an explanatory view of another embodiment of the thin film forming apparatus according to the present invention.
Figure 39:
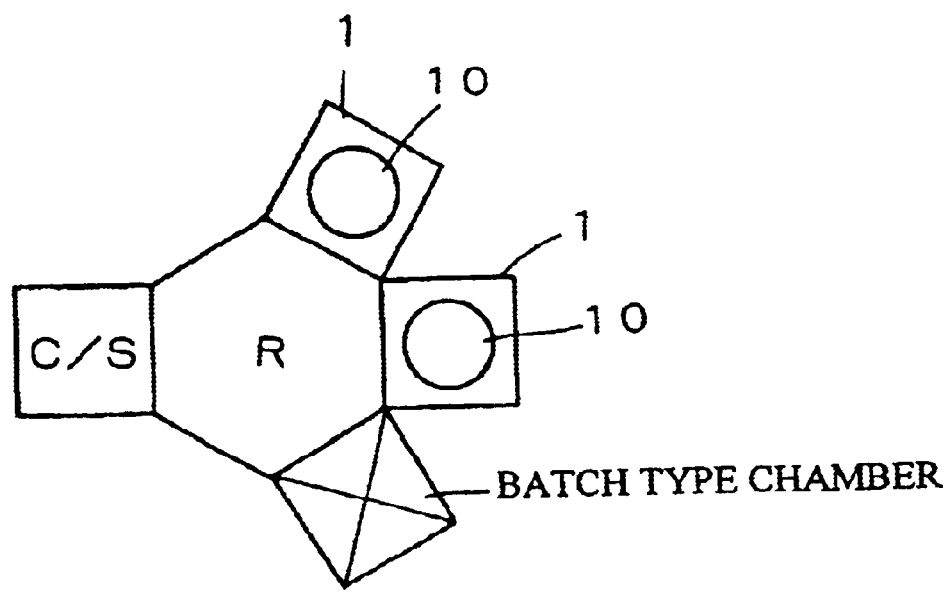
FIG. 39 is an explanatory view of another embodiment of the thin film forming apparatus according to the present invention.

Note that, as shown in FIG. 36 and FIG. 38, in the single wafer method or the batch method or the combination method thereof, by forming a multi-chamber, the mass productivity and flexibility are improved. Particularly, in a configuration wherein the single wafer method shown in FIG. 35 is applied to a multi-chamber as shown in FIG. 36, there is the advantage that t he substrates can be processed one by one with a high precision.

Figure 40:
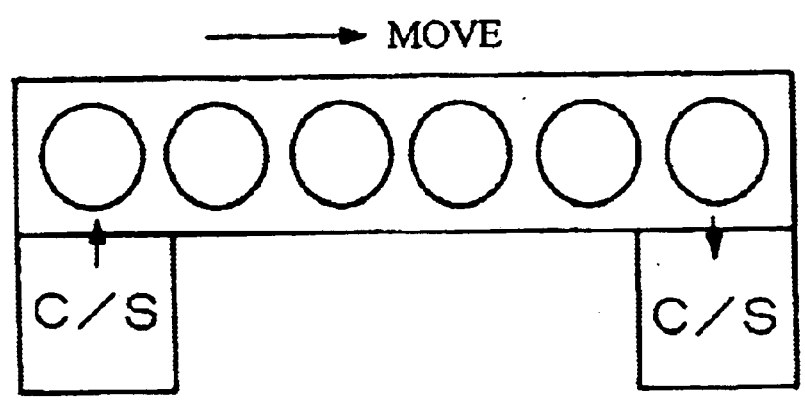
FIG. 40 is an explanatory view of another embodiment of the thin film forming apparatus according to the present invention.
Figure 41:
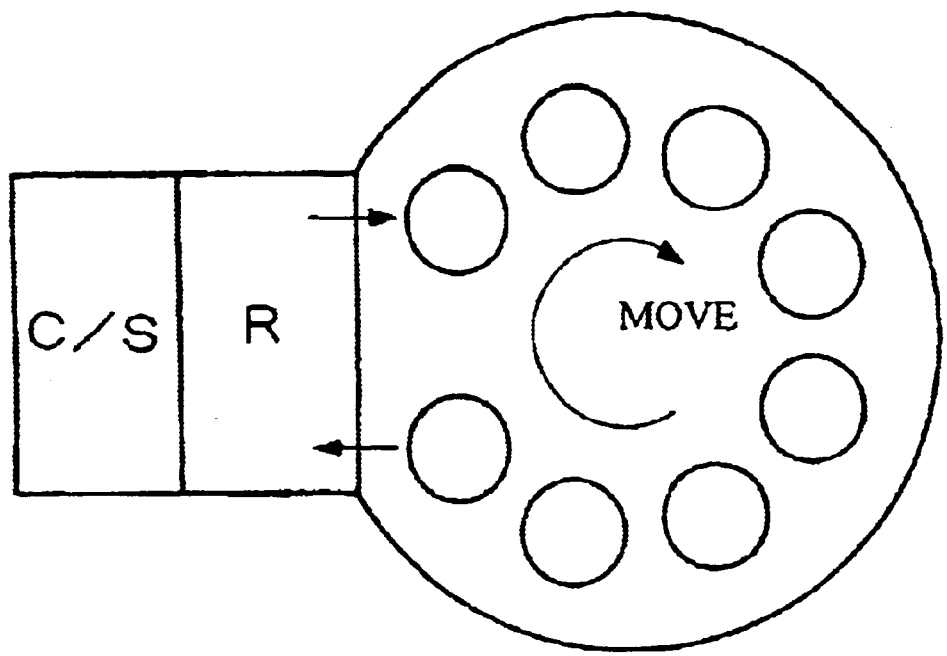
FIG. 41 is an explanatory view of another embodiment of the thin film forming apparatus according to the present invention.

On the other hand, the continuous type chamber shown in FIG. 40 and FIG. 41 includes the case of continuously forming the films and the case of stacking films formed at other positions while moving the substrates. The former is the case of an ordinary pressure low temperature CVD silicon oxide film, while the latter includes the case of the same low temperature silicon oxide film and the case of a plasma CVD film. The case of the stacked film formation has advantages that the nonuniformity of the film thicknesses is averaged out by the stacking, so the uniformity becomes high and the processability when used for production becomes extremely large.

According to the thin film forming apparatus mentioned above, a semiconductor thin film made of polycrystalline silicon, single crystalline silicon, amorphous silicon, micro-crystalline silicon, silicon germanium, silicon carbide, compound semiconductor (gallium arsenic, gallium phosphorus, gallium nitride, etc.), diamond, and diamond-like carbon (DLC), an insulator thin film made of silicon oxide, silicon oxide containing impurities (phosphosilicate glass (PSG), borosilicate glass (BSG), borophosphosilicate glass (BPSG), etc.), silicon nitride, silicon oxynitride, molybdenum oxide, titanium oxide, tantalum oxide, and aluminum oxide, an oxidative conductive thin film made of ruthenium oxide, indium oxide, indium tin oxide (ITO), iridium oxide, and palladium oxide, a metal thin film made by a refractory metal and conductive metal nitride thin film (tungsten, titanium, tantalum, molybdenum, tungsten nitride, titanium nitride, tantalum nitride, molybdenum nitride, etc.), silicide, copper, aluminum, aluminum-silicon or aluminum-silicon-copper, a high dielectric rate thin film such as BST, a ferroelectric thin film such as PZT, PLZT, SBT, and BIT, etc. can be formed.

The relationships between the formed metal thin films and the material gases (reaction gases) are as follows. Note that, as the carrier gas, preferably use is made of an inert gas such as He, $H_2$, Ar, or $N_2$.

1. For the formation of a film of Si and Poly-Si, use is made of $SiH_4$, $SiHCl_3$, $SiH_2Cl_2$, $SiCl_4$, and $SiH_6$.
2. For the formation of a film of $SiO_2$, use is made of $SiH_4$, $SiHCl_2$, $SiH_2Cl_2$, $SiCl_4$, $SiBr_4$, $SiI_4$, $SiF_4$, $Si(OC_2H_4)_4$, $Si(OC_2H_5)_4$, $(C_2H_5)Si(OC_2H_5)_3$, $C_5H_{11}Si(OC_2H_5)_3$, $C_6H_5Si(OC_2H_5)_3$, $(CH_3)_2Si(OC_2H_3)_2$ and $O_2$, NO, $N_2O$, $NO_2$, $CO_2+H_2$, and $H_2O$.
3. For the formation of a film of BPSG, BSG, PSG, and an AsSG, gases such as $PH_3$, $B_2H_6$, $AsH_3$, $PO(OCH_3)_3$, $B(OCH_3)_3$, and a $B(OC_3H_7)_3$ are mixed to the material gases of 2 described above, i.e., ($SiH_4$, $SiHCl_2$, $SiH_2Cl_2$, $SiCl_4$, $SiBr_4$, $SiI_4$, $SiF_4$, $Si(OC_2H_4)_4$, $Si(OC_2H_5)_4$, $(C_2H_5)Si(OC_2H_5)_3$, $C_5H_{11}Si(OC_2H_5)_3$, $C_6H_5Si$ $(OC_2H_5)_3$, $(CH_3)_2Si(OC_2H_3)_2$ and $O_2$, NO, $N_2O$, $NO_2$, $CO_2+H_2$ and $H_2O$).

4. For the formation of a film of SiNX, use is made of material gases obtained by mixing $NH_3$, $N_2H_4$, and $N_2$ to $SiH_4$, $SiH_6$, $SiHCl_3$, $SiHCl_2$, $SiH_3Cl$, $SiCl_4$, $SiBr_4$, and so on. Note that, as the carrier gas, Ar, He, etc. are preferred.

5. For the formation of a film of SiOXNY, use is made of material gases the same as 2 and 4 described above. Namely, use can be made of material gases obtained by mixing $NH_3$, $N_2H_4$, and $N_2$ to the material gases of $SiH_4$, $SiHCl_2$, $SiH_2Cl_2$, $SiCl_4$, $SiBr_4$, $SiI_4$, $SiF_4$, $Si(OC_2H_4)_4$, $Si(OC_2H_5)_4$, $(C_2H_5)Si(OC_2H_5)_3$, $C_5H_{11}Si(OC_2H_5)_3$, $C_6H_5Si(OC_2H_5)_3$, $(CH_3)_2Si(OC_2H_3)_2$, and $O_2$, NO, $N_2O$, $NO_2$, $CO_2+H_2$ and $H_2O$, and $SiH_4$, $SiH_6$, $SiHCl_3$, $SiHCl_{21}$ $SiH_3Cl$, $SiCl_4$, $SiBr_4$, etc.

6. For the formation of a film of Al, use can be made of $AlCl_3$, $Al(CH_3)_3$(TMA), $Al(C_2H_5)_3$(TEA), and $Al(OC_3H_7)_3$. Note that, as the reduction gas, $H_2$ is preferred.

7. For the formation of a film of $Al_2O_3$—X, use can be made of material gases obtained by adding $CO_2+H_2$, $O_2$ and $H_2O$ to the material gases of 6 described above ($AlCl_3$, $Al(CH_3)_3$(TMA), $Al(C_2H_5)_3$(TEA), $Al(OC_3H_7)_3$).

8. For the formation of a film of $In_2O_3$, use can be made of material gases added with $In(CH_3)_3$(TMI), $In(C_2H_5)_3$(TEI) and $O_2$, $H_2O$, and $CO_2$.

9. For the formation of a film of a refractory metal, when it is classified into for example fluorides, chlorides, and organic compounds, use can be made of material gases of $MoF_6$ and $WH_6$ for the formation of a film of fluoride, material gases of $MoCl_5$, $WCl_6$, $TaCl_5$, $TiCl_4$, and $ZrCl_4$ for the formation of a film of chloride, and material gases of $Ta(OC_2H_5)_5$, $(PtCl_2)_2(CO)_3$, $W(CO)_6$, and $Mo(CO)_6$ for the formation of a film of an organic compound.

10. For the formation of a film of silicide, use is made of a gas obtained by mixing a silane-based gas such as the $SiH_4$, $SiH_6$, etc. to the material gases of 9 described above (material gases of $MoF_6$ and $WH_6$ for the formation of a film of a fluoride, material gases of $MoCl_5$, $WCl_6$, $TaCl_5$, $TiCl_4$, and $ZrCl_4$ for the formation of a film of a chloride, and material gases of the $Ta(OC_2H_5)_5$, $(PtCl_2)_2(CO)_3$, $W(CO)_6$, and $Mo(CO)_6$ for the formation of a film of an organic compound) as the material gas.

11. For the formation of film of a TiN, use can be made of a material gas of $TiCl_4+N_2$ ($+NH_3$), while for the formation of film of TiON, use can be made of a material gas obtained by adding $O_2$ and $N_2O$ to $TiCl_4+N_2(+NH_3)$.

12. For the formation of a film of Cu, use can be made of a material gas such as copper hexafluoroacetylacetonate $Cu(HFA)_2$ and $C(HFA)_2+H_2O$ and materials of a chelate compound $(Cu(DPM)_2$, $Cu(AcAc)_2$, $Cu(FOD)_2$, $CU(PPM)_2$, $Cu(HFA)TMVS$, etc.).

13. For the formation of films of Al—Si and Al—Si—Cu, use can be made of material gases obtained by adding the material gases of 1 ($SiH_4$, $SiHCl_3$, $SiH_2Cl_2$, $SiCl_4$, $SiH_6$) and the material gases of 12 (copper hexafluoroacetylacetonate $Cu(HFA)_2$ and $C(HFA)_2+H_2O$ and materials of a chelate compound $(Cu(DPM)_2$, $Cu(AcAc)_2$, $Cu(FOD)_2$, $CU(PPM)_2$, $Cu(HFA)TMVS$), etc.) to the material gases of 6 described above ($AlCl_3$, $Al(CH_3)_3$(TMA), $Al(C_2H_5)_3$(TEA), $Al(OC_3H_7)_3$).

It is possible to form the various thin films described above by using these material gases.

Further, in a thin film forming apparatus employing the method of the present invention, by appropriately using the material gases described above, it is possible to produce a silicon semiconductor device, silicon semiconductor integrated circuit device, silicon-germanium semiconductor device, silicon-germanium semiconductor integrated circuit device, compound semiconductor device, compound semiconductor integrated circuit device, silicon carbide semiconductor device, silicon carbide semiconductor integrated circuit device, diamond semiconductor device, diamond semiconductor integrated circuit device, liquid crystal display device, electroluminescence display device, plasma display panel (PDP) device, light emission-polymer display device, light emission diode display device, CCD area/linear sensor device, MOS sensor device, high dielectric/ferroelectric memory semiconductor device, high dielectric/ferroelectric memory semiconductor integrated circuit device, or solar battery.

Next, an explanation will be made of the method of forming a thin film by using the thin film forming apparatus S according to the present invention and further forming a thin film layer thin film semiconductor using the formed thin film layer based on concrete embodiments.

In the concrete embodiments, the CVD for forming a film on the substrate 10 was explained based on the example of employing catalytic CVD. However, the invention is not limited to catalytic CVD. It is of course also possible to employ high density plasma CVD (ECR plasma CVD or the like), high density catalytic CVD (method combining high density plasma CVD and catalytic CVD), etc.

Plasma CVD excites the material gas to be introduced in the high energy plasma state, breaks it down to generate radicals, and thereby forms a thin film by a reaction among active particles. It feeds the material gas in a shower from a large number of small holes formed in the surface of the electrode applied with a high frequency. As this plasma CVD, the capacity coupling method, induction coupling method, etc. can be applied according to the difference of the method of generation of the plasma.

Further, in high density plasma CVD, the film is formed by the activation of material gas in the high density plasma under a low pressure of the $10^{-3}$ Pa level. As the high density plasma CVD system, basically the device described in the present specification can be used, but use is made of an ECR (electron cyclotron resonance) using a microwave (about 2.45 GHz), ICP (inductively coupled plasma) using RF (13.56 MHz), helicon wave plasma, etc. to generate high density plasma in the chamber. For this reason, a high vacuum is required, so a turbo molecular pump is used for the vacuum pump, a high bias voltage is applied from the substrate side, and an electrostatic chuck and a cooling means (for example He) are used for cooling this.

Note that high density catalytic CVD is obtained by appropriately combining high density plasma CVD and catalytic CVD.

Further, in the concrete embodiments, by changing the time and timing of introduction of the carrier gas and the material gas as mentioned above, the film is formed with the desired quality and speed.

Concrete Embodiment 1

As a concrete embodiment 1, an embodiment of a process of production of a top gate type polycrystalline silicon CMOSTFT is shown. For fabricating the top gate type polycrystalline silicon CMOSTFT, as shown in FIG. 42, first, using catalytic CVD, hydrogen gas as the carrier gas is fed in at least a TFT forming region on the insulating substrate 10 and the thermal catalyst is heated to a state enabling the catalytic action so as to form a silicon nitride film 11, a silicon oxide film 12 for the protective films, a polycrystalline silicon film 13 and a silicon oxide film 14 for the gate insulating film. Note that, when forming at least the polycrystalline silicon film 13 and the silicon oxide film 14 for the gate insulating film, they are continuously formed.

The material of the substrate 10 is selected according to the substrate temperature in the TFT formation step. When catalytic CVD is employed, the substrate temperature in the step of forming the polycrystalline silicon film and the insulating film is maintained at a relatively low temperature of about 300 to 400° C. For this reason, when the substrate temperature enables a glass substrate such as borosilicate glass and aluminosilicate glass to be used in the TFT formation system, use can be made of a borosilicate glass substrate and an aluminosilicate glass substrate. At this time, it is possible to form the substrate relatively large from the viewpoint of cost. For example, it may be formed to a size of 500×600 mm and a thickness of 0.5 to 1.1 mm.

Note that, when the substrate temperature becomes a relatively high temperature of about 800 to 1000° C. in the TFT forming step, use is made of a heat resistant glass substrate such as quartz glass and crystallized glass. The heat resistant glass substrate is formed for example to a diameter of 6 to 12 inch and a thickness of 700 to 800 $\mu$m.

Next, an explanation will be made of the process of fabrication of a top gate type polycrystalline silicon CMOSTFT comprising a first step to a 13th step.

First, in the first step, the substrate 10 is disposed in the chamber 1, the exhaust system 1a is operated to evacuate the interior of the chamber 1 up to a predetermined pressure and, at the same time, the heater 2a built in the suscepter 2 is operated to heat the substrate 10 up to a predetermined temperature (200 to 300° C.). Then, 150 SCCM of hydrogen gas serving as the carrier gas is fed into the chamber 1. The hydrogen gas is activated by contact with the thermal catalyst 5. Part becomes activated hydrogen H* which cleans the surface of the substrate 10. Note that, in all of embodiments 1 to 9, the gas pressure by the feed of hydrogen-based carrier gas and the material gas is set at approximately 10 Pascal.

Accordingly, it is also possible to set constant or change the mixing ratio of hydrogen-based carrier gas and the material gas constant and set the gas pressure relatively low to form a fine film or conversely to set the gas pressure relatively high to achieve a higher speed of film formation. Note, needless to say this gas pressure range is limited according to the formed film quality and the device performance.

Next, the silicon nitride film 11 for the protective film is formed in a second step. A material gas obtained by mixing 50 SCCM of ammonia with 15 SCCM of monosilane is introduced into the chamber 1 with hydrogen gas fed thereto. In the chamber 1, the introduced gas forms the silicon nitride film 11 for the protective film on one main surface of the substrate 10 via the thermal catalyst 5. In the present example, the silicon nitride film 11 is formed to 100 to 200 nm.

At this time, in order to raise the ratio of the material gas in the chamber 1, it is also possible to control the mass flow controller M to reduce or stop the feed of hydrogen gas in the middle of the film formation and thereby form the silicon nitride film 11 at a high speed.

The silicon nitride film 11 for the protective film is formed so as to stop the Na ions from the substrate 10 when using a glass substrate as the substrate 10. It is not necessary when using synthetic quartz glass as the substrate 10.

Next, in a third step, the silicon oxide film 12 for the protective film is formed. When the hydrogen gas is reduced or stopped in the second step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane serving as the material gas is introduced into the chamber 1. In the chamber 1, the introduced gas forms a silicon oxide film 12 for the protective film on the substrate 10 via the thermal catalyst 5. In the present example, the silicon oxide film 12 is formed to 50 to 100 nm.

At this time, in order to raise the ratio of the material gas in the chamber 1, it is also possible to control the mass flow controller M to reduce or stop the feed of hydrogen gas in the middle of the film formation and thereby form the silicon oxide film 12 at a high speed.

Further, in a fourth step, the polycrystalline silicon film 13 is formed.

Note that, if the system is constituted so that hydrogen gas serving as the carrier gas is fed into the chamber 1 before the formation of the polycrystalline silicon film 13 and the surface is cleaned by the activated hydrogen H* before the formation of the film without fail, it becomes possible to reliably obtain a high quality polycrystalline silicon film.

When forming the polycrystalline silicon film 13, when the hydrogen gas is reduced or stopped in the third step, 150 SCCM of hydrogen gas serving as the carrier gas is introduced into the chamber 1. Further, 15 SCCM of monosilane is introduced as the material gas into the chamber 1. In the chamber 1, the introduced gas forms the polycrystalline silicon film 13 on the substrate 10 via the thermal catalyst 5. The polycrystalline silicon film 13 of the present example is formed to 40 to 60 nm.

At this time, according to need, by mixing N-type phosphorus or arsenic or antimony etc. to the silane-based gas (monosilane ($SiH_4$), disilane ($Si_2H_6$), trisilane ($Si_3H_8$), etc.) of the material gas in an adequate amount or mixing P-type boron in an adequate amount, a polycrystalline silicon film having any N- or P-type impurity carrier concentration can be formed.

In the case of the N-type, for example, phosphine ($PH_3$), arsine ($AsH_3$), and stibine ($SbH_3$) are employed, while in the case of the P-type, for example diborane ($B_2H_6$) is employed.

At this time, in order to raise the ratio of the material gas in the chamber 1, it is also possible to control the mass flow controller M to reduce or stop the feed of hydrogen gas in the middle of the film formation to thereby form the polycrystalline silicon film 13 at a high speed.

When the polycrystalline silicon film 13 is formed, as a fifth step, the silicon oxide film 14 for the gate insulating film is formed. When hydrogen gas is reduced or stopped in the fourth step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced. In the chamber 1, the introduced gas forms the silicon oxide film 12 for the protective film on the substrate 10 to a predetermined thickness via the thermal catalyst 5.

Further, according to need, it is possible to cut the helium diluted oxygen (He diluted $O_2$), mix ammonia with an appropriate ratio, and form a silicon nitride film 15 having a predetermined thickness.

At this time, in order to raise the ratio of the material gas in the chamber 1, it is possible to control the mass flow controller M to reduce or stop the feed of hydrogen gas in the middle of the film formation and thereby form the silicon oxide film 14 and the silicon nitride film 15 at a high speed. At this time, it is better if the polycrystalline silicon film and the silicon oxide film of the gate insulating film are continuously formed.

Note that, after the film formation, the material gas is cut, the thermal catalyst is cooled to a temperature that does not cause a problem, and the introduction of the carrier gas is stopped.

In this way, a polycrystalline silicon layer having a thickness of 40 to 60 nm is formed on the insulating substrate 10. Then, a MOSTFT using a polycrystalline silicon layer as the channel region is fabricated.

Figure 43:
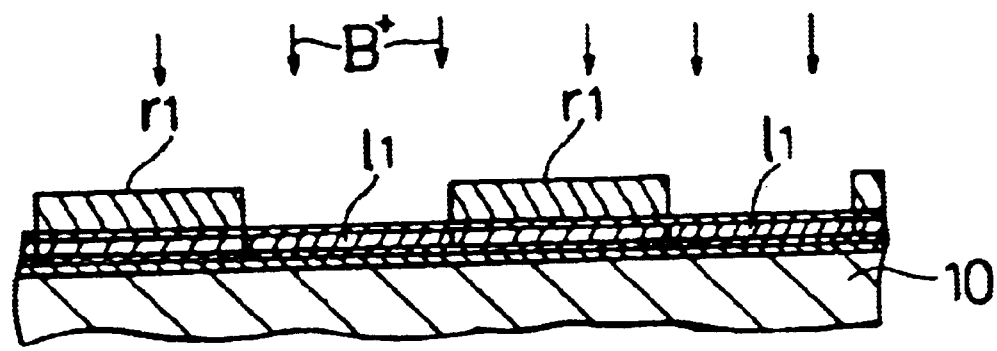
FIG. 43 is an explanatory view of a process of a thin film forming method and a process of production of a thin film semiconductor in the embodiment of the present invention.

As a sixth step, as shown in FIG. 43, in order to control the impurity concentration of the channel region for the N-channel MOSTFT, the P-channel MOSTFT is masked by a photoresist $r_1$, P-type impurity ions (for example boron ions $B^+$ of boron difluoride ($BF_2$)) are implanted with for example a dosage of $5 \times 10^{13}$ atoms/cm$^2$ at 30 keV to obtain a silicon layer 11 wherein the conductivity type of the polycrystalline silicon layer has become the P-type.

Figure 44:
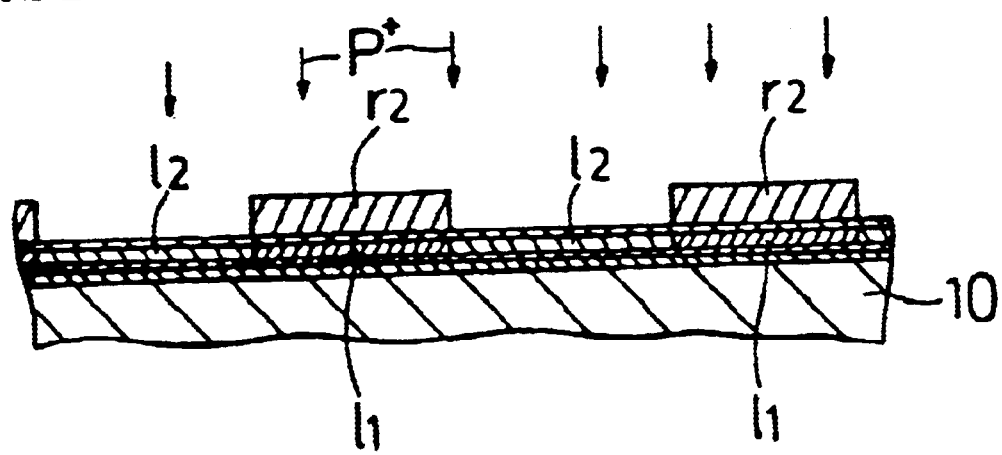
FIG. 44 is an explanatory view of a process of a thin film forming method and a process of production of a thin film semiconductor in the embodiment of the present invention.

Then, as a seventh step, as shown in FIG. 44, in order to control the impurity concentration of the channel region for the P-channel MOSTFT, the N-channel MOSTFT is masked by a photoresist $r_2$ this time and N-type impurity ions (for example phosphorus ions $P^+$) are implanted with for example a dosage of $5 \times 10^{13}$ atoms/cm$^2$ at 50 keV to obtain a silicon layer 12 wherein the conductivity type of the polycrystalline silicon layer has become the N-type.

Figure 45:
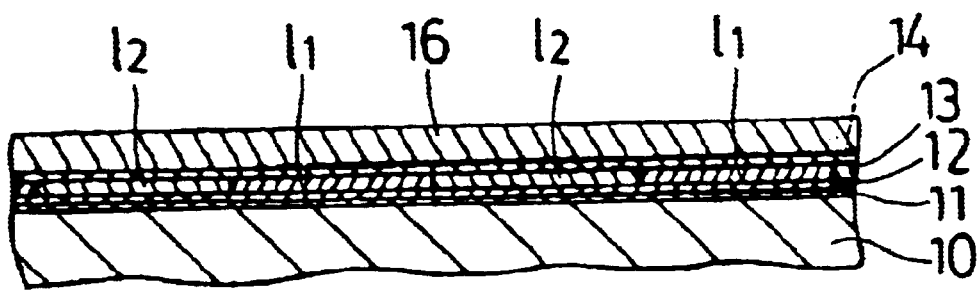
FIG. 45 is an explanatory view of a process of a thin film forming method and a process of production of a thin film semiconductor in the embodiment of the present invention.

Then, in an eighth step, as shown in FIG. 45, a molybdenum/tantalum alloy film 16 having a high heat resistance as the gate electrode material is deposited to for example a thickness of 400 nm by sputtering.

Figure 46:
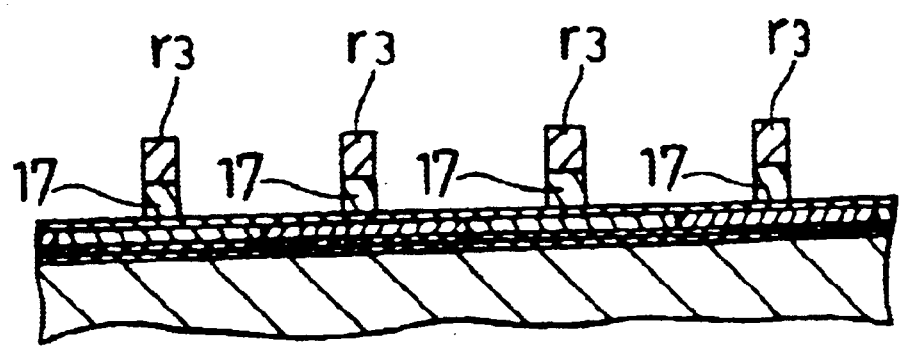
FIG. 46 is an explanatory view of a process of a thin film forming method and a process of production of a thin film semiconductor in the embodiment of the present invention.

Then, in a ninth step, as shown in FIG. 46, a photoresist $r_3$ is formed in a predetermined pattern, the molybdenum/tantalum alloy film 16 is patterned to the shape of a gate electrode 17 by using this as the mask, and further the photoresist $r_3$ is removed.

Figure 47:
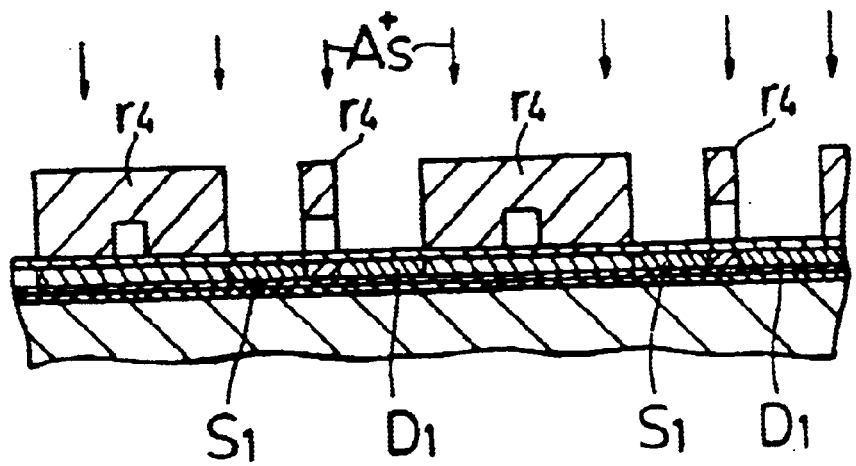
FIG. 47 is an explanatory view of a process of a thin film forming method and a process of production of a thin film semiconductor in the embodiment of the present invention.

Then, in a 10th step, as shown in FIG. 47, the P-channel MOSTFT and the gate electrode 17 are masked by a photoresist $r_4$ and for example $As^+$ ions are implanted as the N-type impurity with for example a dosage of $1 \times 10^{15}$ atoms/cm$^2$ at 70 keV. The photoresist is peeled off, then the surface is activated by RTA (rapid thermal annealing) for 10 seconds to 20 seconds at about 1000° C. in $N_2$ to form an $N^+$ type source region $S_1$ and drain region $D_1$ of the N-channel MOSTFT. Note that, it is possible to perform this RTA together with the activation of the P-channel MOSTFT.

Figure 48:
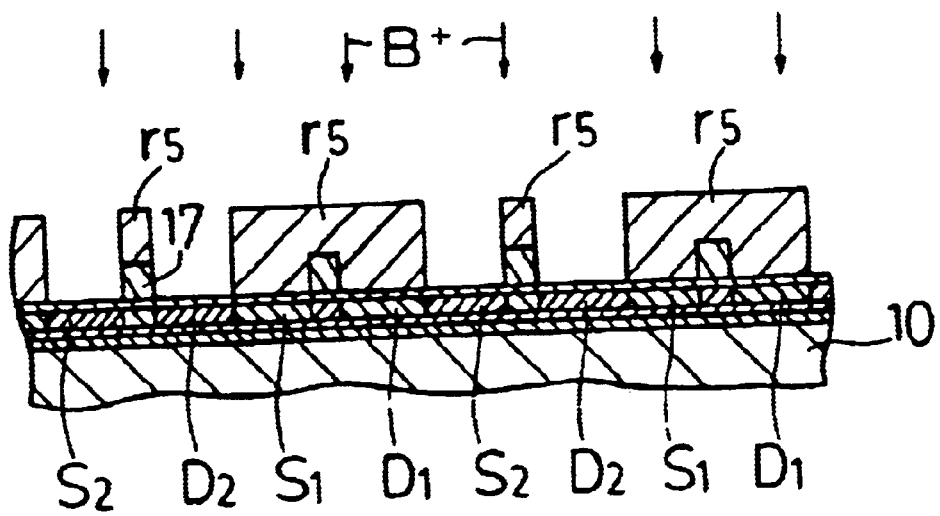
FIG. 48 is an explanatory view of a process of a thin film forming method and a process of production of a thin film semiconductor in the embodiment of the present invention.

Then, in an 11th step, as shown in FIG. 48, the N-channel MOSTFT and the gate electrode 17 are masked by a photoresist $r_5$ and for example $B^+$ ions are implanted as the P-type impurity with for example a dosage of $1 \times 10^{15}$ atoms/cm$^2$ at 30 keV. The photoresist is peeled off, then the surface is activated by RTA (rapid thermal annealing) for 10 seconds to 20 seconds at about 1000° C. in $N_2$ to form a $P^+$ type source region $S_2$ and drain region $D_2$ of the P-channel MOSTFT.

Figure 49:
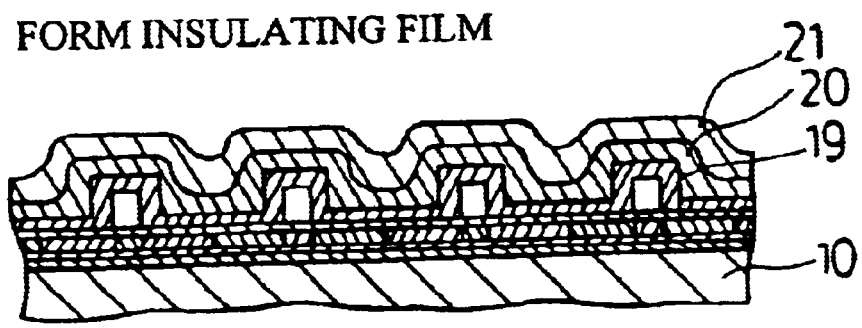
FIG. 49 is an explanatory view of a process of a thin film forming method and a process of production of a thin film semiconductor in the embodiment of the present invention.

Then, in a 12th step, as shown in FIG. 49, a silicon oxide film 19 is formed on the entire surface by catalytic CVD to a thickness of for example 50 to 100 nm, a phosphosilicate glass (PSG) film 20 is formed to a thickness of for example 200 to 300 nm, and a silicon nitride film 21 is formed a thickness of 100 to 200 nm.

Figure 50:
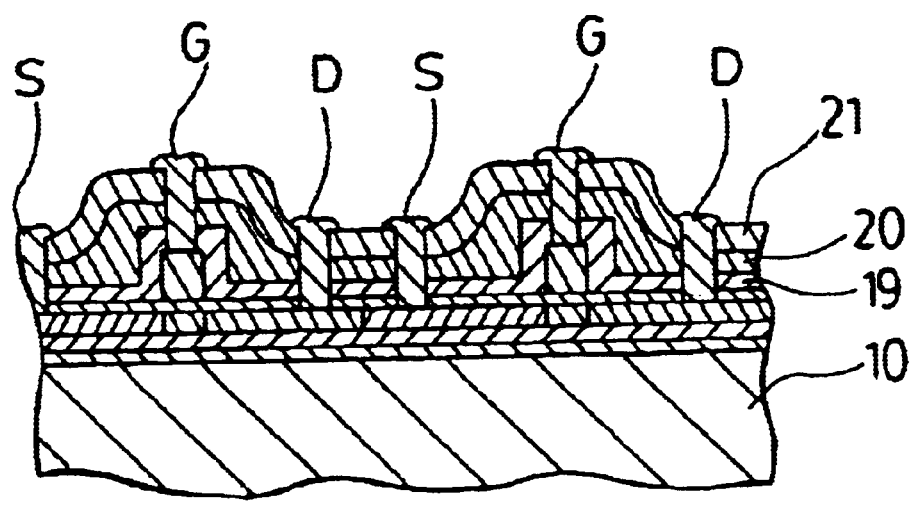
FIG. 50 is an explanatory view of a process of a thin film forming method and a process of production of a thin film semiconductor in the embodiment of the present invention.

Then, in the 13th step, as shown in FIG. 50, contact windows are formed at predetermined positions of the insulating film, an electrode material such as aluminum is deposited to a thickness of 1 $\mu$m at 150° C. by sputtering or the like on the entire surface including the holes, this is patterned to form a source or drain electrode S or D and a gate takeout electrode or an interconnection G of each of the P-channel MOSTFT and the N-channel MOSTFT, and the result is sintered in a forming gas ($N_2+H_2$) at 400° C. for 1 hour to enhance the ohmic contact and surface level and thus complete the MOSTFTs.

Concrete Embodiment 2

Further, as a concrete embodiment 2, an explanation will be made of an embodiment of a process of production of a bottom gate type polycrystalline silicon CMOSTFT. In order to fabricate a bottom gate type polycrystalline silicon CMOSTFT, a sputter film (300 to 400 nm thick) of a molybdenum/tantalum alloy having a high heat resistance is formed in at least the TFT forming region of the substrate to form the bottom gate electrode. The bottom gate electrode is tapered by etching of 25 to 45 degrees by general purpose photolithography and etching.

Next, by catalytic CVD, hydrogen gas serving as the carrier gas is fed and the thermal catalyst heated to a state enabling a catalytic action to thereby form a silicon nitride film for the protective film, a silicon oxide film for the gate insulating film, a polycrystalline silicon film, and a silicon oxide film for the protective film. Note that, when forming at least the polycrystalline silicon film and the silicon oxide film for the gate insulating film, they are continuously formed.

The material of the substrate 10 is selected according to the substrate temperature in the TFT forming step. When catalytic CVD is employed, the substrate temperature in the polycrystalline silicon film and insulating film forming step is maintained at a relatively low temperature of about 300 to 400° C. For this reason, when the substrate temperature enables the use of a glass substrate such as borosilicate glass and aluminosilicate glass in the TFT forming system, use can be made of borosilicate glass substrate and aluminosilicate glass substrate. At this time, it is possible to form the substrate relatively large from the viewpoint of cost. For example, it is formed to a size of 500×600 mm and a thickness of 0.5 to 1.1 mm.

Note that, in the TFT forming step, when the substrate temperature becomes a relatively high temperature of about 800 to 1000° C., use is made of a heat resistant glass substrate such as quartz glass and crystallized glass. The heat resistant glass substrate is formed for example to a diameter of 6 to 12 inch and a thickness of 700 to 800 $\mu$m.

A more detailed explanation will be made next of the process of fabrication of a bottom gate type polycrystalline silicon CMOSTFT.

First, in the first step, a sputter film of 300 to 400 nm of a molybdenum/tantalum alloy is formed in at least the TFT region of the substrate 10. Then, this is tapered by etching of 20 to 45 degrees to form a bottom gate electrode by general purpose photolithography and etching.

Then, in the second step, the substrate 10 is disposed in the chamber 1, the exhaust system 1a is operated to evacuate the interior of the chamber 1 up to a predetermined pressure and, at the same time, the heater 2a built in the suscepter 2 is operated to heat the substrate 10 up to a predetermined temperature. Then, 150 SCCM of hydrogen gas serving as the carrier gas is fed into the chamber 1. Part of the hydrogen gas is activated by contact with the thermal catalyst 5, becomes activated hydrogen H*, and cleans the surface of the substrate 10.

Then, in the third step, the silicon nitride film for the protective film is formed. The material gas obtained by mixing 50 SCCM of ammonia with 15 SCCM of monosilane is introduced into the chamber 1 with hydrogen gas fed thereto. In the chamber 1, the introduced gas forms the silicon nitride film for the protective film on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation and thereby form the silicon nitride film at a high speed.

The silicon nitride film 11 for the protective film is formed so as to stop the Na ions from the substrate 10 when using a glass substrate as the substrate 10. It is not necessary when using synthetic quartz glass as the substrate 10.

Then, in the fourth step, the silicon oxide film for the bottom gate insulating film is formed. When hydrogen gas is reduced or stopped in the third step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced into the chamber 1. In the chamber 1, the introduced gas forms a silicon oxide film for the gate insulating film on the substrate 10 via the thermal catalyst 5. In the present example, the silicon oxide film is formed to 50 to 100 nm.

At this time, in order to raise the ratio of the material gas in the chamber 1, it is possible to control the mass flow controller M to reduce or stop the feed of hydrogen gas in the middle of the film formation to form the silicon oxide film at a high speed.

Then, in the fifth step, a polycrystalline silicon film is formed.

Note that, if the system is constituted so that hydrogen gas serving as the carrier gas is fed into the chamber 1 before the formation of the polycrystalline silicon film, and the surface is cleaned by activated hydrogen H* before the film formation without fail, it becomes possible to reliably obtain a high quality polycrystalline silicon film.

When forming the polycrystalline silicon film, when hydrogen gas is reduced or stopped in the fourth step, 150 SCCM of hydrogen gas serving as the carrier gas is introduced into the chamber 1. Further, 15 SCCM of monosilane as the material gas is introduced. In the chamber 1, the introduced gas forms the polycrystalline silicon film on the substrate 10 via the thermal catalyst 5. The polycrystalline silicon film of the present example is formed to 40 to 60 nm.

At this time, according to need, by mixing N-type phosphorus or arsenic or antimony etc. to a silane-based gas (monosilane, disilane, trisilane, etc.) of the material gas in an adequate amount or mixing P-type boron in an adequate amount, a polycrystalline silicon film having any N- or P-type impurity carrier concentration can be formed.

In the case of the N-type, for example, phosphine, arsine, and stibine are employed, while in the case of the P-type, for example, diborane is employed.

At this time, in order to raise the ratio of the material gas in the chamber 1, it is possible to control the mass flow controller M to reduce or stop the feed of hydrogen gas in the middle of the film formation to form the polycrystalline silicon film at a high speed. At this time, it is better if at least the silicon oxide film of the gate insulating film and the polycrystalline silicon film are continuously formed.

When the polycrystalline silicon film is formed, as the sixth step, the silicon oxide film for the protective film of 50 to 60 nm is formed. When the hydrogen gas is reduced or stopped in the fifth step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced.

At this time, in order to raise the ratio of the material gas in the chamber 1, it is possible to reduce or stop the feed of hydrogen gas in the middle of the film formation to form the silicon oxide film at a high speed.

Note that, after the film formation, the material gas is cut, the thermal catalyst is cooled to a temperature that does not cause a problem, and the introduction of the carrier gas is stopped.

In this way, a polycrystalline silicon layer having a thickness of 40 to 60 nm is formed on the insulating substrate 10. Then, a MOSTFT using a polycrystalline silicon layer as a channel region is fabricated by a method the same as that of the concrete embodiment 1.

Concrete Embodiment 3

As a concrete embodiment 3, an explanation will be made of an example of a process of production of a dual gate type polycrystalline silicon CMOSTFT. For a dual gate type polycrystalline silicon CMOSTFT, a sputter film of a molybdenum/tantalum alloy having a high heat resistance is formed in at least the TFT forming region on the substrate to a thickness of about 300 to 400 nm so as to form the bottom gate electrode.

The bottom gate electrode is tapered by etching of 25 to 45 degrees by general purpose photolithography and etching.

Next, hydrogen gas serving as the carrier gas is fed by catalytic CVD and the thermal catalyst is heated to a state enabling the catalytic action to form the silicon nitride film for the protective film, the silicon oxide film for the bottom gate insulating film, the polycrystalline silicon film, and the silicon oxide film and the silicon nitride film for the top gate insulating films. Note that, when forming at least the polycrystalline silicon film and the silicon oxide film for the gate insulating film, they are continuously formed.

The material of the substrate is selected according to the substrate temperature in the TFT forming step. When catalytic CVD is employed, the substrate temperature in the polycrystalline silicon film and insulating film forming step is maintained at a relatively low temperature of about 300 to 400° C. For this reason, when the substrate temperature enables use of a glass substrate such as borosilicate glass and aluminosilicate glass in a TFT forming system, use can be made of a borosilicate glass substrate and aluminosilicate glass substrate. At this time, it is possible to form the substrate relatively large from the viewpoint of cost. For example, it is formed to a size of 500×600 mm and a thickness of 0.5 to 1.1 mm.

Note that, when the substrate temperature in the TFT forming step becomes a relatively high temperature of about 800 to 1000° C., use is made of a heat resistant glass substrate such as quartz glass and crystallized glass. The heat resistant glass substrate is formed for example to a diameter of 6 to 12 inch and a thickness of 700 to 800 $\mu$m.

Next, an explanation will be made of the process of fabrication of a dual gate type polycrystalline silicon CMOSTFT.

First, in the first step, a sputter film of 300 to 400 nm of a molybdenum/tantalum alloy is formed in at least the TFT region of the substrate 10. Then, this is tapered by etching of 20 to 45 degrees by general purpose photolithography and etching to form the bottom gate electrode.

Then, in the second step, the substrate 10 is disposed in the chamber 1, the exhaust system 1a is operated to evacuate the interior of the chamber 1 up to a predetermined pressure and, at the same time, the heater 2a built in the susceptor 2 is operated to heat the substrate 10 up to a predetermined temperature. Then, 150 SCCM of hydrogen gas serving as the carrier gas is fed into the chamber 1. Part of the hydrogen gas is activated by contact with the thermal catalyst 5 and becomes activated hydrogen H* which cleans the surface of the substrate 10.

Then, in the third step, the silicon nitride film for the protective film is formed. A material gas obtained by mixing 50 SCCM of ammonia with 15 SCCM of monosilane is introduced into the chamber 1 with hydrogen gas fed thereto. In the chamber 1, the introduced gas forms a silicon nitride film for the protective film on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation to form the silicon nitride film at a high speed.

The silicon nitride film for the protective film is formed so as to stop the Na ions from the substrate 10 when using a glass substrate as the substrate 10. It is not necessary when using synthetic quartz glass as the substrate 10.

Then, in the fourth step, the silicon oxide film for the bottom gate insulating film is formed. When hydrogen gas is reduced or stopped in the third step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced into the chamber 1. In the chamber 1, the introduced gas forms the silicon oxide film for the bottom gate insulating film on the substrate 10 via the thermal catalyst 5. In the present example, the silicon oxide film is formed to 50 to 100 nm.

At this time, in order to raise the ratio of the material gas in the chamber 1, it is possible to control the mass flow controller M to reduce or stop the feed of hydrogen gas in the middle of the film formation to form the silicon oxide film at a high speed.

Then, in the fifth step, the polycrystalline silicon film is formed.

Note that, if the system is constituted so that hydrogen gas serving as the carrier gas is fed into the chamber 1 before the formation of the polycrystalline silicon film, and the surface is cleaned by the activated hydrogen H* before the film formation without fail, it becomes possible to reliably obtain a high quality polycrystalline silicon film.

When forming the polycrystalline silicon film, when hydrogen gas is reduced or stopped in the fourth step, 150 SCCM of hydrogen gas serving as the carrier gas is introduced into the chamber 1. Further, 15 SCCM of monosilane is introduced as the material gas. In the chamber 1, the polycrystalline silicon film is formed on the substrate 10 by the introduced gas via the thermal catalyst 5. The polycrystalline silicon film of the present example is formed to 40 to 60 nm.

At this time, according to need, by mixing the N-type phosphorus or arsenic or antimony etc. with the silane-based gas (monosilane, disilane, trisilane, etc.) of the material gas in an adequate amount or mixing P-type boron in an adequate amount, a polycrystalline silicon film having any N- or P-type impurity carrier concentration can be formed.

In the case of the N-type, for example, phosphine, arsine, and stibine are employed, while in the case of the P-type, for example, diborane is employed.

At this time, in order to raise the ratio of the material gas in the chamber 1, it is possible to control the mass flow controller M to reduce or stop the feed of hydrogen gas in the middle of the film formation to form the polycrystalline silicon film at a high speed. Note, by forming the film at a low speed in the initial stage of the film formation, desirably the formation of the transition layer of the amorphous silicon at the interface with the silicon oxide film is prevented.

When the polycrystalline silicon film is formed, as the sixth step, the silicon oxide film for the top gate insulating film of the thickness of 50 to 100 nm is formed. When hydrogen gas is reduced or stopped in the fifth step, 150 SCCM of hydrogen gas serving as the carrier gas is introduced into the chamber 1. Further, a gas obtained by mixing monosilane as the material gas and 1 to 2 SCCM of helium diluted oxygen (He diluted $O_2$) is introduced. In the chamber 1, the introduced gas forms the silicon oxide film for the top gate insulating film on the substrate 10 to a predetermined thickness via the thermal catalyst 5. Further, according to need, it is possible to cut the helium-diluted oxygen (He diluted $O_2$), mix ammonia into monosilane with an appropriate ratio, and continuously form a silicon nitride film having a predetermined thickness.

At this time, in order to raise the ratio of the material gas in the chamber 1, it is possible to control the mass flow controller M to reduce or stop the feed of hydrogen gas in the middle of the film formation by controlling the mass flow controller M to form the silicon oxide film and the silicon nitride film at a high speed.

In this way, silicon is formed into a film as a polycrystalline silicon film of for example 40 to 60 nm.

Note that, after the film formation, the material gas is cut, the thermal catalyst is cooled to a temperature that does not cause a problem, and the introduction of the carrier gas is stopped.

Then, as the seventh step, a sputter film of a molybdenum/tantalum alloy is formed on the silicon oxide film for the top gate insulating film, and the top gate electrode is formed by general purpose photolithography and etching.

Then, by a similar method to that of the concrete embodiment 1, a MOSTFT using a polycrystalline silicon layer as a channel region is fabricated.

Concrete Embodiment 4

As a concrete embodiment 4, an embodiment of the process of production of a top gate type single crystalline silicon CMOSTFT will be shown. In order to fabricate the top gate type single crystalline silicon CMOSTFT, steps having appropriate shape and dimension are formed in at least the TFT forming region of the substrate 10, the semiconductor film and the gate insulating film are continuously formed by catalytic CVD, and a film is graphoepitaxially grown by using the steps as the seeds. In this way, when forming at least the polycrystalline silicon film and the silicon oxide film for the gate insulating film, hydrogen gas serving as the carrier gas is fed, the thermal catalyst is heated to a state enabling the catalytic action, and the film is continuously formed.

The material of the substrate 10 is selected according to the substrate temperature in the TFT formation step. When catalytic CVD is employed, the substrate temperature in the step of forming the polycrystalline silicon film and the insulating film is maintained at a relatively low temperature of about 300 to 400° C. For this reason, when the substrate temperature enables the use of a glass substrate such as borosilicate glass and aluminosilicate glass in the TFT forming system, use can be made of a borosilicate glass substrate and an aluminosilicate glass substrate. At this time, it is possible to form the substrate relatively large from the viewpoint of cost. For example, it is formed to a size of 500×600 mm and a thickness of 0.5 to 1.1 mm.

Note that, when the substrate temperature becomes a relatively high temperature of about 800 to 1000° C. in the TFT forming step, use is made of a heat resistant glass substrate such as quartz glass and crystallized glass. The heat resistant glass substrate is formed for example to a diameter of 6 to 12 inch and a thickness of 700 to 800 $\mu$m.

Next, an explanation will be made of the process of fabrication of a top gate type single crystalline silicon CMOSTFT comprising a first step to a 13th step.

First, in the first step, the substrate 10 is disposed in the chamber 1, the exhaust system 1a is operated to evacuate the interior of the chamber 1 up to a predetermined pressure and, at the same time, the heater 2a built in the suscepter 2 is operated to heat the substrate 10 up to a predetermined temperature. Then, 150 SCCM of hydrogen gas serving as the carrier gas is fed into the chamber 1. Part of the fed hydrogen gas is activated by contact with the thermal catalyst 5 and becomes the activated hydrogen H* which cleans the surface of the substrate 10.

Next, in the second step, as shown in FIG. 51, a photoresist $r_1$ is formed in a predetermined pattern on one main surface of the substrate 10, F$^+$ ions of for example a carbon tetrafluoride (CF$_4$) plasma are irradiated by using this as the mask, and a plurality of steps 10a are formed on the substrate 10 by reactive ion etching (RIE).

In this case, the steps 10a become the seeds at the time of grapho-epitaxial growth of the single crystalline silicon mentioned later and are formed to for example a depth d of 0.1 to 0.2 $\mu$m and a width w of 2.0 to 10.0 $\mu$m.

Then, in the third step, the photoresist $r_1$ is removed, then the silicon nitride film for the protective film is formed. A material gas obtained by mixing 50 SCCM of ammonia with 15 SCCM of monosilane is introduced into the chamber 1 with hydrogen gas fed thereto. In the chamber 1, the introduced gas forms the silicon nitride film for the protective film on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation to form the silicon nitride film at a high speed.

The silicon nitride film 11 for the protective film is formed so as to stop the Na ions from the substrate 10 when using a glass substrate as the substrate 10. It is not necessary when using synthetic quartz glass as the substrate 10.

Figure 52:
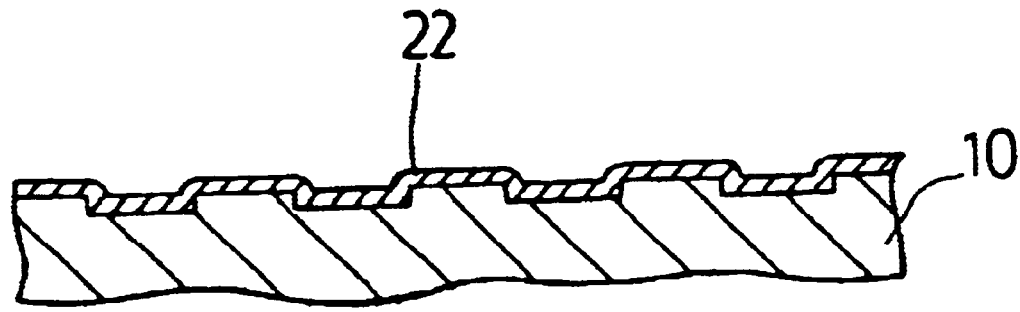
FIG. 52 is an explanatory view of a process of a thin film forming method and a process of production of a thin film semiconductor in the embodiment of the present invention.

Then, in the fourth step, as shown in FIG. 52, a single crystalline silicon film is formed on the substrate 10. When hydrogen gas is reduced or stopped in the third step, 150 SCCM of hydrogen gas serving as the carrier gas is introduced into the chamber 1. Further, 15 SCCM of monosilane as the material gas is introduced and the polycrystalline silicon film is formed on the substrate 10 by catalytic CVD. At this time, grapho-epitaxial growth is carried out by using the steps 10a as the seeds, and a single crystalline silicon film 22 is epitaxially grown to a thickness of several micrometers to 0.005 $\mu$m (for example 0.1 $\mu$m).

Note that, according to need, by mixing the N-type phosphorus or arsenic or antimony etc. to the silane-based gas (monosilane, disilane, trisilane, etc.) of the material gas in an adequate amount or mixing P-type boron in an adequate amount, a polycrystalline silicon film having any N- or P-type impurity carrier concentration can be formed.

In the case of the N-type, for example, phosphine, arsine, and stibine are employed, while in the case of the P-type, for example, diborane is employed.

The single crystalline silicon film 22 deposited on the substrate 10 is epitaxially grown. This is by the well known phenomenon referred to as grapho-epitaxy. The size of this single crystal becomes larger in proportion to the temperature and the time, but when the temperature and the time are set low and short, the interval of the steps 10a must be shortened. Further, by changing the shape of the steps 10a in various ways, the crystal orientation of the grown layer can be controlled.

At this time, in order to raise the ratio of the material gas in the chamber 1, it is possible to control the mass flow controller M to reduce or stop the feed of hydrogen gas in the middle of the film formation to form the single crystalline silicon film at a high speed.

Figure 53:
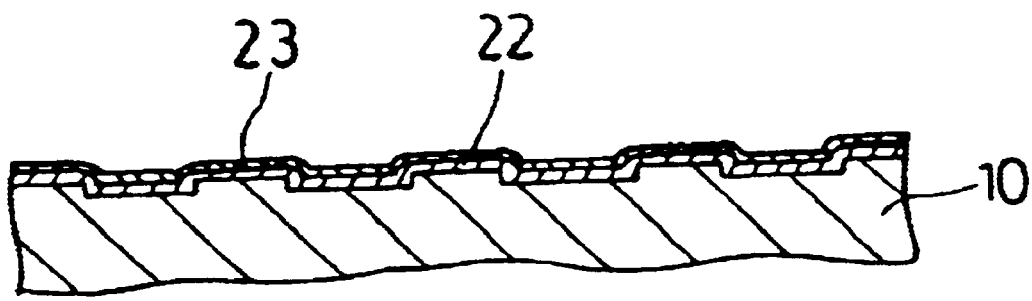
FIG. 53 is an explanatory view of a process of a thin film forming method and a process of production of a thin film semiconductor in the embodiment of the present invention.

When the single crystalline silicon film 22 is formed, as shown in FIG. 53, as the fifth step, a silicon oxide film 23 for the gate insulating film is formed. When hydrogen gas is reduced or stopped in the fourth step, 150 SCCM of hydrogen gas serving as the carrier gas is introduced into the chamber 1. Further, a gas obtained by mixing 1 to 2 SCCM of helium-diluted oxygen (He diluted O$_2$) with 15 SCCM of monosilane as the material gas is introduced. In the chamber 1, the introduced gas forms the silicon oxide film 23 for the gate insulating film on the substrate 10 via the thermal catalyst 5. Further, according to need, it is possible to cut the helium-diluted oxygen (He diluted O$_2$), mix ammonia with the appropriate ratio, and continuously form a silicon nitride film having a predetermined thickness.

At this time, in order to raise the ratio of the material gas in the chamber 1, it is possible to control the mass flow controller M to reduce or stop the feed of hydrogen gas in the middle of the film formation to form the silicon oxide film 23 and the silicon nitride film at a high speed.

Also, after the formation of the thin film, the material gas is cut, the thermal catalyst is cooled to a temperature that does not cause a problem, and the introduction of the carrier gas is stopped.

In this way, by catalytic CVD and grapho-epitaxy, the single crystalline silicon film 22 is deposited on the substrate 10. Then, a MOSTFT using a single crystalline silicon film as a channel region is fabricated.

Figure 54:
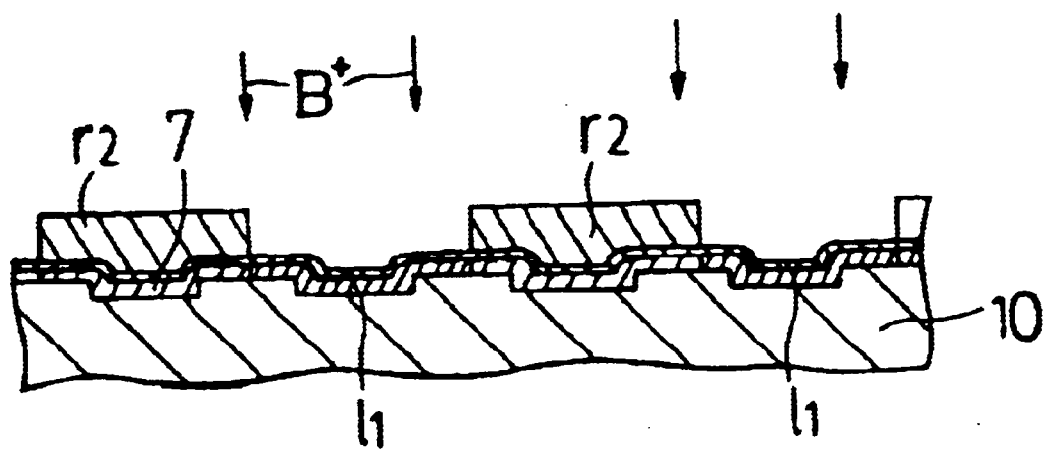
FIG. 54 is an explanatory view of a process of a thin film forming method and a process of production of a thin film semiconductor in the embodiment of the present invention.

As the sixth step, as shown in FIG. 54, in order to control the impurity concentration of the channel region for the N-channel MOSTFT, the P-channel MOSTFT is masked by the photoresist $r_2$ and P-type impurity ions (for example, boron ions B$^+$ of boron difluoride (BF$_2$)) are implanted with for example a dosage of 5×10$^{13}$ atoms/cm$^2$ at 30 keV to obtain a silicon layer 11 wherein the conductivity type of the single crystalline silicon film has become the P-type.

Figure 55:
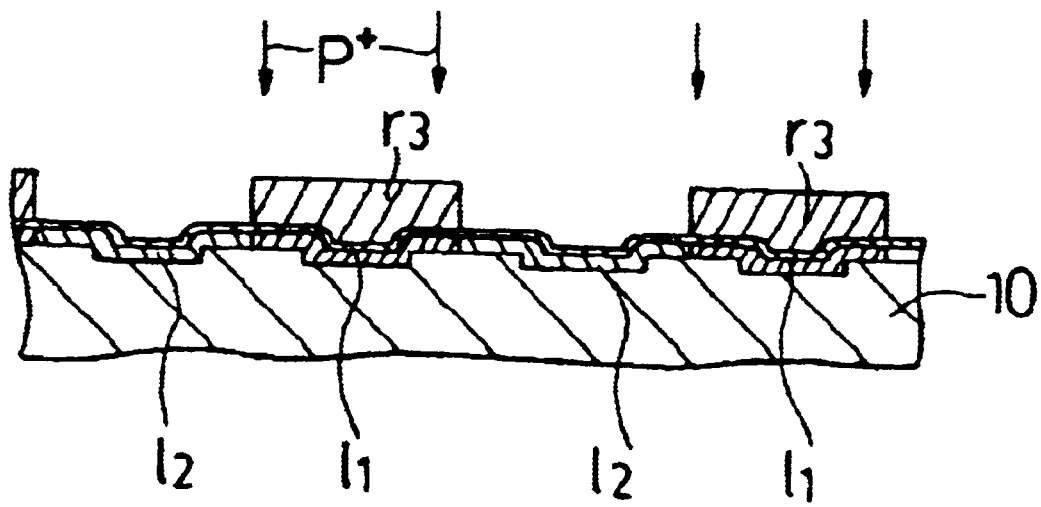
FIG. 55 is an explanatory view of a process of a thin film forming method and a process of production of a thin film semiconductor in the embodiment of the present invention.

Then, as the seventh step, as shown in FIG. 55, in order to control the impurity concentration of the channel region for the P-channel MOSTFT, the N-channel MOSTFT is masked by the photoresist $r_3$ this time and the N-type impurity ions (for example the phosphorus ions $P^+$) are implanted with for example a dosage of $5 \times 10^{13}$ atoms/cm$^2$ at 50 keV to obtain a silicon layer 12 wherein the conductivity type of the single crystalline silicon film has become the N-type.

Figure 56:
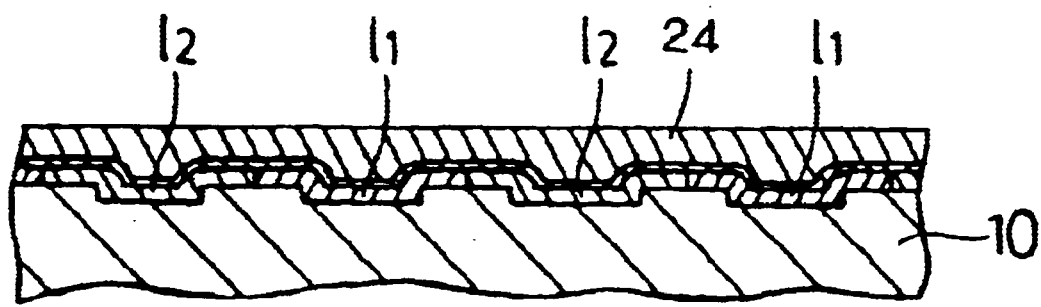
FIG. 56 is an explanatory view of a process of a thin film forming method and a process of production of a thin film semiconductor in the embodiment of the present invention.

Then, in the eighth step, as shown in FIG. 56, a molybdenum/tantalum alloy film 24 as the gate electrode material is deposited to a thickness of 400 nm by for example sputtering.

Figure 57:
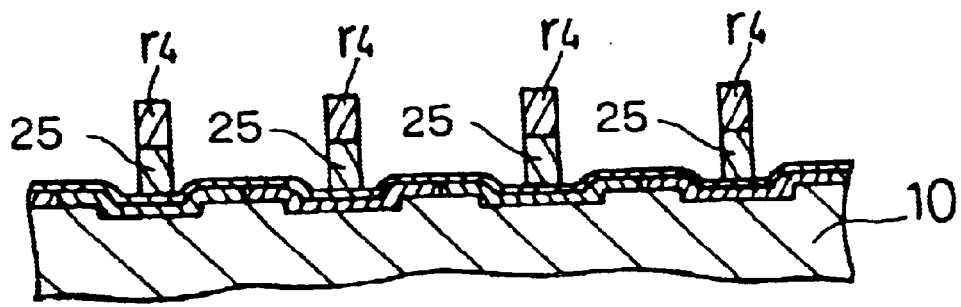
FIG. 57 is an explanatory view of a process of a thin film forming method and a process of production of a thin film semiconductor in the embodiment of the present invention.

Then, in the ninth step, as shown in FIG. 57, the photoresist $r_4$ is formed in a predetermined pattern, the molybdenum/tantalum alloy film 24 is patterned to the shape of a gate electrode 25 by using this as the mask, and the photoresist $r_4$ is removed.

Figure 58:
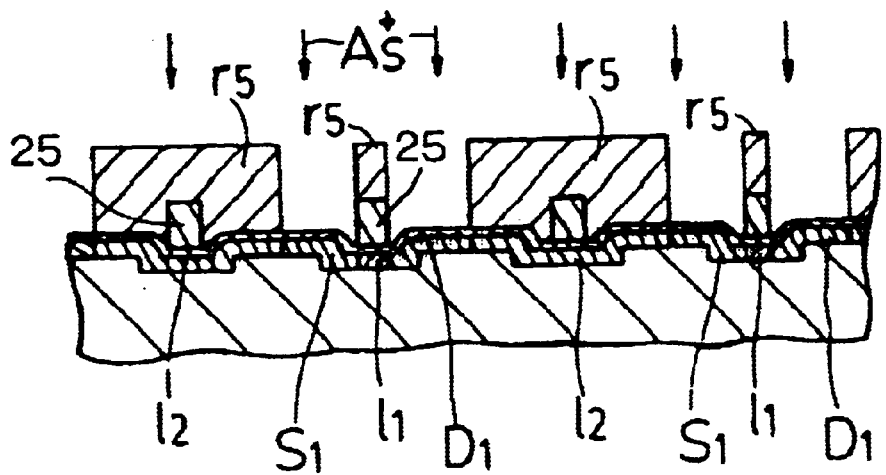
FIG. 58 is an explanatory view of a process of a thin film forming method and a process of production of a thin film semiconductor in the embodiment of the present invention.

Then, in the 10th step, as shown in FIG. 58, the P-channel MOSTFT and the gate electrode 25 are masked by the photoresist $r_5$, for example As$^+$ ions are implanted as the N-type impurity with for example a dosage of $1 \times 10^{15}$ atoms/cm$^2$ at 70 keV, the photoresist is removed, then the surface is activated by RTA (rapid thermal annealing) for 10 seconds to 20 seconds at about 1000° C. in $N_2$ to form the $N^{30}$ type source region $S_1$ and drain region $D_1$ of the N-channel MOSTFT.

Figure 59:
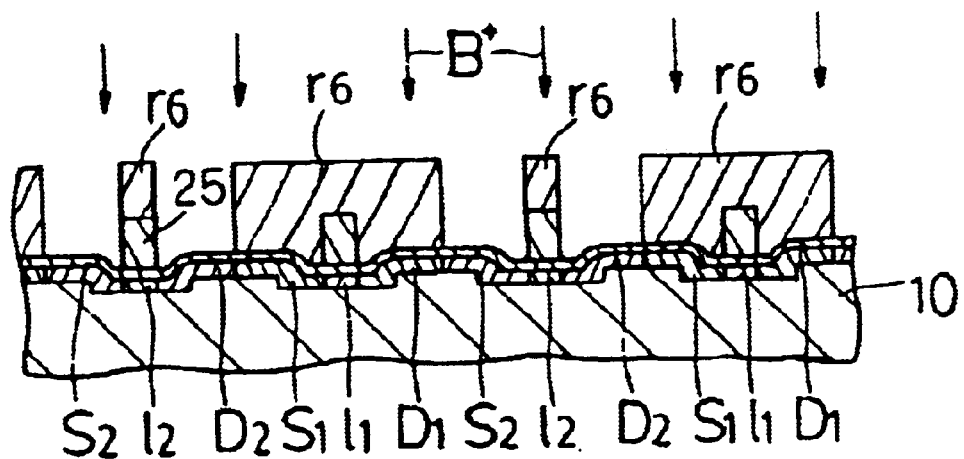
FIG. 59 is an explanatory view of a process of a thin film forming method and a process of production of a thin film semiconductor in the embodiment of the present invention.

Then, in the 11th step, as shown in FIG. 59, the N-channel MOSTFT and the gate electrode 25 are masked by a photoresist $r_6$, for example the B$^+$ ions are implanted as the P-type impurity with for example a dosage of $1 \times 10^{15}$ atoms/cm$^2$ at 30 keV, the photoresist is removed, then the surface is activated by RTA (rapid thermal annealing) for 10 seconds to 20 seconds at about 1000° C. in $N_2$ to form a $P^+$ type source region $S_2$ and drain region $D_2$ of the P-channel MOSTFT. Note that, in this RTA, it is possible to activate the N-channel MOSTFT together.

Figure 60:
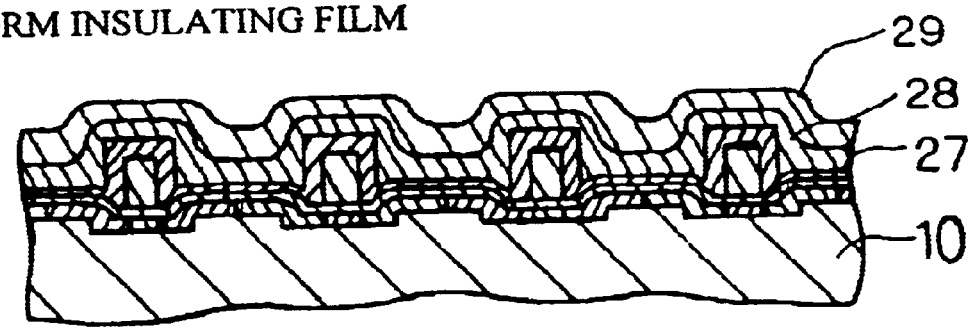
FIG. 60 is an explanatory view of a process of a thin film forming method and a process of production of a thin film semiconductor in the embodiment of the present invention.

Then, in the 12th step, as shown in FIG. 60, a silicon oxide film 27 is formed on the entire surface by CVD to a thickness of for example 50 to 100 nm, a phosphosilicate glass (PSG) film 28 is formed to a thickness of for example 200 to 300 nm, and a silicon nitride film 29 is formed to a thickness of for example 150 to 200 nm.

Figure 61:
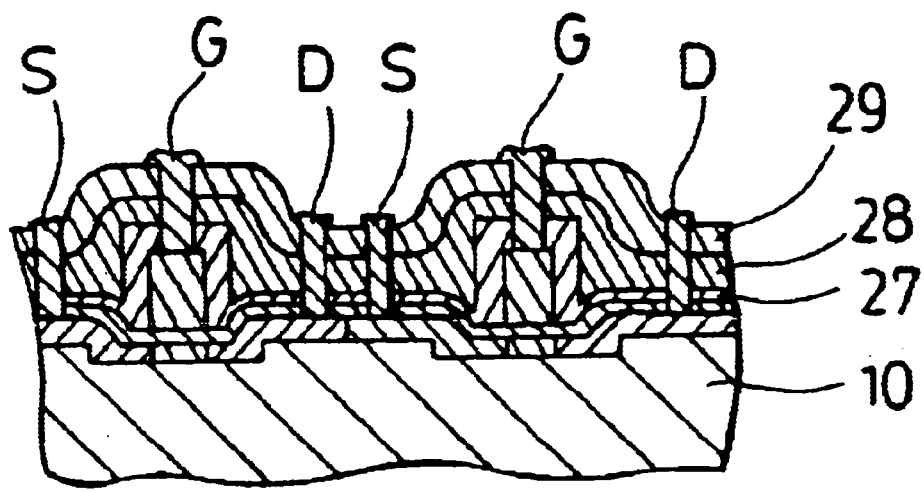
FIG. 61 is an explanatory view of a process of a thin film forming method and a process of production of a thin film semiconductor in the embodiment of the present invention.

Then, in the 13th step, as shown in FIG. 61, contact windows are formed at predetermined positions of the insulating film, an electrode material such as aluminum is deposited to a thickness of 1 μm at 150° C. by sputtering or the like on the entire surface including the holes, this is patterned to form the source or drain electrode S or D and the gate takeout electrode or the interconnection G of each of the P-channel MOSTFT and the N-channel MOSTFT, and the result is sintered in the forming gas ($N_2+H_2$) at 400° C. for 1 hour to enhance the ohmic contact and the surface level to fabricate each MOSTFT.

Concrete Embodiment 5

As a concrete embodiment 5, an embodiment of a process of production of a bottom gate type single crystalline silicon CMOSTFT is shown. In order to fabricate the bottom gate type single crystalline silicon CMOSTFT, a sputter film (300 to 400 nm thickness) of a molybdenum/tantalum alloy having a high heat resistance is formed in at least the TFT forming region of the substrate to form the bottom gate electrode. The bottom gate electrode is tapered by etching of 25 to 45 degrees by general purpose photolithography and etching.

Further, steps having the appropriate shapes and dimensions are formed in at least the TFT forming region of the substrate, using catalytic CVD, hydrogen gas serving as the carrier gas is fed or the thermal catalyst is heated to a state enabling the catalytic action to continuously form the semiconductor film (polycrystalline silicon film, amorphous silicon film, etc.) and the gate insulating film, and steps are used as seeds for grapho-epitaxially growth to form the single crystalline silicon film. In this way, at least the polycrystalline silicon film and the silicon oxide film for the gate insulating film are continuously formed.

The material of the substrate is selected according to the substrate temperature in the TFT forming step. When catalytic CVD is employed, the substrate temperature in the polycrystalline silicon film and insulating film forming step is maintained at a relatively low temperature of about 300 to 400° C. For this reason, when the substrate temperature enables a glass substrate such as borosilicate glass and aluminosilicate glass to be used in the TFT formation system, use can be made of a borosilicate glass substrate and an aluminosilicate glass substrate. At this time, it is possible to form the substrate relatively large from the viewpoint of cost. For example, it is formed to a size of 500×600 mm and a thickness of 0.5 to 1.1 mm.

Note that, when the substrate temperature in the TFT forming step becomes a relatively high temperature of about 800 to 1000° C., use is made of a heat resistant glass substrate such as quartz glass and crystallized glass. The heat resistant glass substrate is formed for example to a diameter of 6 to 12 inch and a thickness of 700 to 800 μm.

A further detailed explanation will be made of the process of fabrication of the bottom gate type single crystalline silicon CMOSTFT.

First, in the first step, a sputter film of 300 to 400 nm of a molybdenum/tantalum alloy is formed in at least the TFT region of the substrate 10. Then, the film is tapered by etching of 20 to 45 degrees to form a bottom gate electrode by general purpose photolithography and etching.

Then, in the second step, the substrate 10 is disposed in the chamber 1, the exhaust system 1a is operated to evacuate the interior of the chamber 1 up to a predetermined pressure and, at the same time, the heater 2a built in the suscepter 2 is operated to heat the substrate 10 up to a predetermined temperature. Then, hydrogen gas serving as the carrier gas is fed into the chamber 1. Part of the fed hydrogen gas is activated by contact with the thermal catalyst 5 and becomes activated hydrogen H* which cleans the surface of the substrate 10.

Then, in the third step, the silicon nitride film for the protective film is formed. The material gas obtained by mixing 50 SCCM of ammonia with 15 SCCM of monosilane is introduced into the chamber 1 with hydrogen gas fed thereto. In the chamber 1, the introduced gas forms the silicon nitride film for the gate insulating film on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation to form the silicon nitride film at a high speed.

The silicon nitride film 11 for the protective film is formed so as to stop the Na ions from the substrate 10 when using a glass substrate as the substrate 10. It is not necessary when using synthetic quartz glass as the substrate 10.

Then, in the fourth step, the silicon oxide film for the bottom gate insulating film is formed. When the hydrogen gas is reduced or stopped in the third step, 150 SCCM of hydrogen gas serving as the carrier gas is introduced into the chamber 1. Further, the material gas obtained by mixing 1 to 2 SCCM of helium-diluted oxygen (He diluted $O_2$) with 15 SCCM of monosilane as the material gas is introduced into the chamber 1. In the chamber 1, the introduced gas forms the silicon oxide film for the bottom gate insulating film on the substrate 10 via the thermal catalyst 5. In the present example, the silicon oxide film is formed to 50 to 100 nm.

At this time, in order to raise the ratio of the material gas in the chamber 1, it is possible to control the mass flow controller M to reduce or stop the feed of hydrogen gas in the middle of the film formation to form the silicon oxide film at a high speed.

Then, in the fifth step, the photoresist is formed in a predetermined pattern on one main surface of the substrate 10, the $F^+$ ions of for example the $CF_4$ plasma are irradiated by using this as a mask, and a plurality of steps are formed on the substrate 10 by reactive ion etching (RIE).

In this case, the steps become the seeds at the time of grapho-epitaxial growth of the single crystalline silicon mentioned later and may have a depth d of 0.1 to 0.2 μm and a width w of 2 to 3 μm.

After the removal of the photoresist, as the sixth step, a semi-crystalline silicon film is formed on the substrate 10. When the hydrogen gas is reduced or stopped in the fourth step, 150 SCCM of hydrogen gas serving as the carrier gas is introduced into the chamber 1. Further, 15 SCCM of monosilane as the material gas is introduced and the polycrystalline silicon film is formed on the substrate 10 by catalytic CVD. At this time, the grapho-epitaxial growth is carried out by using the steps 10a as the seeds, and a single crystalline silicon film is epitaxially grown to a thickness of several micrometers to 0.005 μm (for example 0.1 μm).

Note that, according to need, by mixing the N-type phosphorus or arsenic or antimony etc. to the silane-based gas (monosilane, disilane, trisilane, etc.) of the material gas in an adequate amount or mixing P-type boron in an adequate amount, a semi-crystalline silicon film having any N- or P-type impurity carrier concentration can be formed.

In the case of the N-type, for example, phosphine, arsine, and stibine are employed, while in the case of the P-type, for example, diborane is employed.

The single crystalline silicon film deposited on the substrate 10 is epitaxially grown. This is by the well known phenomenon referred to as grapho-epitaxy. The size of this single crystal becomes larger in proportion to the temperature and the time, but when the temperature and the time are set low and short, the interval of the steps must be shortened. Further, by changing the shape of the steps in various ways, the crystal orientation of the grown layer can be controlled.

At this time, in order to raise the ratio of the material gas in the chamber 1, it is possible to control the mass flow controller M to reduce or stop the feed of hydrogen gas in the middle of the film formation to form the single crystalline silicon film at a high speed.

When the single crystalline silicon film is formed, as the seventh step, a silicon oxide film for the protective film is formed. When the hydrogen gas is reduced or stopped in the sixth step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced. In the chamber 1, the introduced gas forms the silicon oxide film for the protective film on the substrate 10 via the thermal catalyst 5.

At this time, in order to raise the ratio of the material gas in the chamber 1, it is possible to control the mass flow controller M to reduce or stop the feed of hydrogen gas in the middle of the film formation to form the silicon oxide film at a high speed.

After the film formation, the material gas is cut, the thermal catalyst is cooled to a temperature that does not cause a problem, and the introduction of the carrier gas is stopped.

In this way, by catalytic CVD and the grapho-epitaxy, the single crystalline silicon film is deposited on the substrate 10. Then, a MOSTFT using the single crystalline silicon film as a channel region is fabricated out by a method similar to that of the concrete embodiment 4.

Note that, in the present example, the bottom gate electrode is fabricated in the second step, therefore, in the fabrication of the MOSTFT, the formation of the polycrystalline silicon layer for the gate electrode in the eighth step of the concrete embodiment 4, the formation of the gate electrode shape in the ninth step, and the formation of the oxide film onto the gate polycrystalline silicon surface become unnecessary.

Concrete Embodiment 6

As a concrete embodiment 6, the explanation will be made of an example of a process of production of a dual gate type single crystalline silicon CMOSTFT. For the dual gate type single crystalline silicon CMOSTFT, a sputter film of a molybdenum/tantalum alloy is formed in at least the TFT forming region on the substrate 10 to a thickness of about 300 to 400 nm to form the bottom gate electrode.

The bottom gate electrode is tapered by etching of 25 to 45 degrees by general purpose photolithography and etching. Further, steps having the appropriate shapes and dimensions are formed in at least the TFT forming region of the substrate, using catalytic CVD, hydrogen gas serving as the carrier gas is fed or the thermal catalyst is heated to a state enabling the catalytic action to continuously form the semiconductor film (polycrystalline silicon film, amorphous silicon film, etc.) and the gate insulating film, and the steps are used as seeds for grapho-epitaxially growth to form the single crystalline silicon film. In this way, at least the polycrystalline silicon film and the silicon oxide film for the gate insulating film are continuously formed.

In the same way as the concrete embodiments mentioned above, the material of the substrate 10 is selected according to the substrate temperature in the TFT forming step. When catalytic CVD is employed, the substrate temperature in the polycrystalline silicon film and insulating film forming step is maintained at a relatively low temperature of about 300 to 400° C. When the substrate temperature enables a glass substrate such as borosilicate glass and aluminosilicate glass to be used in the TFT formation system, use can be made of a borosilicate glass substrate and an aluminosilicate glass substrate. At this time, it is possible to form the substrate relatively large from the viewpoint of cost. For example, it is formed to a size of 500×600 mm and a thickness of 0.5 to 1.1 mm.

Note that, when the substrate temperature in the TFT forming step becomes a relatively high temperature of about 800 to 1000° C., use is made of a heat resistant glass substrate such as quartz glass and crystallized glass. The heat resistant glass substrate is formed for example to a diameter of 6 to 12 inch and a thickness of 700 to 800 μm.

A further detailed explanation will be made of the process of fabrication of the dual gate type single crystalline silicon CMOSTFT.

In the first step, in at least the TFT region of the substrate 10, a sputter film of 300 to 400 nm of a molybdenum/ tantalum alloy is formed. Then, the film is tapered by etching of 20 to 45 degrees to form the bottom gate electrode by general purpose photolithography and etching.

Then, in the second step, the substrate 10 is disposed in the chamber 1, the exhaust system 1a is operated to evacuate the interior of the chamber 1 up to a predetermined pressure and, at the same time, the heater 2a built in the suscepter 2 is operated to heat the substrate 10 up to a predetermined temperature. Then, hydrogen gas serving as the carrier gas is fed into the chamber 1. Part of the fed hydrogen gas is activated by contact with the thermal catalyst 5 and becomes activated hydrogen H* which cleans the surface of the substrate 10.

Then, in the third step, the silicon nitride film for the protective film is formed. A material gas obtained by mixing 50 SCCM of ammonia with 15 SCCM of monosilane is introduced into the chamber 1 with hydrogen gas fed thereto. In the chamber 1, the silicon nitride film for the protective film is formed by the introduced gas on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation to form the silicon nitride film at a high speed.

The silicon nitride film for the protective film is formed so as to stop the Na ions from the substrate 10 when using a glass substrate as the substrate 10. It is not necessary when using synthetic quartz glass as the substrate 10.

Then, in the fourth step, the silicon oxide film for the bottom gate insulating film is formed. When hydrogen gas is reduced or stopped in the third step, 150 SCCM of hydrogen gas as the carrier gas is introduced into the chamber 1. Further, the material gas obtained by mixing 1 to 2 SCCM of helium-diluted oxygen (He diluted $O_2$) with 15 SCCM of monosilane as the material gas is introduced into the chamber 1. In the chamber 1, the introduced gas forms the silicon oxide film for the bottom gate insulating film on the substrate 10 via the thermal catalyst 5. In the present example, the silicon oxide film is formed to 50 to 100 nm.

At this time, in order to raise the ratio of the material gas in the chamber 1, it is possible to control the mass flow controller M to reduce or stop the feed of hydrogen gas in the middle of the film formation to form the silicon oxide film at a high speed.

Then, in the fifth step, the photoresist is formed to a predetermined pattern on one main surface of the substrate 10, $F^+$ ions of for example carbon tetrafluoride ($CF_4$) plasma are irradiated by using this as a mask, and a plurality of steps are formed on the substrate 10 by reactive ion etching (RIE).

In this case, the steps become the seeds at the epitaxial growth of the single crystalline silicon mentioned later and may have a depth d of 0.1 to 0.2 μm and a width w of 2 to 3 μm.

The photoresist is removed, then, as the sixth step, a semi-crystalline silicon film is formed on the substrate 10. When hydrogen gas is reduced or stopped in the fourth step, 150 SCCM of hydrogen gas serving as the carrier gas is introduced into the chamber 1. Further, 15 SCCM of monosilane as the material gas is introduced and the polycrystalline silicon film is formed on the substrate 10 by catalytic CVD. At this time, grapho-epitaxial growth is carried out by using the steps 10a as the seeds, and a single crystalline silicon film is epitaxially grown to a thickness of several micrometers to 0.005 μm (for example 0.1 am).

Note that, according to need, by mixing the N-type phosphorus or arsenic or antimony etc. to the silane-based gas (monosilane, disilane, trisilane, etc.) of the material gas in an adequate amount or mixing P-type boron in an adequate amount, a semi-crystalline silicon film having any N- or P-type impurity carrier concentration can be formed.

In the case of the N-type, for example, phosphine, arsine, and stibine are employed, while in the case of the P-type, for example diborane is employed.

The single crystalline silicon film deposited on the substrate 10 is epitaxially grown. This is according to the well known phenomenon referred to as grapho-epitaxy. The size of this single crystal becomes larger in proportion to the temperature and the time, but when the temperature and the time are set low and short, the interval of the steps must be shortened. Further, by changing the shape of the steps in various ways, the crystal orientation of the grown layer can be controlled.

At this time, in order to raise the ratio of the material gas in the chamber 1, it is possible to control the mass flow controller M to reduce or stop the feed of hydrogen gas in the middle of the film formation to form the single crystalline silicon film at a high speed.

When the single crystalline silicon film is formed, as the seventh step, a silicon oxide film for the top gate insulating film is formed. When the hydrogen gas is reduced or stopped in the sixth step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced. In the chamber 1, the introduced gas forms the silicon oxide film for the gate insulating film on the substrate 10 via the thermal catalyst 5. Further, according to need, it is possible to cut the helium-diluted oxygen (He diluted $O_2$)), mix monosilane and ammonia in the appropriate ratio, and continuously form a silicon nitride film having a predetermined thickness.

At this time, in order to raise the ratio of the material gas in the chamber 1, it is possible to control the mass flow controller M to reduce or stop the feed of hydrogen gas in the middle of the film formation to form the silicon oxide film and the silicon nitride film at a high speed.

Also, after the film formation, the material gas is cut, the thermal catalyst is cooled to a temperature that does not cause a problem, and the introduction of the carrier gas is stopped.

In the eighth step, the sputter film of the molybdenum/ tantalum alloy is formed on the silicon oxide film or the silicon nitride film for the insulating film, and the top gate electrode is formed by general purpose photolithography and etching.

In this way, by catalytic CVD and grapho-epitaxy, the single crystalline silicon film is deposited on the substrate 10. Then, a MOSTFT using the single crystalline silicon film as the channel region is fabricated by a method similar to that of the concrete embodiment 4.

Concrete Embodiment 7

As a concrete embodiment 7, an embodiment of the process of production of a top gate type single crystalline silicon CMOSTFT obtained by forming a single crystalline silicon film by hetero-epitaxial growth is shown. In order to fabricate the top gate type single crystalline silicon CMOSTFT of the present example, using catalytic CVD or the like, hydrogen gas serving as the carrier gas is fed or the thermal catalyst is heated to a state enabling the catalytic action to form in at least the TFT forming region of the substrate 10 a substance layer (crystalline sapphire film or the like) having a good lattice alignment with the single crystalline semiconductor (single crystalline silicon), a semiconductor film (polycrystalline silicon film, amorphous silicon film, etc.) and a gate insulating film are formed, and a film is hetero epitaxially grown by using the substance layer having a good lattice alignment as a seed. When at least the polycrystalline silicon film and the silicon oxide film for the gate insulating film are formed in this way, they are continuously formed.

In the same way as the concrete embodiments mentioned above, the material of the substrate 10 is selected according to the substrate temperature in the TFT forming step. When catalytic CVD is employed, the substrate temperature in the polycrystalline silicon film and insulating film forming step is maintained at a relatively low temperature of about 300 to 400° C. For this reason, when the substrate temperature enables a glass substrate such as borosilicate glass and aluminosilicate glass to be used in the TFT formation system, use can be made of a borosilicate glass substrate and an aluminosilicate glass substrate. At this time, it is possible to form the substrate relatively large from the viewpoint of cost. For example, it is formed to a size of 500×600 mm and a thickness of 0.5 to 1.1 mm.

Note that, when the substrate temperature in the TFT forming step becomes a relatively high temperature of about 800 to 1000° C., use is made of a heat resistant glass substrate such as quartz glass and crystallized glass. The heat resistant glass substrate is formed for example to a diameter of 6 to 12 inch and the thickness of 700 to 800 $\mu$m.

A more detailed explanation will be made of the process of fabrication of a top gate type single crystalline silicon CMOSTFT comprising the first step to the 13th step described above.

First, in the first step, the substrate 10 is disposed in the chamber 1, the exhaust system 1a is operated to evacuate the interior of the chamber 1 up to a predetermined pressure and, at the same time, the heater 2a built in the susceptor 2 is operated to heat the substrate 10 up to a predetermined temperature. Then, 150 SCCM of hydrogen gas serving as the carrier gas is fed into the chamber 1. Part of the fed hydrogen gas is activated by the contact with the thermal catalyst 5 and becomes activated hydrogen H* which cleans the surface of the substrate 10.

Then, in the second step, the silicon nitride film for the protective film is formed. A material gas obtained by mixing 50 SCCM of ammonia to 15 SCCM of monosilane is introduced into the chamber 1 with hydrogen gas fed thereto. In the chamber 1, the introduced gas forms the silicon nitride film for the protective film on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation to form the silicon nitride film at a high speed.

The silicon nitride film for the protective film is formed so as to stop the Na ions from the substrate 10 when using the glass substrate as the substrate 10. It is not necessary when using synthetic quartz glass as the substrate 10 or the thin sapphire film is sufficiently thick.

Then, in the third step, as shown in FIG. 62, on one main surface of the substrate 10, by catalytic CVD or the like, a thin crystalline sapphire film (thickness of 5 to 200 nm) 50 is formed. The thin crystalline sapphire film 50 is fabricated by oxidizing a trimethyl aluminum gas by an oxidizing gas (oxygen and moisture) to cause it to crystallize.

Then, in the fourth step, the single crystalline silicon film 22 is formed. When hydrogen gas is reduced or stopped in the second step, 150 SCCM of hydrogen gas serving as the carrier gas is introduced into the chamber 1. Further, 15 SCCM of monosilane as the material gas is introduced, and the semi-crystalline silicon film is formed on the substrate 10 by catalytic CVD. At this time, as shown in FIG. 63, the single crystalline silicon film 22 is epitaxially grown on the entire surface of the thin sapphire film 50 to a thickness of 0.005 $\mu$m to several micrometers (for example, 0.1 $\mu$m).

In this way, the silicon is hetero-epitaxially grown by using the thin crystalline sapphire film 50 as a seed and precipitated as a single crystalline silicon film 22 of a thickness of for example about 0.1 $\mu$m. In this case, sapphire has almost the same lattice constant as single crystalline silicon, so the silicon is epitaxially grown on the thin crystalline sapphire film 50.

Note that, according to need, by mixing the N-type phosphorus or arsenic or antimony etc. to the silane-based gas (monosilane, disilane, trisilane, etc.) of the material gas in an adequate amount or mixing P-type boron in an adequate amount, a semi-crystalline silicon film having any N- or P-type impurity carrier concentration can be formed.

In the case of the N-type, for example phosphine, arsine, and stibine are employed, while in the case of the P-type, for example diborane is employed.

At this time, in order to raise the ratio of the material gas in the chamber 1, it is possible to control the mass flow controller M to reduce or stop the feed of hydrogen gas in the middle of the film formation to form the single crystalline silicon film at a high speed.

Figure 64:
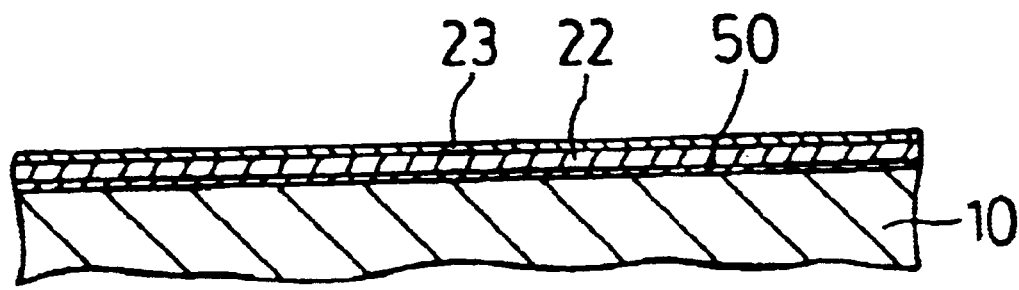
FIG. 64 is an explanatory view of a process of a thin film forming method and a process of production of a thin film semiconductor in the embodiment of the present invention.

When the single crystalline silicon film 22 is formed, as shown in FIG. 64, as the fifth step, the silicon oxide film 23 for the gate insulating film is formed. When hydrogen gas is reduced or stopped in the fourth step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced. In the chamber 1, the introduced gas forms the silicon oxide film 23 for the gate insulating film on the substrate 10 via the thermal catalyst 5. Further, according to need, it is possible to cut the helium-diluted oxygen (He diluted $O_2$), mix monosilane and ammonia in an appropriate ratio, and continuously form a silicon nitride film having a predetermined thickness.

At this time, in order to raise the ratio of the material gas in the chamber 1, it is possible to control the mass flow controller M to reduce or stop the feed of hydrogen gas in the middle of the film formation to form the silicon oxide film 23 and the silicon nitride film at a high speed.

Also, after the formation of the thin film, the material gas is cut, the thermal catalyst is cooled to a temperature that does not cause a problem, and the introduction of the carrier gas is stopped.

In this way, by catalytic CVD and hetero-epitaxy, the single crystalline silicon film 22 is deposited on the substrate 10. Then, a MOSTFT using the single crystalline silicon film as the channel region is fabricated.

Figure 65:
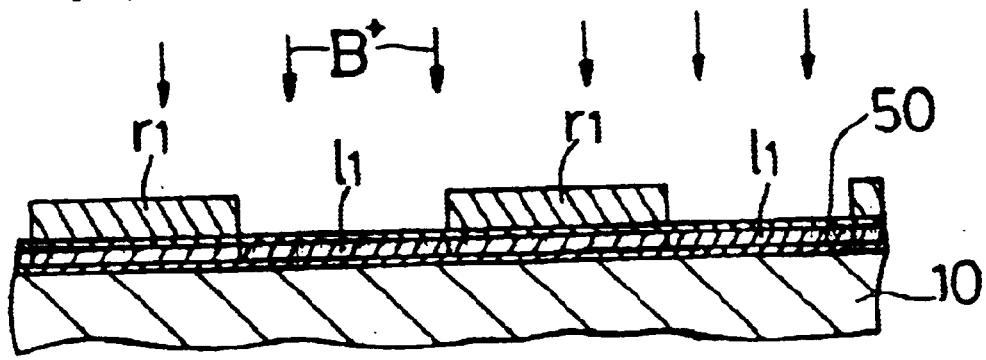
FIG. 65 is an explanatory view of a process of a thin film forming method and a process of production of a thin film semiconductor in the embodiment of the present invention.

As the sixth step, as shown in FIG. 65, in order to control the impurity concentration of the channel region for the N-channel MOSTFT, the P-channel MOSTFT is masked by a photoresist $r_1$ and P-type impurity ions (for example, boron ions $B^+$ of boron difluoride ($BF_2$)) are implanted with for example a dosage of $5\times10^{13}$ atoms/cm$^2$ at 30 keV to obtain a silicon layer 11 wherein the conductivity type of the single crystalline silicon film has become the P-type.

Figure 66:
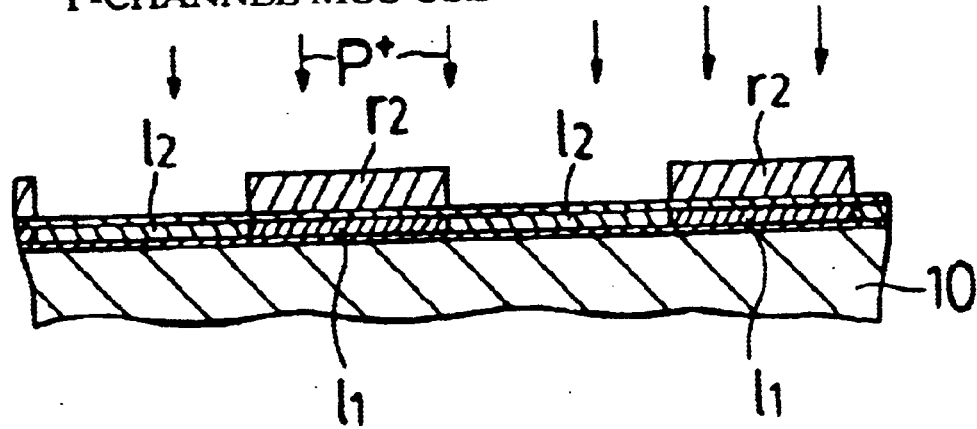
FIG. 66 is an explanatory view of a process of a thin film forming method and a process of production of a thin film semiconductor in the embodiment of the present invention.

Then, as the seventh step, as shown in FIG. 66, in order to control the impurity concentration of the channel region for the P-channel MOSTFT, the N-channel MOSTFT is masked by a photoresist $r_2$ this time and N-type impurity ions (for example phosphorus ions $P^+$) are implanted with for example a dosage of $5\times10^{13}$ atoms/cm$^2$ at 50 keV to obtain a silicon layer 12 wherein the conductivity type of the single crystalline silicon film has become the N-type.

Figure 67:
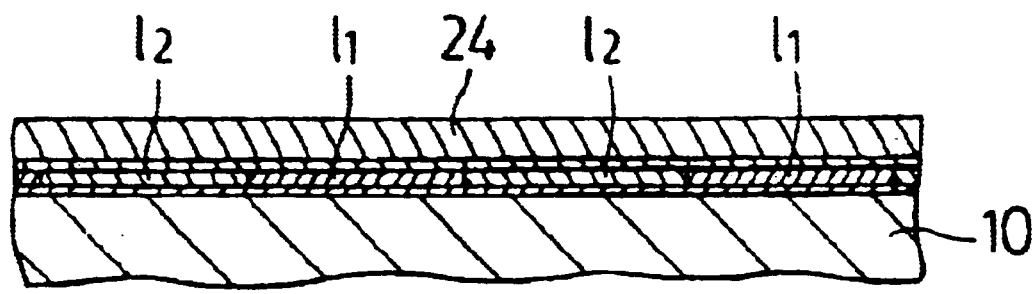
FIG. 67 is an explanatory view of a process of a thin film forming method and a process of production of a thin film semiconductor in the embodiment of the present invention.

Then, in the eighth step, as shown in FIG. 67, a molybdenum/tantalum alloy film 24 serving as the gate electrode material is deposited to a thickness of 400 nm by for example sputtering.

Figure 68:
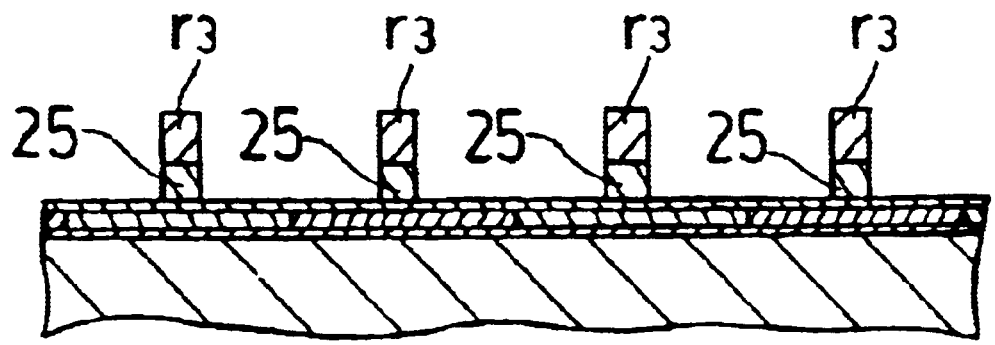
FIG. 68 is an explanatory view of a process of a thin film forming method and a process of production of a thin film semiconductor in the embodiment of the present invention.

Then, in the ninth step, as shown in FIG. 68, a photoresist $r_3$ is formed in a predetermined pattern, the molybdenum/tantalum alloy film 24 is patterned to the shape of a gate electrode 25 by using this as the mask, and the photoresist $r_3$ is removed.

Figure 69:
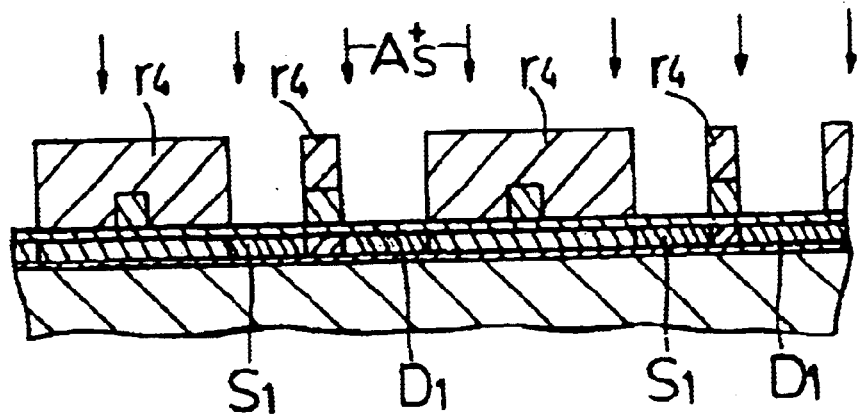
FIG. 69 is an explanatory view of a process of a thin film forming method and a process of production of a thin film semiconductor in the embodiment of the present invention.

Then, in the 10th step, as shown in FIG. 69, the P-channel MOSTFT and the gate electrode 25 are masked by a photoresist $r_4$, for example $As^+$ ions are implanted as the N-type impurity with for example a dosage of $1\times10^{15}$ atoms/cm$^2$ at 70 keV, the photoresist is removed, and the surface is activated by RTA (rapid thermal annealing) for 10 seconds to 20 seconds at about 1000° C. in $N_2$ to form the $N^+$ type source region S, and drain region $D_1$ of the N-channel MOSTFT.

Figure 70:
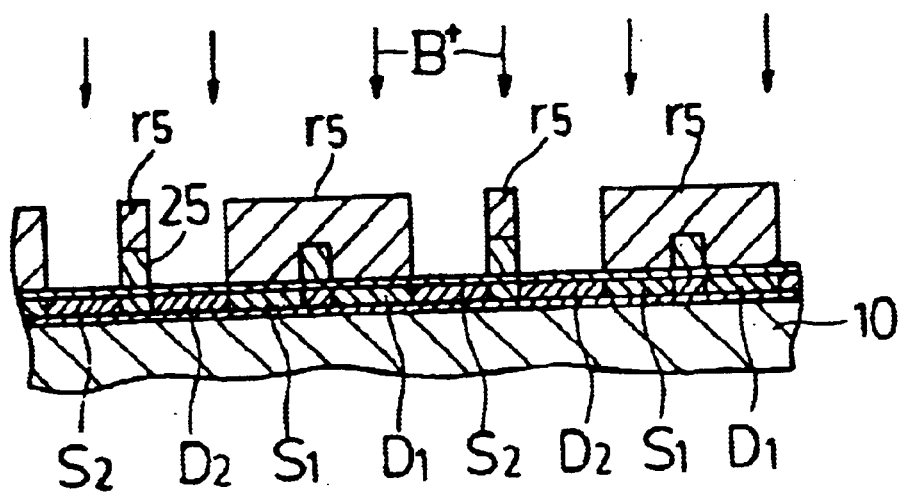
FIG. 70 is an explanatory view of a process of a thin film forming method and a process of production of a thin film semiconductor in the embodiment of the present invention.

Then, in the 11th step, as shown in FIG. 70, the N-channel MOSTFT and the gate electrode 25 are masked by a photoresist $r_5$, for example $B^+$ ions are implanted as the P-type impurity with for example a dosage of $1\times10^{15}$ atoms/cm$^2$ at 30 keV, the photoresist is removed, then the surface is activated by RTA (rapid thermal annealing) for 10 seconds to 20 seconds at about 1000° C. in $N_2$ to form a $P^+$ type source region $S_2$ and drain region $D_2$ of the P-channel MOSTFT. Note that, in this RTA, it is possible to activate the N-channel MOSTFT together.

Figure 71:
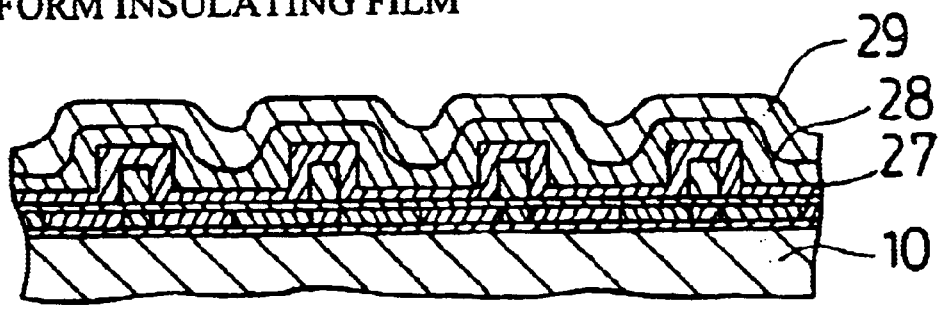
FIG. 71 is an explanatory view of a process of a thin film forming method and a process of production of a thin film semiconductor in the embodiment of the present invention.

Then, in the 12th step, as shown in FIG. 71, a silicon oxide film 27 is formed on the entire surface by CVD to a thickness of for example 50 to 100 nm, phosphosilicate glass (PSG) film 28 is formed to a thickness of for example 200 to 300 nm, and a silicon nitride film 29 is formed to a thickness of for example 150 to 200 nm.

Figure 72:
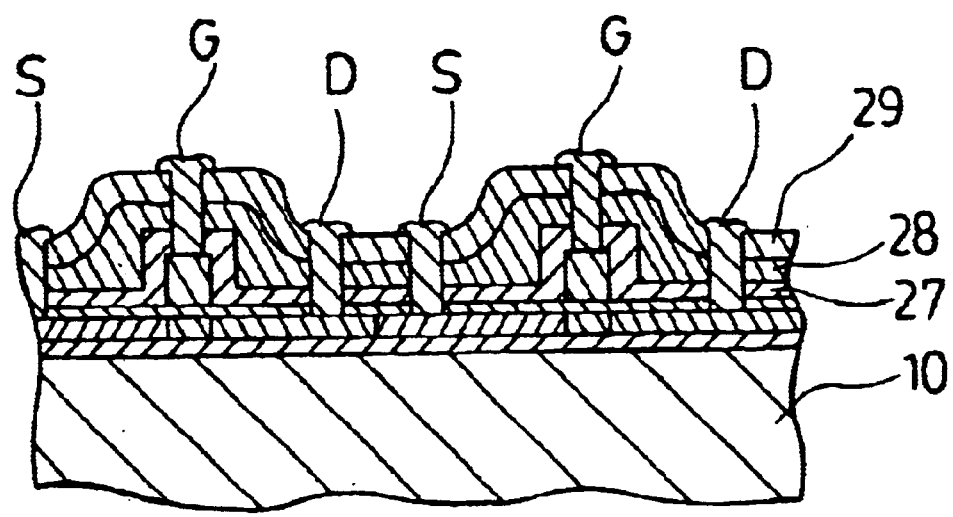
FIG. 72 is an explanatory view of the process of the thin film forming method and the process of production of the thin film semiconductor in the embodiment of the present invention.

Then, in the 13th step, as shown in FIG. 72, the contact windows are formed at predetermined positions of the insulating film, an electrode material such as aluminum is deposited to a thickness of 1 μm at 150° C. by sputtering or the like on the entire surface including the holes, this is patterned to form the source or drain electrode S or D and the gate takeout electrode or the interconnection G of each of the P-channel MOSTFT and the N-channel MOSTFT, and this is sintered in the forming gas ($N_2+H_2$) at 400° C. for 1 hour to enhance the ohmic contact and the surface level to complete each MOSTFT.

Concrete Embodiment 8

As a concrete embodiment 8, an embodiment of the process of production of a bottom gate type single crystalline silicon CMOSTFT obtained by forming a single crystalline semiconductor film by hetero-epitaxial growth is shown. In order to fabricate a bottom gate type single crystalline silicon CMOSTFT, a sputter film (300 to 400 nm thick) of a molybdenum/tantalum alloy is formed in at least the TFT forming region of the substrate 10 to form the bottom gate electrode. The bottom gate electrode is tapered by etching of 25 to 45 degrees by general purpose photolithography and etching.

In at least the TFT forming region of the substrate 10, using catalytic CVD or the like, hydrogen gas serving as the carrier gas is fed or the thermal catalyst is heated to a state enabling the catalytic action to form a substance layer (crystalline sapphire film or the like) having a good lattice alignment with the single crystalline semiconductor (single crystalline silicon), a semiconductor film (polycrystalline silicon film, amorphous silicon film, etc.) and gate insulating film are formed, and a film is heteroepitaxially grown by using the substance layer having a good lattice alignment as a seed. When at least the polycrystalline silicon film and the silicon oxide film for the gate insulating film are formed in this way, they are continuously formed.

The material of the substrate 10 is selected according to the substrate temperature in the TFT forming step. When catalytic CVD is employed, the substrate temperature in the polycrystalline silicon film and insulating film forming step is maintained at a relatively low temperature of about 300 to 400° C. For this reason, when the substrate temperature enables a glass substrate such as borosilicate glass and aluminosilicate glass to be used in the TFT formation system, use can be made of a borosilicate glass substrate and an aluminosilicate glass substrate. At this time, it is possible to form the substrate relatively large from the viewpoint of cost. For example, it is formed to a size of 500×600 mm and a thickness of 0.5 to 1.1 mm.

Note that, when the substrate temperature in the TFT forming step becomes a relatively high temperature of about 800 to 1000° C., use is made of a heat resistant glass substrate such as quartz glass and crystallized glass. The heat resistant glass substrate is formed for example to a diameter of 6 to 12 inch and a thickness of 700 to 800 Mm.

Next, an explanation will be made of the step of forming the single crystalline silicon film in the case where a bottom gate type single crystalline silicon CMOSTFT is fabricated.

First, in the first step, in at least the TFT region of the substrate 10, a sputter film of 300 to 400 nm of a molybdenum/tantalum alloy is formed. Then, the film is tapered by etching of 20 to 45 degrees to form the bottom gate electrode by general purpose photolithography and etching.

Then, in the second step, the substrate 10 is disposed in the chamber 1, the exhaust system 1a is operated to evacuate the interior of the chamber 1 up to a predetermined pressure and, at the same time, the heater 2a built in the suscepter 2 is operated to heat the substrate 10 up to a predetermined temperature. Then, hydrogen gas serving as the carrier gas is fed into the chamber 1. Part of the fed hydrogen gas is activated by contact with the thermal catalyst 5 and becomes activated hydrogen H* which cleans the surface of the substrate 10 is made.

Then, in the third step, the silicon nitride film for the protective film is formed. A material gas obtained by mixing 50 SCCM of ammonia to 15 SCCM of monosilane is introduced into the chamber 1 with hydrogen gas fed thereto. In the chamber 1, the introduced gas forms the silicon nitride film for the gate insulating film on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation to form the silicon nitride film at a high speed.

The silicon nitride film for the protective film is formed so as to stop the Na ions from the substrate 10 when using a glass substrate as the substrate 10. It is not necessary when using synthetic quartz glass as the substrate 10.

Then, in the fourth step, the silicon oxide film for the bottom gate insulating film is formed. When hydrogen gas is reduced or stopped in the third step, 150 SCCM of hydrogen gas as the carrier gas is introduced into the chamber 1. Further, the material gas obtained by mixing 1 to 2 SCCM of helium-diluted oxygen (He diluted $O_2$) with 15 SCCM of monosilane as the material gas is introduced into the chamber 1. In the chamber 1, the silicon oxide film for the gate insulating film is formed on the substrate 10 by the introduced gas via the thermal catalyst 5. In the present example, the silicon oxide film is formed to 50 to 100 nm.

At this time, in order to raise the ratio of the material gas in the chamber 1, it is possible to control the mass flow controller M to reduce or stop the feed of hydrogen gas in the middle of the film formation to form the silicon oxide film at a high speed.

Then, in the fifth step, the substance layer (crystalline sapphire film or the like) having a good lattice alignment with the single crystalline semiconductor (single crystalline silicon) is formed. Namely, on one main surface of the substrate 10, by catalytic CVD or the like, a thin crystalline sapphire film (thickness of 5 to 200 nm) is formed. The thin crystalline sapphire film is fabricated by oxidizing trimethyl aluminum gas by an oxidizing gas (oxygen and moisture) and crystallizing it.

Then, in the sixth step, the single crystalline silicon film is formed. When hydrogen gas is reduced or stopped in the fourth step, 150 SCCM of hydrogen gas serving as the carrier gas is introduced into the chamber 1. Further, 15 SCCM of monosilane as the material gas is introduced, and, using catalytic CVD, the single crystalline silicon film is hetero-epitaxially grown on the entire surface of the thin crystalline sapphire film to a thickness of 0.005 mm to several micrometers (for example, 0.1 $\mu$m).

In this way, the silicon is hetero-epitaxially grown by using the thin crystalline sapphire film as a seed and precipitated as a single crystalline silicon film of a thickness of for example about 0.1 $\mu$m. In this case, since sapphire has almost the same lattice constant as single crystalline silicon, the silicon is epitaxially grown on the thin crystalline sapphire film.

Note that, according to need, by mixing N-type phosphorus or arsenic or antimony etc. to the silane-based gas (monosilane, disilane, trisilane, etc.) of the material gas in an adequate amount or mixing P-type boron in an adequate amount, a single crystalline silicon film having any N- or P-type impurity carrier concentration can be formed.

In the case of the N-type, for example phosphine, arsine, and stibine are employed, while in the case of the P-type, for example diborane is employed.

At this time, in order to raise the ratio of the material gas in the chamber 1, it is possible to control the mass flow controller M to reduce or stop the feed of hydrogen gas in the middle of the film formation to form the single crystalline silicon film at a high speed.

When the single crystalline silicon film is formed, as the seventh step, a silicon oxide film for a protective film of a thickness of 50 to 100 nm is continuously formed. When hydrogen gas is reduced or stopped in the sixth step, 150 SCCM of hydrogen gas as the carrier gas is introduced into the chamber 1. Further, a gas obtained by mixing 1 to 2 SCCM of helium diluted oxygen (He diluted $O_2$) with 15 SCCM of monosilane as the material gas is introduced. In the chamber 1, the introduced gas forms the silicon oxide film for the protective film on the substrate 10 via the thermal catalyst 5.

At this time, in order to raise the ratio of the material gas in the chamber 1, it is possible to control the mass flow controller M to reduce or stop the feed of hydrogen gas in the middle of the film formation to form the silicon oxide film at a high speed.

After the film formation, the material gas is cut, the thermal catalyst is cooled to a temperature that does not cause a problem, and the introduction of the carrier gas is stopped.

In this way, by catalytic CVD and hetero-epitaxy, the single crystalline silicon film is deposited on the substrate 10. Then, by a method the same as the concrete embodiment 7, a MOSTFT using the single crystalline silicon film as a channel region is fabricated.

Concrete Embodiment 9

As a concrete embodiment 9, an embodiment of the process of production of a dual gate type single crystalline silicon CMOSTFT obtained by forming a single crystalline silicon film by hetero-epitaxial growth is shown. The dual gate type single crystalline silicon CMOSTFT is constituted by forming a sputter film of a molybdenum/tantalum alloy to a thickness of about 300 to 400 nm in at least the TFT forming region on the substrate 10, forming a bottom gate electrode, cleaning the substrate by the activated hydrogen H*, forming the silicon nitride film for the protective film, forming the silicon oxide film for the bottom gate insulating film, forming the substance layer (crystalline sapphire film or the like) having a good lattice alignment with the single crystalline semiconductor (single crystalline silicon), hetero-epitaxially growing a single crystalline silicon film on the entire surface of this substance layer to a predetermined thickness, forming a silicon oxide film for the top gate insulating film, forming a silicon nitride film for the protective film according to need, forming a top gate electrode, and so on. At this time, in at least the TFT forming region of the substrate 10, using catalytic CVD or the like, hydrogen gas serving as the carrier gas is fed or the thermal catalyst is heated to a state enabling the catalytic action, a substance layer (crystalline sapphire film or the like) having a good lattice alignment with the single crystalline semiconductor (single crystalline silicon) is formed, a semiconductor film (polycrystalline silicon, amorphous silicon film, etc.) and a gate insulating film are continuously formed, and a film is hetero-epitaxially grown by using the substance layer having the good lattice alignment as a seed. When at least the polycrystalline silicon film and the silicon oxide film for the gate insulating film are formed in this way, they are continuously formed.

In the same way as the concrete embodiments mentioned above, the material of the substrate 10 is selected according to the substrate temperature in the TFT forming step. When catalytic CVD is employed, the substrate temperature in the polycrystalline silicon film and insulating film forming step is maintained at a relatively low temperature of about 300 to 400° C. For this reason, when the substrate temperature enables a glass substrate such as borosilicate glass and aluminosilicate glass to be used in the TFT formation system, use can be made of a borosilicate glass substrate and an aluminosilicate glass substrate. At this time, it is possible to form the substrate relatively large from the viewpoint of cost. For example, it may be formed to a size of 500×600 mm and a thickness of 0.5 to 1.1 mm.

Note that, when the substrate temperature in the TFT forming step becomes a relatively high temperature of about 800 to 1000° C., use is made of a heat resistant glass substrate such as quartz glass and crystallized glass. The heat resistant glass substrate is formed for example to a diameter of 6 to 12 inch and a thickness of 700 to 800 $\mu$m.

A further detailed explanation will be made of the process of fabrication of a dual gate type single crystalline silicon CMOSTFT.

In the first step, in at least the TFT region of the substrate 10, a sputter film of a molybdenum/tantalum alloy is formed to 300 to 400 nm. Then, the film is tapered by etching of 20 to 45 degrees to form the bottom gate electrode by general purpose photolithography and etching.

Then, in the second step, the substrate 10 is disposed in the chamber 1, the exhaust system 1*a* is operated to evacuate the interior of the chamber 1 up to a predetermined pressure and, at the same time, the heater 2*a* built in the suscepter 2 is operated to heat the substrate 10 up to a predetermined temperature. Then, hydrogen gas serving as the carrier gas is fed into the chamber 1. Part of the fed hydrogen gas is activated by the contact with the thermal catalyst 5 and becomes activated hydrogen H* which cleans the surface of the substrate 10.

Then, in the third step, a silicon nitride film for the protective film is formed. A material gas obtained by mixing ammonia to monosilane is introduced into the chamber 1 with hydrogen gas fed thereto. In the chamber 1, the introduced gas forms the silicon nitride film for the gate insulating film on one main surface of the substrate 10 via the thermal catalyst 5. In the present example, the silicon nitride film is formed to 100 to 200 nm.

At this time, in order to raise the ratio of the material gas in the chamber 1, it is possible to control the mass flow controller M to reduce or stop the feed of hydrogen gas in the middle of the film formation to form the silicon nitride film at a high speed.

The silicon nitride film 11 for the protective film is formed so as to stop the Na ions from the substrate 10 when using a glass substrate as the substrate 10. It is not necessary when using synthetic quartz glass as the substrate 10.

Then, in the fourth step, the silicon oxide film for the bottom gate insulating film is formed. When hydrogen gas is reduced or stopped in the third step, 150 SCCM of hydrogen gas serving as the carrier gas is introduced into the chamber 1. Further, the material gas obtained by mixing 1 to 2 SCCM of helium-diluted oxygen (He diluted $O_2$) with 15 SCCM of monosilane as the material gas is introduced into the chamber 1. In the chamber 1, the introduced gas forms the silicon oxide film for the gate insulating film on the substrate 10 via the thermal catalyst 5. In the present example, the silicon oxide film is formed to 50 to 100 nm.

At this time, in order to raise the ratio of the material gas in the chamber 1, it is possible to control the mass flow controller M to reduce or stop the feed of hydrogen gas in the middle of the film formation to form the silicon oxide film at a high speed.

Then, in the fifth step, the substance layer (crystalline sapphire film or the like) having a good lattice alignment with the single crystalline semiconductor (single crystalline silicon) is formed. Namely, on one main surface of the substrate 10, a thin crystalline sapphire film (thickness of 5 to 200 nm) is formed by catalytic CVD or the like. The thin crystalline sapphire film is fabricated by oxidizing trimethyl aluminum gas by an oxidizing gas (oxygen and/or water component) and crystallizing it.

Then, in the sixth step, a single crystalline silicon film is formed. When hydrogen gas is reduced or stopped in the fourth step, 150 SCCM of hydrogen gas serving as the carrier gas is introduced into the chamber 1. Further, 15 SCCM of monosilane as the material gas is introduced, and, using catalytic CVD, the single crystalline silicon film is hetero-epitaxially grown on the entire surface of the thin sapphire film to a thickness of 0.005 $\mu$m to several micrometers (for example, 0.1 $\mu$m).

In this way, the silicon is hetero-epitaxially grown by using the thin crystalline sapphire film as the seed and precipitated as a single crystalline silicon film of the thickness of for example about 0.1 $\mu$m. In this case, since sapphire has almost the same lattice constant as the single crystalline silicon, the silicon is epitaxially grown on the thin crystalline sapphire film.

Note that, according to need, by mixing the N-type phosphorus or arsenic or antimony etc. to the silane-based gas (monosilane, disilane, trisilane, etc.) of the material gas in an adequate amount or mixing P-type boron in an adequate amount, a single crystalline silicon film having any N- or P-type impurity carrier concentration can be formed.

In the case of the N-type, for example phosphine, arsine, and stibine are employed, while in the case of the P-type, for example diborane is employed.

At this time, in order to raise the ratio of the material gas in the chamber 1, it is possible to control the mass flow controller M to reduce or stop the feed of hydrogen gas in the middle of the film formation to form the single crystalline silicon film at a high speed.

When the single crystalline silicon film is formed, as the seventh step, a silicon oxide film for the gate insulating film of a thickness of 50 to 100 nm is formed. When the hydrogen gas is reduced or stopped in the sixth step, 150 SCCM of hydrogen gas serving as the carrier gas is introduced into the chamber 1. Further, a gas obtained by mixing 1 to 2 SCCM of helium-diluted oxygen (He diluted $O_2$) with 15 SCCM of monosilane as the material gas is introduced. In the chamber 1, the introduced gas forms the silicon oxide film for the gate insulating film on the substrate 10 via the thermal catalyst 5. Further, according to need, it is possible to cut the helium-diluted oxygen (He diluted $O_2$), mix the monosilane and ammonia in an appropriate ratio, and form a silicon nitride film having a predetermined thickness.

At this time, in order to raise the ratio of the material gas in the chamber 1, it is possible to control the mass flow controller M to reduce or stop the feed of hydrogen gas in the middle of the film formation to form the silicon oxide film and the silicon nitride film at a high speed.

Also, after the film formation, the material gas is cut, the thermal catalyst is cooled to a temperature that does not cause a problem, and the introduction of the carrier gas is stopped.

In the eighth step, a sputter film of a molybdenum/tantalum alloy is formed on the silicon oxide film or the silicon nitride film for the insulating film, while a top gate electrode is formed by general purpose photolithography and etching.

In this way, by catalytic CVD and hetero-epitaxy, a single crystalline silicon film is deposited on the substrate 10.

Then, by a similar method to that of the concrete embodiment 1, a MOSTFT using the single crystalline silicon film as a channel region is fabricated.

As described above, by the thin film forming apparatus according to the present invention, when forming a thin film on a substrate by catalytic CVD, high density plasma CVD, high density catalytic CVD process, or the like, it becomes possible to form a thin film having a high quality on the substrate. Also, it becomes possible to form a thin film which has a high quality and can be applied to a large scale display device. Further, it enables the formation of a high quality thin film and, at the same time, it becomes possible to prevent the deterioration of the thermal catalyst.

Namely, since the activated hydrogen H* is constantly generated and the substrate surface is constantly cleaned by the carrier gas containing hydrogen, a transition layer of amorphous silicon is not formed at the interface between the silicon oxide film and the polycrystalline silicon film, so it becomes possible to form a high quality thin film layer. Further, the carrier gas containing hydrogen is constantly introduced during the film formation of the substrate, therefore the thermal catalyst will be protected from the influence of the other gas, so it becomes possible to prevent the deterioration of the thermal catalyst.

Further, by the thin film forming apparatus according to the present invention, when forming the thin film onto the substrate, the carrier gas containing hydrogen is used, so the activated hydrogen H* generated in the carrier gas cleans the substrate surface, and the high quality thin film can be formed on the substrate. Further, provision is made of a means of reducing or stopping the introduction of the carrier gas after the elapse of a predetermined time after the start of the film formation when forming various films, therefore a thin film can be formed onto the substrate at a high speed by raising the ratio of the material gas in the vacuum chamber. Thus, it becomes possible to improve the workability.

Further, in the thin film forming apparatus of the present invention, it becomes possible to clean the substrate surface whenever the film is formed, so it becomes possible to obtain a high quality thin film layer. In the thin film forming apparatus of the present invention, by continuously introducing the material gas, the thin film layer can be obtained in a short time, and it becomes possible to achieve an improvement of the work efficiency.

Further, by gradually reducing the amount of introduction of the first material gas and gradually increasing the amount of introduction of the second material gas, the first material gas and the second material gas will be mixed in the vacuum chamber for a predetermined time while changing in occupation rate. In this way, it becomes possible to obtain so-called inclined interface films wherein the first thin film and the second thin film are not clearly delineated in border. By stacking the films by an inclined interface, the stress between films can be reduced, and it becomes possible to produce a higher quality semiconductor device of the insulator-semiconductor interface structure.

The gas introduction system of the present invention is provided with a gas spraying portion located in the vacuum chamber. When the distance of this gas spraying portion from the thermal catalyst can be changed by the position adjusting means, it becomes possible to position the gas spraying portion at a position when the best catalytic reaction is obtained for the broadness of the vacuum chamber or the types of the gas and the thermal catalyst or the shape and the size of the thermal catalyst.

Further, if the thermal catalyst is held by the moveable thermal catalyst holding means to enable the adjustment of the distance from the substrate in the vacuum chamber, it becomes possible to position the thermal catalyst at a position when the best thermal decomposition reaction and catalytic reaction are obtained in accordance with the broadness of the vacuum chamber or the types of the gas and the thermal catalyst or the shapes and the sizes of the thermal catalyst and the substrate. By disposing the shower between the thermal catalyst and the substrate holder (substrate), the contamination from the thermal catalyst at the time of a temperature rise or temperature drop of the thermal catalyst is prevented, and further inadequate film formation due to insufficient thermal decomposition or thermal catalytic reaction of the material gas at that time can be prevented.

Further, it is possible to configure the system so that the distance of the substrate from the thermal catalyst can be adjusted in the vacuum chamber by placing the substrate on the moveable substrate holder. Further, by rotating the substrate holder (base plate) or setting it at any angle with respect to the thermal catalyst, it becomes possible to improve the uniformity of the film thickness and film quality in the substrate holder (base plate). When employing such a configuration, it becomes possible to position the substrate at a position when the best thermal decomposition reaction or catalytic reaction is obtained in accordance with the broadness of the vacuum chamber or the types of the gas and the thermal catalyst or the shape and the size of the thermal catalyst.

Furthermore, when the system is configured so that the substrate holder can be moved on a rail by laying a rail in the vacuum chamber and attaching a means enabling movement on the rail to the substrate holder, it becomes possible to move the substrate holder along a long thermal catalyst arranged in the vacuum chamber, it becomes possible to uniformly form a film on the substrate, and it becomes possible to reduce the cost by the improvement of the productivity.

In the present invention, it is possible to arrange a plurality of thermal catalysts in the vacuum chamber and it is also possible to form these thermal catalysts from the same material or materials different from each other. By freely selecting and combining the materials of the thermal catalysts in this way, it becomes possible to obtain the best thermal decomposition reaction and catalytic reaction.

Further, it is also possible to arrange a plurality of thermal catalysts in the vacuum chamber and form these thermal catalysts in the same shape or different shapes. In this way, by freely selecting and combining the shapes of the thermal catalysts, it becomes possible to obtain the best thermal decomposition reaction and catalytic reaction.

Further, it is also possible to employ a configuration wherein a plurality of thermal catalysts are arranged in the vacuum chamber and these thermal catalysts are connected to a power supply for supplying the same current or a power supply for supplying different currents. Due to this, for example even if a plurality of thermal catalysts are formed by materials different from each other, the temperature of the thermal catalysts as the resistance heat generators can be adjusted by adjustment of the voltage and current of the power supply and a good catalytic reaction can be obtained. Further, even when thermal catalysts made of the same material are used, it becomes possible to adjust the heating temperature of the thermal catalysts in accordance with the positions of the thermal catalysts in the vacuum chamber and the sizes of the thermal catalysts per se. Note that, as the power supply, use is made of a DC power supply or AC power supply or power supply where the AC is superposed on the DC.

Further, it is also possible to configure the thin film forming apparatus for forming the thin film by a single chamber or a multi-chamber. By configuring the same by a single chamber, it becomes possible to continuously form a plurality of thin films in the same chamber. For example by gradually reducing or increasing two types of material gases in a single chamber, the inclined interface films can be formed and it becomes possible to form a high quality thin film having a reduced stress between films.

Further, when forming a thin film in a multi-chamber, a predetermined thin film is formed in each chamber, so it becomes possible to obtain a high work efficiency.

Further, when films are formed in the different chambers in vacuum, contamination is prevented, the stress between adjoining films is reduced, and it becomes possible to produce a high quality semiconductor device having an insulator-semiconductor interface structure.

In the present invention, when continuously forming the gate insulating film and the silicon film, if exposing the films to the activated hydrogen H*, due to the hydrogen annealing effect, it becomes possible to produce a high quality semiconductor device of a semiconductor-insulator interface structure having a low interface level density.

For this reason, not only in the top gate type, but also in the bottom gate type and dual gate type TFT, a polycrystalline silicon film and a single crystalline silicon film having a high electron/positive hole mobility are obtained. Accordingly, by the production apparatus according to the present invention, the production of a semiconductor device, electro-optic device, etc. using a high performance polycrystalline silicon or single crystalline silicon film becomes possible.

Further, by the method according to the present invention, when forming a thin film on the substrate by using catalytic CVD, high density plasma CVD, high density catalytic CVD, or the like, since the system is configured so that the activated hydrogen H* is constantly generated and the substrate surface is constantly cleaned, a transition layer of the amorphous silicon is not formed at the interface between the silicon oxide film and the polycrystalline silicon film, and it becomes possible to form a high quality thin film layer.

Further, the surface is reformed by constantly cleaning the substrate surface by the activated hydrogen H* before the film formation, therefore molecular deposition of waters oxygen, etc. on the substrate surface is eliminated, the interface level is reduced, and the stress between adjoining films is low, so it becomes possible to achieve high quality film formation (silicon nitride film, silicon oxide film, polycrystalline silicon film, etc.) Particularly when continuously forming the gate insulating film and the silicon film, if exposing the same to the activated hydrogen H*, due to the hydrogen annealing effect, it becomes possible to produce a high quality semiconductor device of a semiconductor-insulator interface structure having a low interface level density.

Further, when forming a thin film on a substrate by using catalytic CVD, high density plasma CVD, high density catalytic CVD, or the like, when the substrate is at least cleaned by the activated hydrogen H* before the film formation, the material gas is fed to start the film formation, and the hydrogen carrier gas is reduced or cut after reaching a predetermined film thickness, the insulating film or semiconductor film is formed at a high speed, so the productivity is high and the cost can be reduced.

Further, according to need, the substrate surface is cleaned by the activated hydrogen H* before the film formation and the surface is reformed, therefore molecular deposition of water, oxygen, etc. of the substrate surface is eliminated, the interface level is reduced, the stress of each film is low, and it becomes possible to achieve high quality film formation (silicon nitride film, silicon oxide film, polycrystalline silicon film, etc.) Particularly when continuously forming the gate insulating film and the silicon film, if exposing the same to the activated hydrogen H*, due to the hydrogen annealing effect, it becomes possible to produce a high quality semiconductor device of a semiconductor-insulator interface structure having a low interface level density.

Accordingly, by the method according to the present invention, not only in the top gate type, but also in the bottom gate type and dual gate type TFT, a polycrystalline silicon film and a single crystalline silicon film having a high electron/positive hole mobility are obtained. Accordingly, the production of a semiconductor device, electro-optic device, etc. using this high performance polycrystalline silicon film or single crystalline silicon film becomes possible.

In this polycrystalline silicon film, according to the type and temperature of the thermal catalyst, the substrate heating temperature, CVD film formation conditions, type of the material gas and the N- or P-type impurity concentration to be added, a polycrystalline silicon film having a wide range of N- or P-type impurity concentrations is easily obtained, therefore adjustment of the Vth is easy and high speed operation at a low resistance becomes possible.

When continuously forming a film by high density plasma CVD, catalytic CVD, or the like, by gradually reducing or increasing the film formation material gases in the same chamber, it is possible to obtain inclined interface films, therefore the stress between adjoining films is reduced, and the production of a semiconductor device of a high quality insulator-semiconductor interface structure becomes possible.

Further, when forming films in different chambers in vacuum, contamination is prevented and the stress between adjoining films is reduced, so the production of a high quality polycrystalline silicon semiconductor device etc. becomes possible.

Further, since a step is formed in at least the semiconductor device forming region of the substrate, the single crystalline silicon film is grapho-epitaxially grown by using this step as a seed, or a substance layer having a good lattice alignment with the single crystalline semiconductor, for example, single crystalline silicon, is formed in at least the semiconductor device forming region of the substrate, and the single crystalline silicon film (Si) is hetero-epitaxially grown by using this substance layer having a good lattice alignment as a seed, a single crystalline silicon film having a high electron mobility excellent in operability can be obtained.

CAPABILITY OF UTILIZATION IN INDUSTRY

As described above, according to the thin film forming apparatus and thin film forming method and the method of producing the thin film semiconductor device according to the present invention, when forming a thin film on the substrate, a carrier gas containing hydrogen is used, so the activated hydrogen H* generated in the carrier gas cleans the substrate surface and it becomes possible to obtain a high quality thin film layer on the substrate.

What is claimed is:

1. A thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming the thin film on the substrate, and the apparatus comprises a means for raising a concentration of the material gas in the vacuum chamber in the middle of the formation of the thin film on the substrate.

2. A thin film forming apparatus as set forth in claim 1, wherein said means for raising the concentration of the material gas has a carrier gas controlling means for reducing or stopping the feed of said carrier gas in the middle of the formation of the thin film on said substrate.

3. A thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming a thin film on the substrate, and the carrier gas is fed into the vacuum chamber during at least the formation of the thin film, wherein at least a first material gas for forming a first thin film on said substrate and a second material gas for forming a second thin film on said substrate are fed from said gas introduction system, and the apparatus comprises a material gas controlling means for introducing said second material gas into said vacuum chamber after an elapse of a predetermined time after said first material gas is discharged from said vacuum chamber.

4. A thin film forming apparatus as set forth in claim 1, wherein at least a first material gas for forming a first thin film on said substrate and a second material gas for forming a second thin film on said substrate are fed from said gas introduction system, and the apparatus comprises a material gas controlling means for introducing said second material gas into said vacuum chamber after an elapse of a predetermined time after said first material gas is discharged from said vacuum chamber.

5. A thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming a thin film on the substrate, and the carrier gas is fed into the vacuum chamber during at least the formation of the thin film, wherein at least a first material gas for forming a first thin film on said substrate and a second material gas for forming a second thin film on said substrate are fed from said gas introduction system, and the apparatus comprises a material gas controlling means for introducing said second material gas into said vacuum chamber at substantially the same time as the discharge of said first material gas from said vacuum chamber.

6. A thin film forming apparatus as set forth in claim 1, wherein at least a first material gas for forming a first thin film on said substrate and a second material gas for forming a second thin film on said substrate are fed from said gas introduction system, and the apparatus comprises a material gas controlling means for introducing said second material gas into said vacuum chamber at substantially the same time as the discharge of said first material gas from said vacuum chamber.

7. A thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming a thin film on the substrate, and the carrier gas is fed into the vacuum chamber during at least the formation of the thin film, wherein at least a first material gas for forming a first thin film on said substrate and a second material gas for forming a second thin film on said substrate are fed from said gas introduction system, and the apparatus comprises a material gas controlling means for introducing said second material gas into said vacuum chamber in a state where said first material gas remains in said vacuum chamber when said first material gas is discharged from said vacuum chamber.

8. A thin film forming apparatus as set forth in claim 1, wherein at least a first material gas for forming a first thin film on said substrate and a second material gas for forming a second thin film on said substrate are fed from said gas introduction system, and the apparatus comprises a material gas controlling means for introducing said second material gas into said vacuum chamber in a state where said first material gas remains in said vacuum chamber when said first material gas is discharged from said vacuum chamber.

9. A thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming a thin film on the substrate, and the carrier gas is fed into the vacuum chamber during at least the formation of the thin film, wherein said gas introduction system includes a gas spraying portion located in said vacuum chamber, and said gas spraying portion comprises a position adjusting means for changing a distance from said thermal catalyst.

10. A thin film forming apparatus comprising a vacuum chamber, a substrate, a thermal catalyst, and a heating means for heating the thermal catalyst, wherein a gas introduction system for introducing a gas is connected to the vacuum chamber and wherein the gas is fed from the gas introduction system into the vacuum chamber to form a thin film on a surface of the substrate by utilizing a thermal decomposition reaction and a catalytic reaction by the thermal catalyst, the gas introduction system introduces a carrier gas containing hydrogen and a material gas for forming a thin film on the substrate, the carrier gas is fed into the vacuum chamber during at least the formation of the thin film, a cooling means for cooling the gas is provided in at least the gas spraying portion to said thermal catalyst of said gas introduction system, wherein a gas shower plate with a plurality of spraying holes formed therein is arranged between the gas spraying port of said gas introduction system and said thermal catalyst.

11. A thin film forming apparatus as set forth in claim 2, comprising a thermal catalyst holding means for holding said thermal catalyst moveably in said vacuum chamber and capable of adjusting the distance between said substrate and the thermal catalyst.

12. A thin film forming apparatus as set forth in claim 2, comprising a substrate holder with said substrate placed thereon moveable in said vacuum chamber and capable of adjusting the distance between said substrate and said thermal catalyst.

13. A thin film forming apparatus as set forth in claim 12, wherein said substrate holder is rotatable in any direction by any angle with respect to said thermal catalyst.

14. A thin film forming apparatus as set forth in claim 12, wherein said substrate holder contains silicon carbide, graphite coated by silicon carbide, or quartz glass containing a heater as a principal element.

15. A thin film forming apparatus as set forth in claim 12, wherein a rail is laid in said vacuum chamber, and said substrate holder comprises a means enabling movement on said rail.

16. A thin film forming apparatus as set forth in claim 2, comprising a shutter capable of blocking between said thermal catalyst and said substrate.

17. A thin film forming apparatus as set forth in claim 2, wherein a plurality of said thermal catalysts are arranged in said vacuum chamber.

18. A thin film forming apparatus as set forth in claim 17, wherein said thermal catalysts are formed by the same material or different materials.

19. A thin film forming apparatus as set forth in claim 17, wherein said plurality of thermal catalysts are formed into the same shape or different shapes.

20. A thin film forming apparatus as set forth in claim 17, wherein said plurality of thermal catalysts are connected to a power supply for supplying the same current and voltage or power supplies for supplying different currents and voltages.

21. A thin film forming apparatus as set forth in claim 20, wherein said power supply is a DC power supply or an AC power supply.

22. A thin film forming apparatus as set forth in claim 2, wherein said vacuum chamber contains quartz glass as a principal element.

23. A thin film forming apparatus as set forth in claim 2, wherein said vacuum chamber has a quartz glass tube arranged inside a chamber made of metal.

24. A thin film forming apparatus as set forth in claim 2, wherein said thermal catalyst contains at least one type of material selected from a group consisting of tungsten, tungsten containing thoria, platinum, molybdenum, palladium, tantalum, metal deposited ceramics, silicon, alumina, silicon carbide, refractory metals (tungsten, tantalum, tungsten containing thoria, molybdenum, titanium, etc.) coated with silicon carbide or ceramics or conductive nitride films, silicon nitride or oxide, conductive metal nitrides (tungsten nitride, titanium nitride, molybdenum nitride, tantalum nitride, etc.), boronitride (BN), and silicide.

25. A thin film forming apparatus as set forth in claim 2, wherein said substrate is selected from among semiconductor or insulative materials including silicon, germanium, silicon germanium, silicon carbide, gallium arsenic, gallium aluminum arsenic, gallium phosphorus, indium phosphorus, zinc selenide, cadmium sulfide, quartz glass, borosilicate glass, aluminosilicate glass, and heat resistant resins.

26. A thin film forming apparatus as set forth in claim 2, wherein said thin film formed by the gas introduced by said gas introduction system includes a gate insulating film, and the gate insulating film makes it possible to introduce the material gas for forming either of a silicon oxide film, silicon nitride film, silicon oxynitridefilm, aluminum nitride film, aluminum oxide film, tantalum oxide film, or a composite film of them from said gas introduction system.

27. A thin film forming apparatus as set forth in claim 2, wherein said thin film forming apparatus is constituted by a single chamber or a multi-chamber.

28. A thin film forming apparatus as set forth in claim 2, wherein a semiconductor thin film such as polycrystalline silicon, single crystalline silicon, amorphous silicon, microcrystalline silicon, silicon germanium, silicon carbide, compound semiconductor (containing at least either of gallium arsenic, gallium phosphorus, gallium nitride), diamond, and diamond-like carbon (DLC), an insulator thin film such as silicon oxide, silicon oxide containing impurities (containing at least either of phosphosilicate glass (PSG), borosilicate glass (BSG), borophosphosilicate glass (BPSG)), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a metal thin film made by a refractory metal and conductive metal nitride thin film (containing at least either of tungsten, titanium, tantalum, molybdenum, tungsten nitride, titanium nitride, tantalum nitride, molybdenum nitride), silicide, copper, aluminum, aluminum-silicon or aluminum-silicon-copper, a high dielectric constant thin film such as BST, and a ferroelectric thin film such as PZT, PLZT, SBT, and BIT is grown in a vapor phase.

29. A thin film forming apparatus as set forth in claim 2 used for manufacturing a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a silicon carbide semiconductor device, a silicon carbide semiconductor integrated circuit device, a diamond semiconductor device, a diamond semiconductor integrated circuit device, a liquid crystal display device, an electroluminescence display device, a plasma display panel (PDP) device, a light emission polymer display device, a light emission diode display device, a CCD area/linear sensor device, a MOS sensor device, a high dielectric/ferroelectric memory semiconductor device, a high dielectric/ferroelectric memory semiconductor integrated circuit device, a solar battery.

30. A method for forming a thin film on a substrate in a vacuum chamber by catalytic CVD or high density plasma CVD or high density catalytic CVD, comprising:
   a cleaning step of feeding a carrier gas containing hydrogen to the vacuum chamber and cleaning the top of the substrate by activated hydrogen H* generated in the fed carrier gas, and
   a thin film forming step of forming the thin film on the substrate by feeding a material gas to the vacuum chamber.

31. A thin film forming method as set forth in claim 30, wherein thin films are stacked on said substrate by repeating said cleaning step and said thin film forming step.

32. A thin film forming method as set forth in claim 30, wherein thin films are stacked on said substrate by repeating said thin film forming step after said cleaning step.

33. A method for forming a thin film on a substrate in a vacuum chamber by catalytic CVD or high density plasma CVD or high density catalytic CVD, comprising:
   a cleaning step of feeding a carrier gas containing hydrogen to the vacuum chamber and cleaning the top of the substrate by activated hydrogen H* generated in the fed carrier gas, and
   a thin film forming step of forming the thin film on the substrate by feeding a material gas to the vacuum chamber,
   a silicon film being grown in at least a thin film semiconductor device forming region of said substrate by said cleaning step and said thin film forming step, and
   at least a gate insulating film being grown continuing from said silicon film.

34. A thin film forming method as set forth in claim 33, wherein,
   said silicon film is formed in at least the thin film semiconductor device forming region of said substrate by repeating said cleaning step and said thin film forming step and
   at least a gate insulating film is grown continuing from said silicon film.

35. A thin film forming method as set forth in claim 33, wherein
   said silicon film is formed in at least the thin film semiconductor device forming region of said substrate by repeating said thin film forming step after said cleaning step and
   at least a gate insulating film is grown continuing from said silicon film.

36. A method for forming a thin film on a substrate in a vacuum chamber by catalytic CVD or high density plasma CVD or high density catalytic CVD, comprising:
   a cleaning step of feeding a carrier gas containing hydrogen to the vacuum chamber and cleaning the top of the substrate by activated hydrogen H* generated in the fed carrier gas, and
   a thin film forming step of forming the thin film on the substrate by feeding a material gas to the vacuum chamber,
   at least a gate insulating film being grown in at least the thin film semiconductor device forming region of said substrate with a gate electrode formed in advance therein by said cleaning step and said thin film forming step, and
   at least a silicon film being grown continuing from said gate insulating film.

37. A thin film forming method as set forth in claim 36, wherein,
   at least said gate insulating film is grown in at least the thin film semiconductor device forming region of said substrate with the gate electrode formed in advance therein by repeating said cleaning step and said thin film forming step, and
   at least a silicon film is grown continuing from said gate insulating film.

38. A thin film forming method as set forth in claim 36, wherein
   at least said gate insulating film is grown in at least the thin film semiconductor device forming region of said substrate with the gate electrode formed in advance therein by repeating said thin film forming step after said cleaning step, and
   at least a silicon film is grown continuing from said gate insulating film.

39. A method for forming a thin film on a substrate in a vacuum chamber by catalytic CVD or high density plasma CVD or high density catalytic CVD, comprising:
   a cleaning step of feeding a carrier gas containing hydrogen to the vacuum chamber and cleaning the top of the substrate by activated hydrogen H* generated in the fed carrier gas, and
   a thin film forming step of forming a thin film on the substrate by feeding a material gas to the vacuum chamber,
   at least a first gate insulating film being grown in at least the thin film semiconductor device forming region of said substrate with the first gate electrode formed in advance therein by said cleaning step and said thin film forming step,
   a first thin film layer being formed by growing at least a silicon film continuing from said first gate insulating film, and
   at least a second gate insulating film for a second gate electrode being grown continuing from said first thin film layer.

40. A thin film forming method as set forth in claim 39, wherein,
   at least a first gate insulating film is grown in at least the thin film semiconductor device forming region of said substrate with the first gate electrode formed in advance therein by repeating said cleaning step and said thin film forming step,
   a first thin film layer is formed by growing at least a silicon film continuing from said first gate insulating film, and
   at least a second gate insulating film for a second gate electrode is grown continuing from said first thin film layer.

41. A thin film forming method as set forth in claim 39, wherein at least a first gate insulating film is grown in at least the thin film semiconductor device forming region of said substrate with the first gate electrode formed in advance therein by repeating said thin film forming step after said cleaning step.

42. A thin film forming method as set forth in claim 30, wherein, in said thin film forming step, by feeding the first material gas to said vacuum chamber and feeding the second material gas to said vacuum chamber in a state where the first material gas remains in said vacuum chamber, the thin film formed by the second material gas is joined by an inclined interface onto the thin film formed by the first material gas and stacked on said substrate.

43. A thin film forming method as set forth in claim 30, wherein
   a step is formed in at least the semiconductor device forming region of said substrate and
   a single crystalline semiconductor film is graphoepitaxially grown on said substrate containing the step.

44. A thin film forming method as set forth in claim 30, wherein a substance layer having a good lattice alignment with the single crystalline semiconductor is formed in at least the semiconductor device forming region of said substrate and
   the single crystalline semiconductor film is heteroepitaxially grown on said substrate containing the substance layer.

45. A thin film forming method as set forth in claim 44, wherein said substance layer having a good lattice alignment with the single crystalline semiconductor is a substance selected from a group consisting of sapphire, a spinel structure, and calcium fluoride.

46. A thin film forming method as set forth in claim 30, wherein said thin film is formed in either of a single chamber or a multi-chamber.

47. A thin film forming method as set forth in claim 30, wherein said catalytic CVD is a process for activating and ionizing at least part of a material by a catalytic reaction or a thermal decomposition reaction for the thermal catalyst heated to less than the melting point and depositing these deposition seeds on a heated substrate.

48. A thin film forming method as set forth in claim 47, wherein the distance between said substrate and the thermal catalyst is adjusted to a desired distance.

49. A thin film forming method as set forth in claim 47, wherein said thermal catalyst contains at least one type of material selected from a group consisting of tungsten, tungsten containing thoria, platinum, molybdenum, palladium, tantalum, metal deposited ceramics, silicon, alumina, silicon carbide, refractory metals (tungsten, tantalum, tungsten containing thoria, molybdenum, titanium, etc.) coated with silicon carbide or ceramics or conductive nitride films, silicon nitride or oxide, conductive metal nitrides (tungsten nitride, titanium nitride, molybdenum nitride, tantalum nitride, etc.), boronitride (BN), and silicide.

50. A thin film forming method as set forth in claim 49, wherein the distance between said thermal catalyst and said substrate is adjusted to a desired distance.

51. A thin film forming method as set forth in claim 49, wherein a plurality of said thermal catalysts are arranged in the vacuum chamber, and
   the thin film is formed on the surface of said substrate by utilizing a thermal decomposition reaction or catalytic reaction by a plurality of thermal catalysts.

52. A thin film forming method as set forth in claim 51, wherein said thermal catalysts are formed by the same material or different materials.

53. A thin film forming method as set forth in claim 51, wherein said plurality of thermal catalysts are formed into the same shape or different shapes.

54. A thin film forming method as set forth in claim 51, wherein the same electric power or different electric powers are supplied to said plurality of thermal catalysts.

55. A thin film forming method as set forth in claim 54, wherein said electric power is supplied as a DC or an AC or superposing the AC on the DC.

56. A thin film forming method as set forth in claim 30, wherein a semiconductor thin film such as polycrystalline silicon, single crystalline silicon, amorphous silicon, microcrystalline silicon, silicon germanium, silicon carbide, compound semiconductor (containing at least either of gallium arsenic, gallium phosphorus, gallium nitride), diamond, and diamond-like carbon (DLC), an insulator thin film such as silicon oxide, silicon oxide containing impurities (containing at least either of phosphosilicate glass (PSG), borosilicate glass (BSG), borophosphosilicate glass (BPSG)), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a thin film made by a refractory metal and conductive metal nitride thin film (containing at least either of tungsten, titanium, tantalum, molybdenum, tungsten nitride, titanium nitride, tantalum nitride, molybdenum nitride), silicide, copper, aluminum, aluminum-silicon or aluminum-silicon-copper, a high dielectric constant thin film such as BST, and a ferroelectric thin film such as PZT, PLZT, SBT, and BIT is formed on said substrate.

57. A thin film forming method as set forth in claim 56, wherein said silicon nitride film is formed by a gas containing hydrogen as the carrier gas, and a gas containing a silane-based gas such as monosilane, disilane, or trisilane and ammonia as the material gas.

58. A thin film forming method as set forth in claim 56, wherein said silicon oxide film is formed by a gas containing hydrogen as the carrier gas, a silane-based gas such as monosilane, disilane, or trisilane, and an inert gas diluted oxygen (for example argon- or helium-diluted oxygen) or ozone diluted with an inert gas (argon, helium, etc.) as the material gas.

59. A thin film forming method as set forth in claim 56, wherein said polycrystalline silicon film and single crystalline silicon film are formed by a gas containing hydrogen as the carrier gas and containing at least one of monosilane, disilane, and trisilane as the material gas.

60. A thin film forming method as set forth in claim 56, wherein said polycrystalline silicon film and single crystalline silicon film are formed as an N-type by mixing phosphine, arsine, and stibine into the silane-based gas containing monosilane, disilane, and trisilane in an appropriate amount and formed as a P-type by mixing diborane into a silane-based gas containing monosilane, disilane, and trisilane so as to control a carrier impurity concentration.

61. A thin film forming method as set forth in claim 30, wherein said substrate is selected from among semiconductor or insulative materials including silicon, germanium, silicon germanium, silicon carbide, gallium arsenic, gallium aluminum arsenic, gallium phosphorus, indium phosphorus, zinc selenide, cadmium sulfide, quartz glass, borosilicate glass, aluminosilicate glass, and heat resistant resins.

62. A thin film forming method as set forth in claim 30, wherein said thin film includes a gate insulating film, and the gate insulating film is selected from among a silicon oxide film, silicon nitride film, silicon oxynitridefilm, aluminum nitride film, aluminum oxide film, and tantalum oxide film.

63. A method for producing a thin film semiconductor device including a thin film layer by forming a thin film layer on a substrate in a vacuum chamber by catalytic CVD or high density plasma CVD or high density catalytic CVD, comprising:

a cleaning step of feeding a carrier gas containing hydrogen to said vacuum chamber and cleaning the top of said substrate by activated hydrogen H* generated in the fed carrier gas, and a thin film forming step of forming a thin film on said substrate by feeding a material gas to said vacuum chamber, thin films being stacked on said substrate to form a thin film layer by said cleaning step and said thin film forming step and predetermined processing being applied to the thin film layer to fabricate a semiconductor element.

64. A method for producing a thin film semiconductor device as set forth in claim 63, wherein, in the step of fabricating said semiconductor element, thin films are stacked on said substrate to form a thin film layer by repeating said cleaning step and said thin film forming step, and predetermined processing is applied to the thin film layer to fabricate a semiconductor element.

65. A method for producing a thin film semiconductor device as set forth in claim 63, wherein, in the step of fabricating said semiconductor element, thin films are stacked on said substrate to form the thin film layer by repeating said thin film forming step after said cleaning step, and predetermined processing is applied to the thin film layer to fabricate a semiconductor element.

66. A method for producing a thin film semiconductor device containing a thin film layer by forming a thin film layer on a substrate in a vacuum chamber by catalytic CVD or high density plasma CVD or high density catalytic CVD, comprising:

a cleaning step of feeding a carrier gas containing hydrogen to the vacuum chamber and cleaning the top of the substrate by activated hydrogen H* generated in the fed carrier gas, a thin film forming step of forming a thin film on the substrate by feeding a material gas to said vacuum chamber, and a step of forming a silicon film in at least the thin film semiconductor device forming region of the substrate, forming a thin film layer by growing at least a gate insulating film continuing from the silicon film and applying predetermined processing to the thin film layer to fabricate a top gate type TFT.

67. A method for producing a thin film semiconductor device as set forth in claim 66, wherein, in the step of fabricating said top gate type TFT, the silicon film is formed in at least the thin film semiconductor device forming region of said substrate by repeating said cleaning step and said thin film forming step, the thin film layer is formed by growing at least the gate insulating film continuing from the silicon film, and predetermined processing is applied to the thin film layer to fabricate the top gate type TFT.

68. A method for producing a thin film semiconductor device as set forth in claim 66, wherein, in the step of fabricating said top gate type TFT, the silicon film is formed in at least the thin film semiconductor device forming region of said substrate by repeating said thin film forming step after said cleaning step, the thin film layer is formed by growing at least the gate insulating film continuing from the silicon film, and predetermined processing is applied to the thin film layer to fabricate the top gate type TFT.

69. A method for producing a thin film semiconductor device including a thin film layer by forming a thin film layer on a substrate in a vacuum chamber by catalytic CVD or high density plasma CVD or high density catalytic CVD, comprising:

a cleaning step of feeding a carrier gas containing hydrogen to said vacuum chamber and cleaning the top of said substrate by activated hydrogen H* generated in the fed carrier gas, a thin film forming step of forming a thin film on said substrate by feeding a material gas to said vacuum chamber, and a step of growing at least a gate insulating film in at least the thin film semiconductor device forming region of said substrate with a gate electrode formed in advance therein by said cleaning step and said thin film forming step, forming a thin film layer by growing at least a silicon film continuing from the gate insulating film, and applying predetermined processing to the thin film layer to fabricate a bottom gate type TFT.

70. A method for producing a thin film semiconductor device as set forth in claim 69, wherein, in the step of fabricating said bottom gate type TFT, at least the gate insulating film is grown in at least the thin film semiconductor device forming region of said substrate with the gate electrode formed in advance therein by repeating said cleaning step and said thin film forming step, the thin film layer is formed by growing at least the silicon film continuing from the gate insulating film, and predetermined processing is applied to the thin film layer to fabricate the bottom gate type TFT.

71. A method for producing a thin film semiconductor device as set forth in claim 69, wherein, in the step of fabricating said bottom gate type TFT, at least the gate insulating film is grown in at least the thin film semiconductor device forming region of said substrate with the gate electrode formed in advance therein by repeating said thin film forming step after said cleaning step, a thin film layer is formed by growing at least the silicon film continuing from the gate insulating film, and predetermined processing is applied to the thin film layer to fabricate the bottom gate type TFT.

72. A method for producing a thin film semiconductor device including a thin film layer by forming a thin film layer on a substrate in a vacuum chamber by catalytic CVD or high density plasma CVD or high density catalytic CVD, comprising:

a cleaning step of feeding a carrier gas containing hydrogen to said vacuum chamber and cleaning the top of said substrate by activated hydrogen H* generated in the fed carrier gas, a thin film forming step of forming a thin film on said substrate by feeding a material gas to said vacuum chamber, and a step of by growing at least a first gate insulating film in at least the thin film semiconductor device forming region of said substrate with a first gate electrode formed in advance therein by said cleaning step and said thin film forming step, forming a first thin film layer by growing at least a silicon film continuing from the first gate insulating film, forming a second thin film layer by growing at least a second gate insulating film for a second gate electrode continuing from the first thin film layer, and applying predetermined processing to said first thin film layer and second thin film layer to fabricate a dual gate type TFT.

73. A method for producing a thin film semiconductor device as set forth in claim 72, wherein, in the step of fabricating said dual gate type TFT, at least the first gate insulating film is grown in at least the thin film semiconductor device forming region of said substrate with the first gate electrode formed in advance therein by repeating said cleaning step and said thin film forming step, the first thin film layer is formed by growing at least the silicon film continuing from the first gate insulating film, the second thin film layer is formed by growing at least the second gate insulating film for the second gate electrode continuing from the first thin film layer, and predetermined processing is applied to said first thin film layer and second thin film layer to fabricate the dual gate type TFT.

74. A method for producing a thin film semiconductor device as set forth in claim 72, wherein, in the step of fabricating said dual gate type TFT, at least the first gate insulating film is grown in at least the thin film semiconductor device forming region of said substrate with the first gate electrode formed in advance therein by repeating said thin film forming step after said cleaning step, the first thin film layer is formed by growing at least the silicon film continuing from the first gate insulating film, the second thin film layer is formed by growing at least the second gate insulating film for the second gate electrode continuing from the first thin film layer, and predetermined processing is applied to said first thin film layer and second thin film layer to fabricate the dual gate type TFT.

75. A method for producing a thin film semiconductor device as set forth in claim 63, wherein a step is formed in at least the semiconductor device forming region of said substrate and a single crystalline semiconductor film is graphoepitaxially grown on said substrate containing the step.

76. A method for producing a thin film semiconductor device as set forth in claim 63, wherein a substance layer having a good lattice alignment with a single crystalline semiconductor is formed in at least the semiconductor device forming region of said substrate and a single crystalline semiconductor film is heteroepitaxially grown on said substrate containing the substance layer.

77. A method for producing a thin film semiconductor device as set forth in claim 63, wherein said thin film layer is applied to a channel region, a source region, and a drain region of an insulating gate type field effect transistor and the types of the impurities injected into these regions and/or concentrations thereof are controlled.

78. A method for producing a thin film semiconductor device as set forth in claim 63, wherein said thin film semiconductor device is a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a silicon carbide semiconductor device, a silicon carbide semiconductor integrated circuit device, a diamond semiconductor device, a diamond semiconductor integrated circuit device, a liquid crystal display device, electroluminescence display device, a plasma display panel (PDP) device, a light emission polymer display device, a light emission diode display device, a CCD area/linear sensor device, a MOS sensor device, a high dielectric/ferroelectric memory semiconductor device, a high dielectric/ferroelectric memory semiconductor integrated circuit device, or a solar battery.

79. A method for forming a thin film on a substrate in a vacuum chamber by catalytic CVD or high density plasma CVD or high density catalytic CVD, comprising:

a cleaning step of feeding a carrier gas containing hydrogen to said vacuum chamber and cleaning the top of said substrate by the activated hydrogen H* generated in the carrier gas, a thin film forming step of forming the thin film on said substrate by feeding a material gas to said vacuum chamber, and a step of raising the concentration of the material gas in said vacuum chamber in the middle of the formation of the thin film on said substrate.

80. A thin film forming method as set forth in claim 79, wherein thin films are stacked on said substrate by repeating said cleaning step, said thin film forming step, and said step of raising the concentration of the material gas.

81. A thin film forming method as set forth in claim 79, wherein thin films are stacked on said substrate by repeating said thin film forming step and said step of raising the concentration of the material gas after said cleaning step.

82. A method for forming a thin film on a substrate in a vacuum chamber by catalytic CVD or high density plasma CVD or high density catalytic CVD, comprising:

a cleaning step of feeding a carrier gas containing hydrogen to said vacuum chamber and cleaning the top of said substrate by the activated hydrogen H* generated in the carrier gas, a thin film forming step of forming a thin film on said substrate by feeding a material gas to said vacuum chamber, and a step of raising the concentration of the material gas in said vacuum chamber in the middle of the formation of the thin film on said substrate, a silicon film being grown in at least the thin film semiconductor device forming region of said substrate by said cleaning step, said thin film forming step, and said step of raising the concentration of the material gas, and at least a gate insulating film being grown continuing from said silicon film.

83. A thin film forming method as set forth in claim 82, wherein, a silicon film is grown in at least the thin film semiconductor device forming region of said substrate by repeating said cleaning step, said thin film forming step, and said step of raising the concentration of the material gas, and at least a gate insulating film is grown continuing from said silicon film.

84. A thin film forming method as set forth in claim 82, wherein, a silicon film is grown in at least the thin film semiconductor device forming region of said substrate by repeating said thin film forming step and said step of raising the concentration of the material gas after said cleaning step, and at least a gate insulating film is grown continuing from said silicon film.

85. A method for forming a thin film on a substrate in a vacuum chamber by catalytic CVD or high density plasma CVD or high density catalytic CVD, comprising:

a cleaning step of feeding a carrier gas containing hydrogen to said vacuum chamber and cleaning the top of said substrate by the activated hydrogen H* generated in the carrier gas, a thin film forming step of forming a thin film on said substrate by feeding a material gas to said vacuum chamber, and a step of raising the concentration of the material gas in said vacuum chamber in the middle of the formation of the thin film on said substrate, at least a gate insulating film being grown in at least the thin film semiconductor device forming region of said substrate with the gate electrode formed in advance therein by said cleaning step, said thin film forming step, and said step of raising the concentration of the material gas, and at least a silicon film being grown continuing from said gate insulating film.

86. A thin film forming method as set forth in claim 85, wherein, at least the gate insulating film is grown in at least the thin film semiconductor device forming region of said substrate with the gate electrode formed in advance therein by repeating said cleaning step, said thin film forming step, and said step of raising the concentration of the material gas, and at least the silicon film is grown continuing from said gate insulating film.

87. A thin film forming method as set forth in claim 85, wherein, at least the gate insulating film is grown in at least the thin film semiconductor device forming region of said substrate with the gate electrode formed in advance therein by repeating said thin film forming step and said step of raising the concentration of the material gas after said cleaning step, and at least the silicon film is grown continuing from said gate insulating film.

88. A method for forming the thin film on the substrate in the vacuum chamber by catalytic CVD or high density plasma CVD or high density catalytic CVD, comprising:

a cleaning step of feeding a carrier gas containing hydrogen to said vacuum chamber and cleaning the top of said substrate by the activated hydrogen H* generated in the carrier gas, a thin film forming step of forming a thin film on said substrate by feeding a material gas to said vacuum chamber, and a step the raising a concentration of the material gas in said vacuum chamber in the middle of the formation of the thin film on said substrate, at least a first gate insulating film being formed in at least the thin film semiconductor device forming region of said substrate with a first gate electrode formed in advance therein by said cleaning step, said thin film forming step, and said step of raising the concentration of the material gas, a first thin film layer being formed by growing at least a silicon film continuing from said first gate insulating film, and at least a second gate insulating film for a second gate electrode being formed continuing from said first thin film layer.

89. A thin film forming method as set forth in claim 88, wherein, at least the first gate insulating film is grown in at least the thin film semiconductor device forming region of said substrate with the first gate electrode formed in advance therein by repeating said cleaning step, said thin film forming step, and said step of raising the concentration of the material gas, the first thin film layer is formed by growing at least the silicon film continuing from said first gate insulating film, and at least the second gate insulating film for the second gate electrode is formed continuing from said first thin film layer.

90. A thin film forming method as set forth in claim 88, wherein, at least the first gate insulating film is grown in at least the thin film semiconductor device forming region of said substrate with the first gate electrode formed in advance therein by repeating said thin film forming step and said step of raising the concentration of the material gas after said cleaning step, the first thin film layer is formed by growing at least the silicon film continuing from said first gate insulating film, and at least the second gate insulating film for the second gate electrode is formed continuing from said first thin film layer.

91. A thin film forming method as set forth in claim 79, wherein, in said step of raising the concentration of the material gas, the feed of the carrier gas is reduced or stopped in the middle of the formation of the thin film on said substrate.

92. A thin film forming method as set forth in claim 79, wherein, in said thin film forming step, by feeding the first material gas to said vacuum chamber and feeding the second material gas to said vacuum chamber in a state where the first material gas remains in said vacuum chamber, the thin film formed by the second material gas is joined by an inclined interface onto the thin film formed by the first material gas and stacked on said substrate.

93. A thin film forming method as set forth in claim 79, wherein a step is formed in at least the semiconductor device forming region of said substrate and a single crystalline semiconductor film is graphoepitaxially grown on said substrate containing the step.

94. A thin film forming method as set forth in claim 79, wherein a substance layer having a good lattice alignment with the single crystalline semiconductor is formed in at least the semiconductor device forming region of said substrate and the single crystalline semiconductor film is heteroepitaxially grown on said substrate containing the substance layer.

95. A thin film forming method as set forth in claim 94, wherein said substance layer having a good lattice alignment with the single crystalline semiconductor is a substance selected from a group consisting of sapphire, a spinel structure, and calcium fluoride.

96. A thin film forming method as set forth in claim 79, wherein said thin film is formed in either of a single chamber or a multi-chamber.

97. A thin film forming method as set forth in claim 79, wherein said catalytic CVD is a process for activating and ionizing at least part of a material by a catalytic reaction or a thermal decomposition reaction for the thermal catalyst heated to less than the melting point and depositing these deposition seeds on a heated substrate.

98. A thin film forming method as set forth in claim 97, wherein the distance between said substrate and the thermal catalyst is adjusted to a desired distance.

99. A thin film forming method as set forth in claim 97, wherein said thermal catalyst contains at least one type of material selected from a group consisting of tungsten, tungsten containing thoria, platinum, molybdenum, palladium, tantalum, metal deposited ceramics, silicon, alumina, silicon carbide, refractory metals (tungsten, tantalum, tungsten containing thoria, molybdenum, titanium, etc.) coated with silicon carbide or ceramics or conductive nitride films, silicon nitride or oxide, conductive metal nitrides (tungsten nitride, titanium nitride, molybdenum nitride, tantalum nitride, etc.), boronitride (BN), and silicide.

100. A thin film forming method as set forth in claim 99, wherein the distance between said thermal catalyst and said substrate is adjusted to a desired distance.

101. A thin film forming method as set forth in claim 99, wherein
a plurality of said thermal catalysts are arranged in the vacuum chamber, and
the thin film is formed on the surface of said substrate by utilizing a thermal decomposition reaction or catalytic reaction by a plurality of thermal catalysts.

102. A thin film forming method as set forth in claim 101, wherein said thermal catalysts are formed by the same material or different materials.

103. A thin film forming method as set forth in claim 101, wherein said plurality of thermal catalysts are formed into the same shape or different shapes.

104. A thin film forming method as set forth in claim 101, wherein the same electric power or different electric powers are supplied to said plurality of thermal catalysts.

105. A thin film forming method as set forth in claim 104, wherein said electric power is supplied as a DC or an AC or superposing the AC on the DC.

106. A thin film forming method as set forth in claim 79, wherein a semiconductor thin film such as polycrystalline silicon, single crystalline silicon, amorphous silicon, microcrystalline silicon, silicon germanium, silicon carbide, compound semiconductor (containing at least either of gallium arsenic, gallium phosphorus, gallium nitride), diamond, and diamond-like carbon (DLC), an insulator thin film such as silicon oxide, silicon oxide containing impurities (containing at least either of phosphosilicate glass (PSG), borosilicate glass (BSG), borophosphosilicate glass (BPSG)), silicon nitride, silicon oxynitride, molybdenum oxide, titanium oxide, tantalum oxide, and aluminum oxide, an oxidative conductive thin film such as ruthenium oxide, indium oxide, indium tin oxide (ITO), iridium oxide, and palladium oxide, a metal thin film made by a refractory metal and conductive metal nitride thin film (containing at least either of tungsten, titanium, tantalum, molybdenum, tungsten nitride, titanium nitride, tantalum nitride, molybdenum nitride), silicide, copper, aluminum, aluminum-silicon or aluminum-silicon-copper, a high dielectric constant thin film such as BST, and a ferroelectric thin film such as PZT, PLZT, SBT, and BIT is formed on the substrate.

107. A thin film forming method as set forth in claim 106, wherein said silicon nitride film is formed by a gas containing hydrogen as the carrier gas, and a gas containing a silane-based gas such as monosilane, disilane, or trisilane and ammonia as the material gas.

108. A thin film forming method as set forth in claim 106, wherein said silicon oxide film is formed by a gas containing hydrogen as the carrier gas, a silane-based gas such as monosilane, disilane, or trisilane, and an inert gas diluted oxygen (for example argon- or helium-diluted oxygen) or ozone diluted with an inert gas (argon, helium, etc.) as the material gas.

109. A thin film forming method as set forth in claim 106, wherein said polycrystalline silicon film and single crystalline silicon film are formed by a gas containing hydrogen as the carrier gas and containing at least one of monosilane, disilane, and trisilane as the material gas.

110. A thin film forming method as set forth in claim 106, wherein said polycrystalline silicon film and single crystalline silicon film are formed as an N-type by mixing phosphine, arsine, and stibine into the silane-based gas containing monosilane, disilane, and trisilane in an appropriate amount and formed as a P-type by mixing diborane into a silane-based gas containing monosilane, disilane, and trisilane so as to control a carrier impurity concentration.

111. A thin film forming method as set forth in claim 79, wherein said substrate is selected from among semiconductor or insulative materials including silicon, germanium, silicon germanium, silicon carbide, gallium arsenic, gallium aluminum arsenic, gallium phosphorus, indium phosphorus, zinc selenide, cadmium sulfide, quartz glass, borosilicate glass, aluminosilicate glass, and heat resistant resins.

112. A thin film forming method as set forth in claim 79, wherein said thin film includes a gate insulating film, and the gate insulating film is selected from among a silicon oxide film, silicon nitride film, silicon oxynitridefilm, aluminum nitride film, aluminum oxide film, and tantalum oxide film.

113. A method for producing a thin film semiconductor device including a thin film layer by forming a thin film layer on a substrate in a vacuum chamber by catalytic CVD or high density plasma CVD or high density catalytic CVD, comprising:
a cleaning step of feeding a carrier gas containing hydrogen to said vacuum chamber and cleaning the top of said substrate by activated hydrogen H* generated in the fed carrier gas,
a thin film forming step of forming the thin film on said substrate by feeding a material gas to said vacuum chamber,
a step of raising the concentration of the material gas in said vacuum chamber in the middle of the formation of the thin film on said substrate, and
a step of forming a thin film layer by stacking thin films on said substrate by said cleaning step, said thin film forming step, and said step of raising the concentration of the material gas, and supplying predetermined processing to the thin film layer to fabricate a semiconductor element.

114. A method for producing a thin film semiconductor device as set forth in claim 113, wherein, in the step of fabricating said semiconductor element,
thin films are stacked on said substrate to form a thin film layer by repeating said cleaning step, said thin film forming step, and said step of raising the concentration of the material gas and predetermined processing is applied to the thin film layer to fabricate the semiconductor element.

115. A method for producing a thin film semiconductor device as set forth in claim 113, wherein, in the step of fabricating said semiconductor element, thin films are stacked on said substrate to form a thin film layer by repeating said thin film forming step and said step of raising the concentration of the material gas after said cleaning step and predetermined processing is applied to the thin film layer to fabricate the semiconductor element.

116. A method for producing a thin film semiconductor device including a thin film layer by forming a thin film layer on a substrate in a vacuum chamber by catalytic CVD or high density plasma CVD or high density catalytic CVD, comprising:

a cleaning step of feeding a carrier gas containing hydrogen to said vacuum chamber and cleaning the top of said substrate by activated hydrogen H* generated in the fed carrier gas, a thin film forming step of forming a thin film on said substrate by feeding a material gas to said vacuum chamber, a step of raising the concentration of the material gas in said vacuum chamber in the middle of the formation of the thin film on said substrate, and a step of growing a silicon film in at least the thin film semiconductor device forming region of said substrate by said cleaning step, said thin film forming step, and said step of raising the concentration of the material gas, forming a thin film layer by growing at least a gate insulating film continuing from the silicon film, and applying predetermined processing to the thin film layer to fabricate a top gate type TFT.

117. A method for producing a thin film semiconductor device as set forth in claim 116, wherein, in the step of fabricating the top gate type TFT, the silicon film is formed in at least the thin film semiconductor device forming region of said substrate by repeating said cleaning step, said thin film forming step, and said step of raising the concentration of the material gas, the thin film layer is formed by growing at least the gate insulating film continuing from the silicon film, and predetermined processing is applied to the thin film layer to fabricate the top gate type TFT.

118. A method for producing a thin film semiconductor device as set forth in claim 116, wherein, in the step of fabricating the top gate type TFT, the silicon film is formed in at least the thin film semiconductor device forming region of said substrate by repeating said thin film forming step and said step of raising the concentration of the material gas after said cleaning step, the thin film layer is formed by growing at least the gate insulating film continuing from the silicon film, and predetermined processing is applied to the thin film layer to fabricate the top gate type TFT.

119. A method for producing a thin film semiconductor device including a thin film layer by forming a thin film layer on a substrate in a vacuum chamber by catalytic CVD or high density plasma CVD or high density catalytic CVD, comprising a cleaning step of feeding a carrier gas containing hydrogen to said vacuum chamber and cleaning the top of said substrate by activated hydrogen H* generated in the fed carrier gas, a thin film forming step of forming a thin film on said substrate by feeding a material gas to said vacuum chamber, a step of raising the concentration of the material gas in said vacuum chamber in the middle of the formation of the thin film on said substrate, and a step of growing at least a gate insulating film in at least the thin film semiconductor device forming region of said substrate with a gate electrode formed in advance therein by said cleaning step, said thin film forming step, and said step of raising the concentration of the material gas, forming a thin film layer by growing at least a silicon film continuing from the gate insulating film, and applying predetermined processing to the thin film layer to fabricate a bottom gate type TFT.

120. A method for producing a thin film semiconductor device as set forth in claim 119, wherein, in the step of fabricating the bottom gate type TFT, at least the gate insulating film is grown in at least the thin film semiconductor device forming region of said substrate with the gate electrode formed in advance therein by repeating said cleaning step, said thin film forming step and said step of raising the concentration of the material gas, the thin film layer is formed by growing at least the silicon film continuing from the gate insulating film, and predetermined processing is applied to the thin film layer to fabricate the bottom gate type TFT.

121. A method for producing a thin film semiconductor device as set forth in claim 119, wherein, in the step of fabricating the bottom gate type TFT, at least the gate insulating film is grown in at least the thin film semiconductor device forming region of said substrate with the gate electrode formed in advance therein by repeating said thin film forming step and said step of raising the concentration of the material gas after said cleaning step, the thin film layer is formed by growing at least the silicon film continuing from the gate insulating film, and predetermined processing is applied to the thin film layer to fabricate the bottom gate type TFT.

122. A method for producing a thin film semiconductor device including a thin film layer by forming a thin film layer on a substrate in a vacuum chamber by catalytic CVD or high density plasma CVD or high density catalytic CVD, comprising a cleaning step of feeding a carrier gas containing hydrogen to said vacuum chamber and cleaning the top of said substrate by activated hydrogen H* generated in the fed carrier gas, a thin film forming step of forming the thin film on said substrate by feeding a material gas to said vacuum chamber, a step of raising the concentration of the material gas in said vacuum chamber in the middle of the formation of the thin film on said substrate, and a step of growing at least a first gate insulating film in at least the thin film semiconductor device forming region of said substrate with a first gate electrode formed in advance therein by said cleaning step, said thin film forming step, and said step of raising the concentration of the material gas, forming a first thin film layer by growing at least a silicon film continuing from the first gate insulating film, forming a second thin film layer by growing at least a second gate insulating film for a second gate electrode continuing from the first thin film layer, and applying predetermined processing to said first thin film layer and second thin film layer to fabricate a dual gate type TFT.

123. A method for producing a thin film semiconductor device as set forth in claim 122, wherein, in the step of fabricating the dual gate type TFT, at least the first gate insulating film is grown in at least the thin film semiconductor device forming region of said substrate with the first gate electrode formed in advance therein by repeating said cleaning step, said thin film forming step, and said step of raising the concentration of the material gas, the first thin film layer is formed by growing at least the silicon film continuing from the first gate insulating film, the second thin film layer is formed by growing at least the second gate insulating film for the second gate electrode continuing from the first thin film layer, and predetermined processing is applied to said first thin film layer and second thin film layer to fabricate the dual gate type TFT.

124. A method for producing a thin film semiconductor device as set forth in claim 122, wherein, in the step of fabricating said dual gate type TFT, at least the first gate insulating film is grown in at least the thin film semiconductor device forming region of said substrate with the first gate electrode formed in advance therein by repeating said thin film forming step and said step of raising the concentration of the material gas after said cleaning step, the first thin film layer is formed by growing at least the silicon film continuing from the first gate insulating film, the second thin film layer is formed by growing at least the second gate insulating film for the second gate electrode continuing from the first thin film layer, and predetermined processing is applied to said first thin film layer and second thin film layer to fabricate the dual gate type TFT.

125. A method for producing a thin film semiconductor device as set forth in claim 113, wherein a step is formed in at least the semiconductor device forming region of said substrate and a single crystalline semiconductor film is graphoepitaxially grown on said substrate containing the step.

126. A method for producing a thin film semiconductor device as set forth in claims 113, wherein a substance layer having a good lattice alignment with a single crystalline semiconductor is formed in at least the semiconductor device forming region of said substrate and the single crystalline semiconductor film is heteroepitaxially grown on said substrate containing the substance layer.

127. A method for producing a thin film semiconductor device as set forth in claim 113, wherein said thin film layer is applied to a channel region, a source region, and a drain region of an insulating gate type field effect transistor and the types of the impurities injected into these regions and/or concentrations thereof are controlled.

128. A method for producing a thin film semiconductor device as set forth in claim 113, wherein said thin film semiconductor device is a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a silicon carbide semiconductor device, a silicon carbide semiconductor integrated circuit device, a diamond semiconductor device, a diamond semiconductor integrated circuit device, a liquid crystal display device, an electroluminescence display device, a plasma display panel (PDP) device, a light emission polymer display device, a light emission diode display device, a CCD area/linear sensor device, a MOS sensor device, a high dielectric/ferroelectric memory semiconductor device, a high dielectric/ferroelectric memory semiconductor integrated circuit device, or a solar battery.

129. A thin film forming apparatus as set forth in claim 113, wherein, in said step for raising the concentration of the material gas, the feed of the carrier gas is reduced or stopped in the middle of the formation of the thin film on said substrate.

* * * * *